United States Patent
Yamazaki

(10) Patent No.: US 9,590,111 B2
(45) Date of Patent: Mar. 7, 2017

(54) SEMICONDUCTOR DEVICE AND DISPLAY DEVICE INCLUDING THE SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/532,220

(22) Filed: Nov. 4, 2014

(65) Prior Publication Data

US 2015/0123120 A1 May 7, 2015

(30) Foreign Application Priority Data

Nov. 6, 2013 (JP) ................................ 2013-230578

(51) Int. Cl.
*H01L 29/786* (2006.01)
*H01L 29/417* (2006.01)
(Continued)

(52) U.S. Cl.
CPC .... *H01L 29/7869* (2013.01); *H01L 29/41733* (2013.01); *H01L 29/4908* (2013.01);
(Continued)

(58) Field of Classification Search
CPC ............. H01L 29/7869; H01L 27/1225; H01L 29/78606; H01L 29/41733; H01L 29/4175; H01L 29/45; H01L 29/66969; H01L 21/441
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Thinh T Nguyen
(74) *Attorney, Agent, or Firm* — Fish & Richardson P.C.

(57) ABSTRACT

A highly reliable semiconductor device including an oxide semiconductor is provided. The concentration of impurities contained in an oxide semiconductor of a semiconductor device including the oxide semiconductor is reduced. Electrical characteristics of a semiconductor device including an oxide semiconductor are improved. The semiconductor device includes an oxide semiconductor film; a gate electrode layer overlapping with the oxide semiconductor film; a gate insulating film between the oxide semiconductor film and the gate electrode layer; a metal oxide film overlapping with the gate insulating film with the oxide semiconductor film positioned therebetween; and a source electrode layer and a drain electrode layer electrically connected to the oxide semiconductor film. The metal oxide film covers at least a channel region and a side surface of the oxide semiconductor film.

19 Claims, 30 Drawing Sheets

(51) Int. Cl.
*H01L 29/49* (2006.01)
*H01L 27/12* (2006.01)
*H01L 21/441* (2006.01)

(52) U.S. Cl.
CPC .. *H01L 29/78606* (2013.01); *H01L 29/78693* (2013.01); *H01L 21/441* (2013.01); *H01L 27/1225* (2013.01); *H01L 27/1255* (2013.01); *H01L 29/4175* (2013.01)

(58) Field of Classification Search
USPC .. 257/43, 59, 57, 71, E29.273; 438/149, 85, 438/86, 104, 754
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,421,083 B2 | 4/2013 | Yamazaki et al. |
| 8,546,180 B2 | 10/2013 | Yamazaki et al. |
| 8,796,683 B2 | 8/2014 | Yamazaki |
| 8,946,702 B2 | 2/2015 | Yamazaki et al. |
| 9,059,295 B2 | 6/2015 | Yamazaki et al. |
| 9,082,861 B2 * | 7/2015 | Yamazaki ........... H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063211 A1 | 3/2007 | Iwasaki |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127266 A1 | 5/2010 | Saito et al. |
| 2010/0148170 A1 | 6/2010 | Ueda et al. |
| 2010/0276688 A1 | 11/2010 | Yano et al. |
| 2011/0062433 A1 * | 3/2011 | Yamazaki ........... H01L 27/1225 257/43 |
| 2011/0240991 A1 | 10/2011 | Yamazaki |
| 2012/0146109 A1 | 6/2012 | Yamazaki et al. |
| 2013/0082252 A1 | 4/2013 | Yamazaki |
| 2013/0082253 A1 | 4/2013 | Yamazaki et al. |
| 2013/0119373 A1 * | 5/2013 | Yamazaki ........... H01L 29/7869 257/43 |
| 2013/0299789 A1 | 11/2013 | Yamazaki et al. |
| 2014/0145625 A1 | 5/2014 | Yamazaki et al. |
| 2014/0306260 A1 | 10/2014 | Yamazaki et al. |
| 2015/0084043 A1 | 3/2015 | Ishihara |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |

(56) References Cited

FOREIGN PATENT DOCUMENTS

| | | |
|---|---|---|
| JP | 2004-273614 A | 9/2004 |
| JP | 2004-273732 A | 9/2004 |
| JP | 2006-165529 | 6/2006 |
| JP | 2011-181801 A | 9/2011 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May. 31, 2009, pp. 280-293.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rec. A (Physical Review. A), May 1, 1984, vol. 29, No. 5, pp. 2957-2959.

Dembo.H et al., "Rfcpus on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Ppaers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3—A2O3—BO Systems [A; Fe; Ga, Or Al; B: Mg, Mn, Fe, Ni, Cu,Or, Zn] At Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest D8 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest D9 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev.Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., the phase relations in the In2O3—Ga2ZnO4—ZnO system at 1350°C, Journal of Solid State Chemistry, Aug. 1, 1991, vol. 93, No. 2, 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papersm Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTs", IDW '09 : Proceedings of the 16th International Dusplay Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs ", IDW '02 : Proceedings of The 9th International Dsplay Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

150

150

150

FIG. 13A
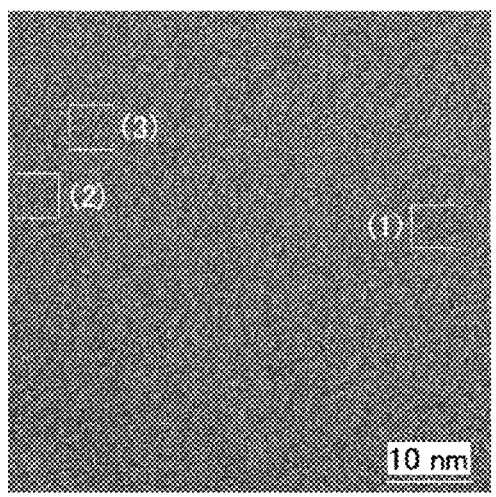
FIG. 13B      FIG. 13C      FIG. 13D
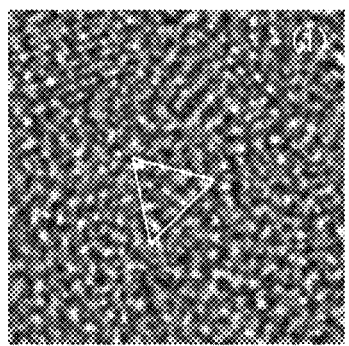 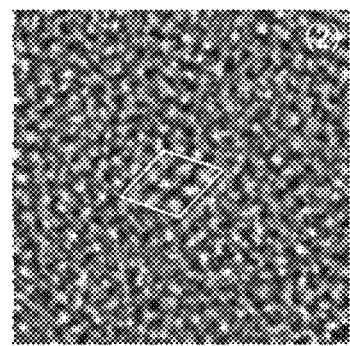 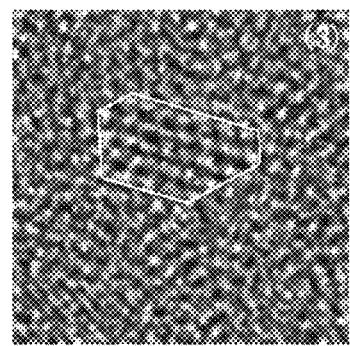

FIG. 26A
FIG. 26B
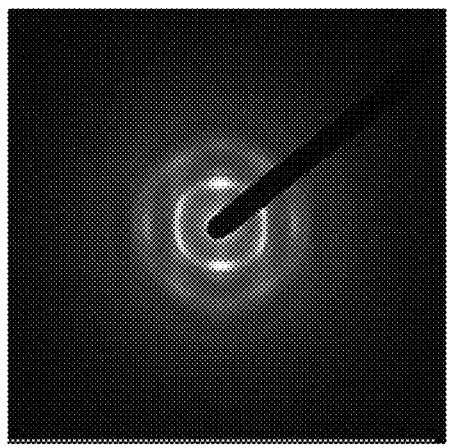
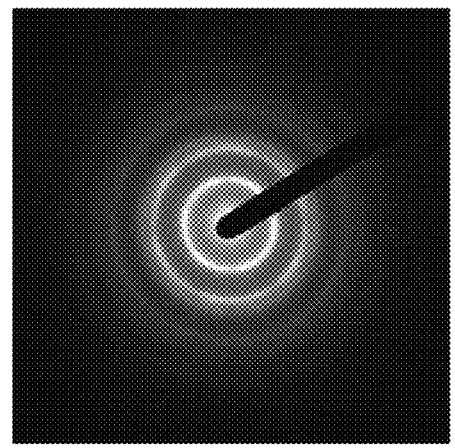

pellet cross section pellet plan view

SEMICONDUCTOR DEVICE AND DISPLAY DEVICE INCLUDING THE SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, an electronic device, a manufacturing method thereof, or a driving method thereof. One embodiment of the present invention particularly relates to a semiconductor device and a method for manufacturing the semiconductor device.

Note that in this specification and the like, a semiconductor device refers to a semiconductor element itself or a device including a semiconductor element. Examples of such a semiconductor element include a transistor (e.g., a thin film transistor). In addition, a display device such as a liquid crystal display device includes a semiconductor device in some cases.

2. Description of the Related Art

A technique by which transistors are formed using semiconductor films formed over a substrate having an insulating surface has been attracting attention. The transistor is used in a wide range of electronic devices such as an integrated circuit (IC) or an image display device (also simply referred to as a display device). As a semiconductor film applicable to the transistor, a silicon-based semiconductor material is widely known; moreover, a metal oxide exhibiting semiconductor characteristics (an oxide semiconductor) has been attracting attention as another material.

For example, Patent Document 1 discloses a technique in which a transistor is manufactured using an amorphous oxide containing In, Zn, Ga, Sn, and the like as an oxide semiconductor.

REFERENCE

Patent Document

[Patent Document 1] Japanese Published Patent Application No. 2006-165529

SUMMARY OF THE INVENTION

Although a transistor including an oxide semiconductor can obtain transistor characteristics relatively easily, physical properties are likely to be unstable; thus, it is difficult to secure the reliability of such a transistor.

Thus, an object of one embodiment of the present invention is to provide a highly reliable semiconductor device including an oxide semiconductor. Another object of one embodiment of the present invention is to reduce, in a semiconductor device including an oxide semiconductor, the concentration of impurities contained in the oxide semiconductor. Another object of one embodiment of the present invention is to improve electrical characteristics of a semiconductor device including an oxide semiconductor. Another object of one embodiment of the present invention is to provide a novel semiconductor device.

Note that the descriptions of the above objects do not disturb the existence of other objects. Objects other than the above objects will be apparent from and can be derived from the description of the specification and the like.

One embodiment of the present invention is a semiconductor device including an oxide semiconductor film; a gate electrode layer overlapping with the oxide semiconductor film; a gate insulating film between the oxide semiconductor film and the gate electrode layer; a metal oxide film overlapping with the gate insulating film with the oxide semiconductor film positioned therebetween; and a source electrode layer and a drain electrode layer electrically connected to the oxide semiconductor film. The metal oxide film covers at least a channel region and a side surface of the oxide semiconductor film.

Another embodiment of the present invention is a semiconductor device including an oxide semiconductor film; a gate electrode layer overlapping with the oxide semiconductor film; a gate insulating film between the oxide semiconductor film and the gate electrode layer; a metal oxide film overlapping with the gate insulating film with the oxide semiconductor film positioned therebetween; and a source electrode layer and a drain electrode layer electrically connected to the oxide semiconductor film. A conduction band minimum of the metal oxide film is closer to the vacuum level than a conduction band minimum of the oxide semiconductor film is. The metal oxide film covers at least a channel region and a side surface of the oxide semiconductor film.

Another embodiment of the present invention is a semiconductor device including a gate electrode layer; a gate insulating film over the gate electrode layer; an oxide semiconductor film that is over the gate insulating film and overlaps with the gate electrode layer; a metal oxide film covering a channel region and a side surface of the oxide semiconductor film; and a source electrode layer and a drain electrode layer electrically connected to the oxide semiconductor film with the metal oxide film positioned therebetween.

In the above structure, a conduction band minimum of the metal oxide film is preferably closer to the vacuum level than a conduction band minimum of the oxide semiconductor film is. Furthermore, in the above structure, the metal oxide film preferably has openings reaching the oxide semiconductor film.

In each of the above structures, the oxide semiconductor film preferably contains an In-M-Zn oxide (M is Ti, Ga, Y, Zr, La, Ce, Nd, Sn, or Hf). Furthermore, in each of the above structures, the metal oxide film preferably contains an In-M-Zn oxide or an In-M oxide (M is Ti, Ga, Y, Zr, La, Ce, Nd, Sn, or Hf).

Embodiments of the present invention also include a display device including the above semiconductor device.

According to one embodiment of the present invention, a highly reliable semiconductor device including an oxide semiconductor can be provided. The concentration of impurities contained in an oxide semiconductor of a semiconductor device including the oxide semiconductor can be reduced. Electrical characteristics of a semiconductor device including an oxide semiconductor can be improved. A novel semiconductor device can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 13A to 13D are Cs-corrected high-resolution TEM images of a plane of a CAAC-OS.

FIGS. 26A and 26B show electron diffraction patterns of a CAAC-OS.

DETAILED DESCRIPTION OF THE INVENTION

Figure 1A:
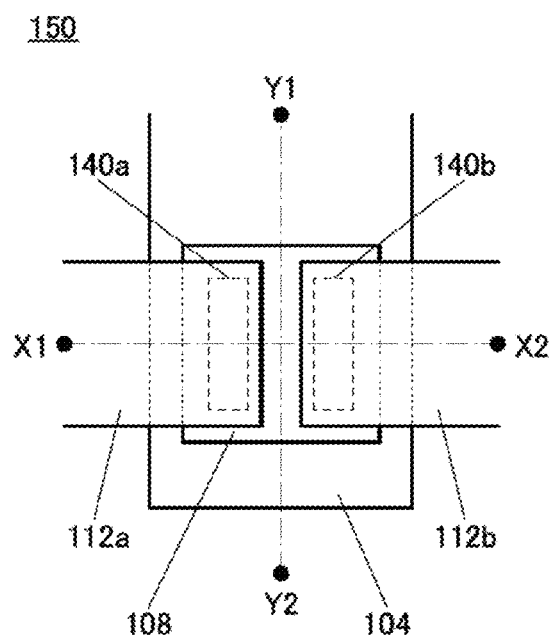
FIGS. 1A to 1C are a top view and cross-sectional views of a semiconductor device.

Embodiments of the present invention will be described below in detail with reference to the drawings. Note that the present invention is not limited to the following description, and it is easily understood by those skilled in the art that modes and details of the present invention can be modified in various ways. Accordingly, the present invention should not be interpreted as being limited to the content of the embodiments below.

Note that in the structures of the present invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the film thickness, or the region of each component may be exaggerated for clarity. Therefore, embodiments of the present invention are not limited to such a scale.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

Note that the ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as the ordinal numbers used to specify one embodiment of the present invention.

(Embodiment 1)

In this embodiment, a semiconductor device of one embodiment of the present invention is described with reference to FIGS. 1A to 1C, FIGS. 2A to 2C, FIGS. 3A to 3C, FIGS. 4A to 4C, FIGS. 5A and 5B, FIG. 6, FIGS. 7A to 7D, FIGS. 8A and 8B, FIGS. 9A to 9C, and FIGS. 10A to 100D.

<Structure Example 1 of Semiconductor Device>

Figure 1B:
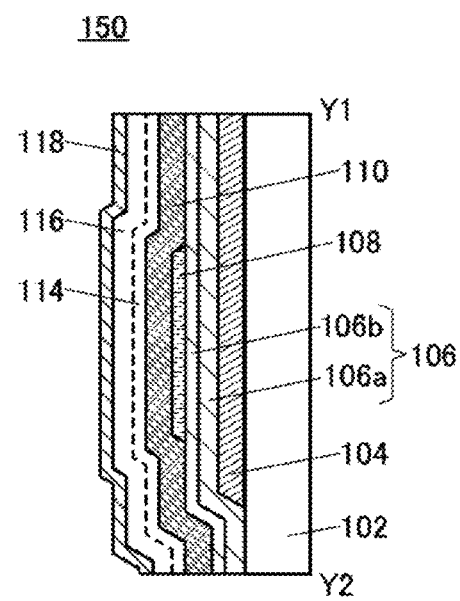
Figure 1C:
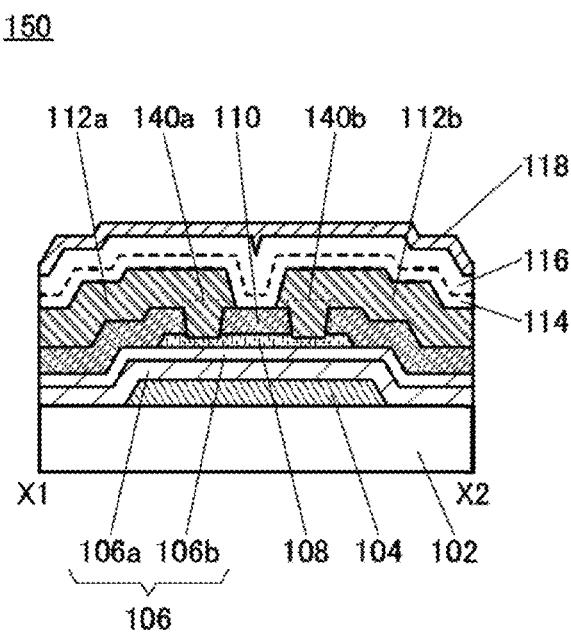

FIG. 1A is a top view of a transistor 150, which is a semiconductor device of one embodiment of the present invention. FIG. 1B is a cross-sectional view taken along a dashed-dotted line Y1-Y2 shown in FIG. 1A, and FIG. 1C is a cross-sectional view taken along a dashed-dotted line X1-X2 shown in FIG. 1A. Note that in FIG. 1A, some components of the transistor 150 (e.g., a gate insulating film) are not illustrated to avoid complexity.

The transistor 150 includes a conductive film 104 functioning as a gate electrode layer over a substrate 102; an insulating film 106 functioning as a gate insulating film over the substrate 102 and the conductive film 104; an oxide semiconductor film 108 that is over the insulating film 106 and overlaps with the conductive film 104; a metal oxide film 110 over the insulating film 106 and the oxide semiconductor film 108; and conductive films 112a and 112b that are electrically connected to the oxide semiconductor film 108 and function as a source electrode layer and a drain electrode layer of the transistor 150. The conductive films 112a and 112b are connected to the oxide semiconductor film 108 through openings 140a and 140b provided in the metal oxide film 110.

In FIGS. 1B and 1C, the insulating film 106 functioning as a gate insulating film has a two-layer structure including insulating films 106a and 106b. Note that the structure of the insulating film 106 is not limited thereto, and the insulating film 106 may have a single-layer structure or a stacked-layer structure including three or more layers.

In FIGS. 1B and 1C, insulating films 114, 116, and 118 functioning as a protective insulating film of the transistor 150 are provided over the transistor 150, specifically, over the metal oxide film 110 and the conductive films 112a and 112b.

As shown in FIGS. 1B and 1C, the metal oxide film 110 covers at least a channel region and side surfaces of the oxide semiconductor film 108. Note that in this specification and the like, a channel region refers to a region through which current mainly flows.

In the transistor 150, the metal oxide film 110 covering the channel region and the side surfaces of the oxide semiconductor film 108 functions as a barrier film for preventing diffusion of constituent elements of the conductive films 112a and 112b functioning as a source electrode layer and a drain electrode layer into the oxide semiconductor film 108. In addition, the metal oxide film 110 can prevent constituent elements of the insulating film 114 or the like provided over the oxide semiconductor film 108 from being mixed into the oxide semiconductor film 108.

The prevention of mixing of impurities into the oxide semiconductor film 108 where the channel region is formed can inhibit a reduction in the electrical characteristics of the transistor 150. In addition, the metal oxide film 110 can relieve damage to the oxide semiconductor film 108 at the time of forming the conductive films 112a and 112b functioning as a source electrode layer and a drain electrode layer (e.g., in an etching step).

For the oxide semiconductor film 108, an In—Ga oxide, an In—Zn oxide, or an In-M-Zn oxide (M is Ti, Ga, Y, Zr, La, Ce, Nd, Sn, or Hf) can be used. For the metal oxide film 110, an In-M-Zn oxide (M is Ti, Ga, Y, Zr, La, Ce, Nd, Sn, or Hf) or an In-M oxide (M is Ti, Ga, Y, Zr, La, Ce, Nd, Sn, or Hf) can be used. Note that to prevent the metal oxide film 110 from functioning as part of a channel region, a material having sufficiently low conductivity is used for the metal oxide film 110. Alternatively, a material which has a smaller electron affinity (an energy difference between the vacuum level and the conduction band minimum) than the oxide semiconductor film 108 and has a difference in conduction band minimum from the oxide semiconductor film 108 (band offset) is used for the metal oxide film 110.

The thickness of the metal oxide film 110 is greater than or equal to a thickness that is capable of inhibiting diffusion of the constituent element of the conductive films 112a and 112b functioning as a source electrode layer and a drain electrode layer into the oxide semiconductor film 108, and less than a thickness that inhibits supply of oxygen from the insulating films 114 and 116 to the oxide semiconductor film 108. For example, when the thickness of the metal oxide film 110 is greater than or equal to 10 nm, the constituent elements of the conductive films 112a and 112b functioning as a source electrode layer and a drain electrode layer can be prevented from diffusing into the oxide semiconductor film 108. When the thickness of the metal oxide film 110 is less than or equal to 100 nm, oxygen can be effectively supplied from the insulating films 114 and 116 to the oxide semiconductor film 108.

As described above, the metal oxide film 110 functions as a channel protective film for protecting the channel region of the oxide semiconductor film 108. The metal oxide film 110 of this embodiment covers at least the channel region and the side surfaces of the oxide semiconductor film 108. In other words, the metal oxide film 110 overlaps with the conductive film 104 functioning as a gate electrode layer, covers a surface of the oxide semiconductor film 108 that is between the conductive films 112a and 112b functioning as a source electrode layer and a drain electrode layer, and covers the side surfaces of the oxide semiconductor film 108. The surface of the oxide semiconductor film 108 between the conductive films 112a and 112b is a surface on what is called the back channel side. The metal oxide film 110 containing an element contained in the oxide semiconductor film 108 and being in contact with the surface on the back channel side can minimize the amount of impurities that might be mixed into the oxide semiconductor film 108.

In the transistor 150 described in this embodiment, the conductive films 112a and 112b functioning as a source electrode layer and a drain electrode layer are preferably formed with a single layer or a stacked layer of a low-resistance material such as copper, aluminum, gold, or silver; an alloy containing any of these materials; or a compound containing any of these materials as a main component. The conductive films 112a and 112b also functions as wirings; therefore, even in the case where a large-sized substrate is used as the substrate 102, when the conductive films 112a and 112b are formed to contain a low-resistance material such as copper, aluminum, gold, or silver, a semiconductor device in which wiring delay is suppressed can be manufactured.

In the case where the conductive films 112a and 112b have a two-layer structure, the conductive films 112a and 112b are formed such that the second conductive film is thick and contains a low-resistance material such as copper, aluminum, gold, or silver, an alloy containing any of these materials, or a compound containing any of these components as a main component; and a conductive film functioning as a barrier film against the second conductive film is used as the first conductive film. For example, a conductive film of titanium, tantalum, molybdenum, tungsten; an alloy containing any of these elements; or a conductive film containing titanium nitride, tantalum nitride, molybdenum nitride, tungsten nitride; or the like can be used as the barrier film. In the case where the conductive films 112a and 112b have a three-layer structure, the third conductive film is preferably formed using a conductive film functioning as a barrier film against the second conductive film so as to be over and in contact with the first and second conductive films.

In the case where the conductive films 112a and 112b have a two-layer structure, for example, any of the following structures is preferably used: a structure in which an aluminum film is stacked on a titanium film; a structure in which a copper film is stacked on a tungsten film; a structure in which an aluminum film is stacked on a tungsten film; a structure in which a copper film is stacked on a copper-magnesium-aluminum alloy film; a structure in which a copper film is stacked on a titanium film; a structure in which a copper film is stacked on a tungsten film; a structure in which a copper film is stacked on a molybdenum film; a structure in which a copper film is stacked on an alloy film containing molybdenum and tungsten; a structure in which a copper film is stacked on an alloy film containing molybdenum and zirconium; and a structure in which a copper film is stacked on an alloy film containing copper and manganese. In the case where the conductive films 112a and 112b have a three-layer structure, it is preferable that a film formed of titanium, titanium nitride, molybdenum, tungsten, an alloy containing molybdenum and tungsten, an alloy containing molybdenum and zirconium, an alloy containing copper and manganese, or molybdenum nitride be formed as each of the first and third layers, and that a film formed of a low-resistance material such as copper, aluminum, gold, or silver be formed as the second layer.

The conductive films 112a and 112b functioning as a source electrode layer and a drain electrode layer in the transistor 150 described in this embodiment are formed using conductive films including a low-resistance material such as copper, aluminum, gold, or silver, whereby a semiconductor device in which wiring delay is suppressed can be manufactured. Furthermore, the metal oxide film 110 covers the channel region and the side surfaces of the oxide semiconductor film 108; thus, diffusion of constituent elements of the conductive films 112a and 112b functioning as a source electrode layer and a drain electrode layer into the oxide semiconductor film 108 can be prevented. Consequently, a reduction in electrical characteristics can be prevented, and thus it is possible to provide a semiconductor device having favorable electrical characteristics.

Other constituent elements of the semiconductor device of this embodiment are described below in detail.

<Substrate>

There is no particular limitation on the property of a material and the like of the substrate 102 as long as the material has heat resistance enough to withstand at least heat treatment performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Furthermore, any of these substrates further provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 150 may be provided directly on the flexible substrate. Further alternatively, a separation layer may be provided between the substrate 102 and the transistor 150. The separation layer can be used when part or the whole of a semiconductor device formed over the separation layer is separated from the substrate 102 and transferred onto another substrate. In such a case, the transistor 150 can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

<Conductive Film>

The conductive film 104 functioning as a gate electrode layer can be formed using a metal element selected from chromium, copper, aluminum, gold, silver, zinc, molybdenum, tantalum, titanium, and tungsten; an alloy containing any of these metal elements as a component; an alloy containing any of these metal elements in combination; or the like. Further, one or more metal elements selected from manganese and zirconium may be used. Furthermore, the conductive film 104 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive film 104 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the conductive film 104 and the insulating film 106a. These films each have a work function of 5 eV or higher, preferably 5.5 eV or higher, which is higher than the electron affinity of an oxide semiconductor; thus, the threshold voltage of a transistor including the oxide semiconductor can be shifted in the positive direction. Accordingly, a switching element having what is called normally-off characteristics is obtained. For example, in the case of using an In—Ga—Zn-based oxynitride semiconductor film, an In—Ga—Zn-based oxynitride semiconductor film having a higher nitrogen concentration than at least the oxide semiconductor film 108, specifically, an In—Ga—Zn-based oxynitride semiconductor film having a nitrogen concentration of 7 atomic % or higher is used.

<Gate Insulating Film>

As each of the insulating films 106a and 106b functioning as a gate insulating film of the transistor 150, an insulating film including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the stacked-layered structure of the insulating films 106a and 106b is not necessarily employed, and an insulating film with a single-layer structure including any of the above films, or three or more insulating films can be employed.

Note that the insulating film 106b that is in contact with the oxide semiconductor film 108 functioning as a channel region of the transistor 150 is preferably an oxide insulating film and preferably has a region (oxygen-excess region) containing oxygen in excess of the stoichiometric composition. In other words, the insulating film 106b is an insulating film capable of releasing oxygen. In order to provide the oxygen-excess region in the insulating film 106b, the insulating film 106b is formed in an oxygen atmosphere, for example. Alternatively, oxygen may be introduced into the formed insulating film 106b to provide the oxygen-excess region therein. Oxygen can be introduced by an ion implantation method, an ion doping method, a plasma immersion ion implantation method, plasma treatment, or the like.

Using hafnium oxide for one or both of the insulating films 106a and 106b provides the following effects. Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106a, and a silicon oxide film is formed as the insulating film 106b. The silicon nitride film has a higher dielectric constant than a silicon oxide film and needs a larger thickness for capacitance equivalent to that of the silicon oxide film. Thus, when the silicon nitride film is included in the gate insulating film of the transistor 150, the physical thickness of the insulating film can be increased. This makes it possible to reduce a decrease in the withstand voltage of the transistor 150 and furthermore increase the withstand voltage, thereby preventing electrostatic breakdown of the transistor 150.

<Oxide Semiconductor Film>

The oxide semiconductor film 108 is typically formed using an In—Ga oxide, an In—Zn oxide, or an In-M-Zn oxide (M is Ti, Ga, Y, Zr, La, Ce, Nd, Sn, or Hf). It is particularly preferable to use an In-M-Zn oxide (M is Ti, Ga, Y, Zr, La, Ce, Nd, Sn, or Hf) for the oxide semiconductor film 108.

In the case where the oxide semiconductor film 108 is an In-M-Zn oxide (M is Ti, Ga, Y, Zr, La, Ce, Nd, Sn, or Hf), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratio of metal elements in the formed oxide semiconductor film 108 varies from the above atomic ratio of metal elements of the sputtering target within a range of ±40% as an error.

Note that in the case where the oxide semiconductor film 108 contains an In-M-Zn oxide, the proportion of In and the proportion of M, not taking Zn and O into consideration, are preferably greater than or equal to 25 atomic % and less than 75 atomic %, respectively, further preferably greater than or equal to 34 atomic % and less than 66 atomic %, respectively.

The energy gap of the oxide semiconductor film 108 is 2 eV or more, preferably 2.5 eV or more, further preferably 3 eV or more. With the use of an oxide semiconductor having such a wide energy gap, the off-state current of the transistor 150 can be reduced.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with low carrier density is used as the oxide semiconductor film 108. For example, an oxide semiconductor film whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, yet further preferably lower than or equal to $1 \times 10^{10}/cm^3$, and is higher than or equal to $1 \times 10^{-9}/cm^3$ is used as the oxide semiconductor film 108.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor film 108 be set to appropriate values.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V.

Thus, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor in which the channel region is formed in the oxide semiconductor film having a high density of trap states may have unstable electrical characteristics. As examples of the impurities, hydrogen, nitrogen, alkali metal, alkaline earth metal, and the like are given.

Hydrogen contained in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, further preferably lower than or equal to $1 \times 10^{16}$ atoms/cm$^3$.

When silicon or carbon which is one of elements belonging to Group 14 is contained in the oxide semiconductor film 108, the amount of oxygen vacancy is increased, and the oxide semiconductor film 108 is changed to an n-type. Thus, the concentration of silicon or carbon (the concentration is measured by SIMS) in the oxide semiconductor film 108 or the concentration of silicon or carbon (the concentration is measured by SIMS) in the vicinity of the interface between the metal oxide film 110 and the oxide semiconductor film 108 is set to be lower than or equal to $2 \times 10^{18}$ atoms/cm$^3$, preferably lower than or equal to $2 \times 10^{17}$ atoms/cm$^3$.

The concentration of alkali metal or alkaline earth metal in the oxide semiconductor film 108, which is measured by SIMS, is set to be lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 108.

In addition, when nitrogen is contained in the oxide semiconductor film 108, electrons serving as carriers are generated to increase the carrier density, so that the oxide semiconductor film 108 easily becomes n-type. Thus, a transistor including an oxide semiconductor film which contains nitrogen is likely to be normally on. For this reason, nitrogen in the oxide semiconductor film is preferably reduced as much as possible; the concentration of nitrogen which is measured by SIMS is preferably set to, for example, lower than or equal to $5 \times 10^{18}$ atoms/cm$^3$.

The oxide semiconductor film 108 may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

The oxide semiconductor film 108 may have an amorphous structure, for example. The oxide semiconductor film having the amorphous structure has disordered atomic arrangement and no crystalline component, for example. Alternatively, an oxide film having an amorphous structure has, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases. Note that the metal oxide film 110 in contact with the oxide semiconductor film 108 can have an amorphous structure, a microcrystalline structure, a polycrystalline structure, or the like, for example.

In the case where an insulating film which contains a constituent element (e.g., silicon) different from that of the oxide semiconductor is provided in contact with the oxide semiconductor film 108, an interface state due to heterojunction, entry of impurities, or the like might be formed at the interface between the oxide semiconductor film 108 and the insulating film. In the transistor 150 of this embodiment, the metal oxide film 110 which has the same constituent element as the oxide semiconductor is provided between the oxide semiconductor film 108 and the insulating film 114 which may have a constituent element (e.g., silicon) different from that of the oxide semiconductor. Hence, if trap states are formed between the metal oxide film 110 and the insulating film 114 owing to impurities and defects, electrons flowing in the oxide semiconductor film 108 are less likely to be captured by the trap states because there is a distance between the trap states and the oxide semiconductor film 108. Accordingly, the amount of on-state current of the transistor can be increased, and the field-effect mobility can be increased. When the electrons are captured by the trap states, the electrons become negative fixed charges. As a result, the threshold voltage of the transistor fluctuates. However, by the distance between the oxide semiconductor film 108 and the trap states, capture of the electrons by the trap states can be reduced, and accordingly a fluctuation of the threshold voltage can be reduced.

<Metal Oxide Film>

For the metal oxide film 110, a metal oxide represented as an In-M-Zn oxide or an In-M oxide (M is Ti, Ga, Y, Zr, La, Ce, Nd, Sn, or Hf) can be used. Note that the metal oxide film 110 produces the following effect in addition to the above ones. The element M contained in the metal oxide film 110 has a high bonding strength to oxygen; therefore, oxygen vacancy is less likely to be formed in the metal oxide film 110 in which the atomic ratio of the element M is high. Therefore, it is possible to reduce the amount of oxygen vacancy in the oxide semiconductor film 108 in contact with the metal oxide film 110.

Furthermore, it is preferable to form the metal oxide film 110 using a material whose conduction band minimum is closer to the vacuum level than the conduction band minimum of the oxide semiconductor film 108 is by more than 0.2 eV, preferably 0.5 eV or more. Using such a material makes it possible to prevent generation of a difference between threshold voltages due to the value of the drain voltage of the transistor.

In addition, increasing the atomic ratio of the element M to In can increase the energy gap of the metal oxide film 110 and reduce the electron affinity thereof. In the case where a material containing an In-M oxide (M is Ti, Ga, Y, Zr, La, Ce, Nd, Sn, or Hf) is used for the metal oxide film 110, for example, and where the atomic ratio of In to M in the metal oxide film 110 is x:y, y/(x+y) is preferably greater than or equal to 0.75 and less than or equal to 1, further preferably greater than or equal to 0.78 and less than or equal to 1, still further preferably greater than or equal to 0.80 and less than or equal to 1 in order to form a conduction band offset between the metal oxide film 110 and the oxide semiconductor film 108 and inhibit a channel from being formed in the metal oxide film 110. Note that an element other than indium, M, and oxygen that are main components may be mixed in the metal oxide film 110 as an impurity. In that case, the concentration of the impurity is preferably less than or equal to 0.1%.

In the case where the metal oxide film 110 is formed by a sputtering method, when the atomic ratio of the element M to In is increased, the number of particles in deposition can be reduced. To reduce the number of particles, when the atomic ratio is In:M=x:y, y/(x+y) may be greater than or equal to 0.90, e.g., 0.93. Note that in the case where the metal oxide film 110 is formed by a sputtering method, when the atomic ratio of M to In is too high, the insulating property of a target becomes high, which makes it difficult to perform deposition using DC discharge; as a result, it is necessary to use RF discharge. Accordingly, when deposition is performed using DC discharge, which is applicable to the case of using a large-sized substrate, y/(x+y) is set less than or equal to 0.96, preferably less than or equal to 0.95, e.g., 0.93. The use of the deposition method applicable to the case of using a large-sized substrate can increase the productivity of the semiconductor device.

Note that it is preferable that the metal oxide film 110 not have a spinel crystal structure. This is because if the metal oxide film 110 has a spinel crystal structure, constituent elements of the conductive films 112a and 112b functioning as a source electrode layer and a drain electrode layer might be diffused into the oxide semiconductor film 108 owing to the spinel crystal structure. For example, it is preferable that an In-M oxide be used for the metal oxide film 110 and that a divalent metal element (e.g., zinc) not be contained as M, in which case the formed metal oxide film 110 does not have a spinel crystal structure.

In the case where an In-M-Zn oxide is used for the metal oxide film 110, typical examples of the atomic ratio of the metal elements of a target used for forming an In-M-Zn oxide film include In:M:Zn=1:3:2, In:M:Zn=1:3:4, In:M:Zn=1:3:5, In:M:Zn=1:3:6, In:M:Zn=1:4:2, In:M:Zn=1:4:4, and In:M:Zn=1:4:5. In the case where an In-M oxide is used for the metal oxide film 110, typical examples of the atomic ratio of the metal elements of a target used for forming an In-M oxide film include In:M=7:93.

<Protective Insulating Film>

The insulating films 114, 116, and 118 function as a protective insulating film. For example, the insulating film 114 is an insulating film that is permeable to oxygen. The insulating film 114 also functions as a film that relieves damage to the metal oxide film 110 at the time of forming the insulating film 116 in a later step. Note that the insulating film 114 is not necessarily provided.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114. Note that in this specification, "silicon oxynitride film" refers to a film that contains more oxygen than nitrogen, and "silicon nitride oxide film" refers to a film that contains more nitrogen than oxygen.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that passes through the insulating film 114 is decreased.

Moreover, it is preferable that the amount of defects at the interface between the insulating film 114 and the metal oxide film 110 be small, typically the spin density corresponding to a signal which appears at g of greater than or equal to 1.89 and less than or equal to 1.93 due to a defect in the metal oxide film 110 be lower than or equal to $1\times10^{17}$ spins/cm$^3$, more preferably lower than or equal to the lower limit of detection by ESR measurement.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an oxide insulating film which is permeable to oxygen is formed as the insulating film 114, oxygen released from the insulating film 116 provided over the insulating film 114 can be moved to the oxide semiconductor film 108 through the insulating film 114.

The insulating film 116 is formed using an oxide insulating film that contains oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the amount of defects in the insulating film 116 be small, and typically the spin density corresponding to a signal which appears at g=2.001 due to a dangling bond of silicon, be lower than $1.5\times10^{18}$ spins/cm$^3$, more preferably lower than or equal to $1\times10^{18}$ spins/cm$^3$ by ESR measurement. Note that the insulating film 116 is provided more apart from the oxide semiconductor film 108 than the insulating film 114 is; thus, the insulating film 116 may have higher defect density than the insulating film 114.

Further, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114, a single-layer structure of the insulating film 116, or a stacked-layer structure including three or more layers may be used.

The insulating film 118 has a function of blocking oxygen, hydrogen, water, an alkali metal, an alkaline earth metal, or the like. It is possible to prevent outward diffusion of oxygen from the oxide semiconductor film 108 and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Although the variety of films such as the conductive films, the insulating films, the oxide semiconductor films, and the metal oxide films which are described above can be formed by a sputtering method or a PECVD method, such films may be formed by another method, e.g., an atomic layer deposition (ALD) method or a thermal CVD method. As an example of a thermal CVD method, a metal organic chemical vapor deposition (MOCVD) method can be given.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films which are described above can be formed by a thermal CVD method, such as a MOCVD method, or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

<Structure Example 2 of Semiconductor Device>

Figure 2A:
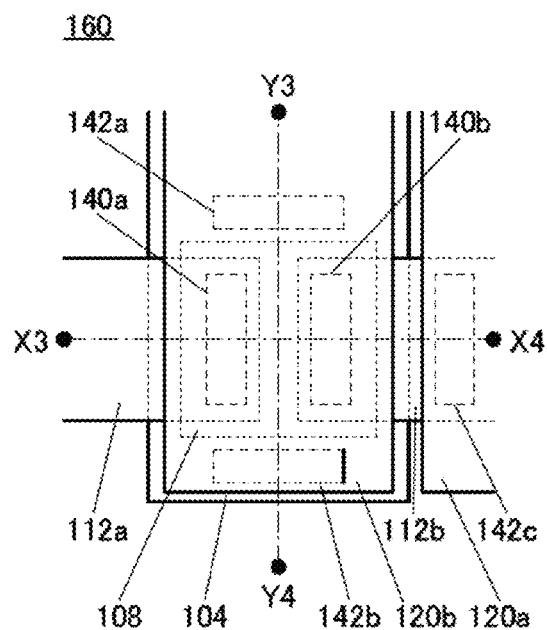
FIGS. 2A to 2C are a top view and cross-sectional views of a semiconductor device.
Figure 2B:
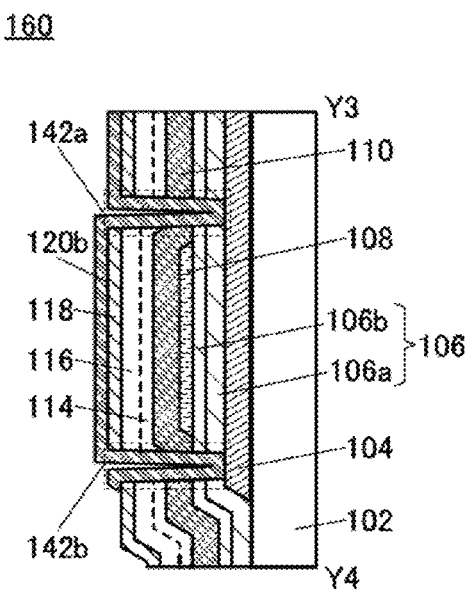
Figure 2C:
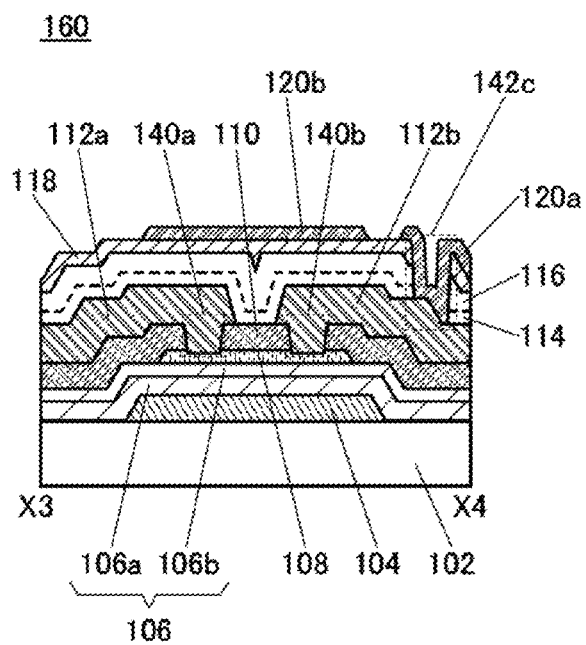

Next, a transistor 160, which is a semiconductor device of one embodiment of the present invention, is described with reference to FIGS. 2A to 2C. FIG. 2A is a top view of the transistor 160 which is a semiconductor device of one embodiment of the present invention. FIG. 2B is a cross-sectional view taken along a dashed-dotted line Y3-Y4 shown in FIG. 2A, and FIG. 2C is a cross-sectional view taken along a dashed-dotted line X3-X4 shown in FIG. 2A. Note that in FIG. 2A, some components of the transistor 160 (e.g., a gate insulating film) are not illustrated to avoid complexity.

The transistor 160 includes the conductive film 104 functioning as a gate electrode layer over the substrate 102; the insulating film 106 functioning as a gate insulating film over the substrate 102 and the conductive film 104; the oxide semiconductor film 108 that is over the insulating film 106 and overlaps with the conductive film 104; the metal oxide film 110 over the insulating film 106 and the oxide semiconductor film 108; the conductive films 112a and 112b that are electrically connected to the oxide semiconductor film 108 and function as a source electrode layer and a drain electrode layer of the transistor 160; the insulating films 114, 116, and 118 over the conductive films 112a and 112b and the metal oxide film 110; and conductive films 120a and 120b over the insulating film 118. The conductive films 112a and 112b are connected to the oxide semiconductor film 108 through the openings 140a and 140b provided in the metal oxide film 110. The conductive film 120a is connected to the conductive film 112b through an opening 142c provided in the insulating films 114, 116, and 118. The conductive film 120b is formed over the insulating film 118 to overlap with the oxide semiconductor film 108.

In FIGS. 2B and 2C, the insulating film 106 functioning as a gate insulating film has a two-layer structure including the insulating films 106a and 106b. Note that the structure of the insulating film 106 is not limited thereto, and the insulating film 106 may have a single-layer structure or a stacked-layer structure including three or more layers.

As shown in FIGS. 2B and 2C, the metal oxide film 110 covers at least a channel region and side surfaces of the oxide semiconductor film 108.

In the transistor 160, the conductive film 120a functions as, for example, a pixel electrode layer used for a display device. The conductive film 120b functions as a back gate electrode layer in the transistor 160. A stacked-layer structure including the metal oxide film 110 and the insulating films 114, 116, and 118, which is provided between the conductive film 120b and the oxide semiconductor film 108, functions as a gate insulating film for the back gate electrode layer. The conductive film 120b is connected to the conductive film 104 functioning as a gate electrode layer through openings 142a and 142b provided in the insulating films 106a, 106b, 114, 116, and 118 and the metal oxide film 110. Accordingly, the conductive film 120b and the conductive film 104 are supplied with the same potential.

The transistor 160 differs from the transistor 150 shown in FIGS. 1A to 1C in that the conductive films 120a and 120b are provided over the insulating film 118. The other structures are the same as those of the transistor 150 and an effect similar to that of the transistor 150 can be obtained. That is, the metal oxide film 110 covering the channel region and the side surfaces of the oxide semiconductor film 108 functions as a barrier film for preventing diffusion of constituent elements of the conductive films 112a and 112b functioning as a source electrode layer and a drain electrode layer into the oxide semiconductor film 108. In addition, the metal oxide film 110 can prevent constituent elements of the insulating film 114 or the like provided over the oxide semiconductor film 108 from being mixed into the oxide semiconductor film 108. The prevention of mixing of impurities into the oxide semiconductor film 108 where the channel region is formed can inhibit a reduction in the electrical characteristics of the transistor 160. In addition, the metal oxide film 110 can relieve damage to the oxide semiconductor film 108 at the time of forming the conductive films 112a and 112b functioning as a source electrode layer and a drain electrode layer (e.g., in an etching step). Thus, entry and diffusion of impurities to the oxide semiconductor film 108 can be prevented. Thus, a reduction in the electrical characteristics of the transistor 160 is inhibited. For details of components of the transistor 160, the description of the transistor 150 can be referred to.

As illustrated in the cross-sectional view of FIG. 2B, the oxide semiconductor film 108 faces each of the conductive film 104 functioning as a gate electrode layer and the conductive film 120b functioning as a back gate electrode layer and is positioned between the two conductive films functioning as gate electrode layers. The lengths in the channel length direction and the channel width direction of the conductive film 120b functioning as a back gate electrode layer are longer than those of the oxide semiconductor film 108, respectively. The whole oxide semiconductor film 108 is covered with the conductive film 120b with the metal oxide film 110 and the insulating films 114, 116, and 118 positioned therebetween. Furthermore, since the conductive film 120b functioning as a back gate electrode layer and the conductive film 104 functioning as a gate electrode layer are connected to each other through the openings 142a and 142b provided in the insulating films 106a, 106b, 114, 116, and 118 and the metal oxide film 110, side surfaces of the oxide semiconductor film 108 in the channel width direction face the conductive film 120b functioning as a back gate electrode layer with the metal oxide film 110 positioned therebetween.

Such a structure enables electric fields of the conductive film 104 functioning as a gate electrode layer and the conductive film 120b functioning as a back gate electrode layer to electrically surround the oxide semiconductor film 108 included in the transistor 160. A device structure of a transistor, like that of the transistor 160, in which electric fields of a gate electrode layer and a back gate electrode layer electrically surround an oxide semiconductor film where a channel is formed can be referred to as a surrounded channel (s-channel) structure.

Since the transistor 160 has the s-channel structure, an electric field for inducing a channel can be effectively applied to the oxide semiconductor film 108 by the conductive film 104 functioning as a gate electrode layer; therefore, the current drive capability of the transistor 160 can be improved and high on-state current characteristics can be obtained. Since the on-state current can be increased, it is possible to reduce the size of the transistor 160. Furthermore, since the transistor 160 has a structure in which the channel is surrounded by the conductive film 104 functioning as a gate electrode layer and the conductive film 120b functioning as a back gate electrode layer, the mechanical strength of the transistor 160 can be increased.

Note that in the transistor 160, either one of the openings 142a and 142b may be formed, and the conductive film 120b and the conductive film 104 may be connected to each other through the opening.

A material including one of indium (In), zinc (Zn), and tin (Sn) can be used, for example, for the conductive films 120a and 120b used in the transistor 160. Specifically, for the conductive films 120a and 120b, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. The conductive films 120a and 120b can be formed by a sputtering method, for example.

Figure 22:
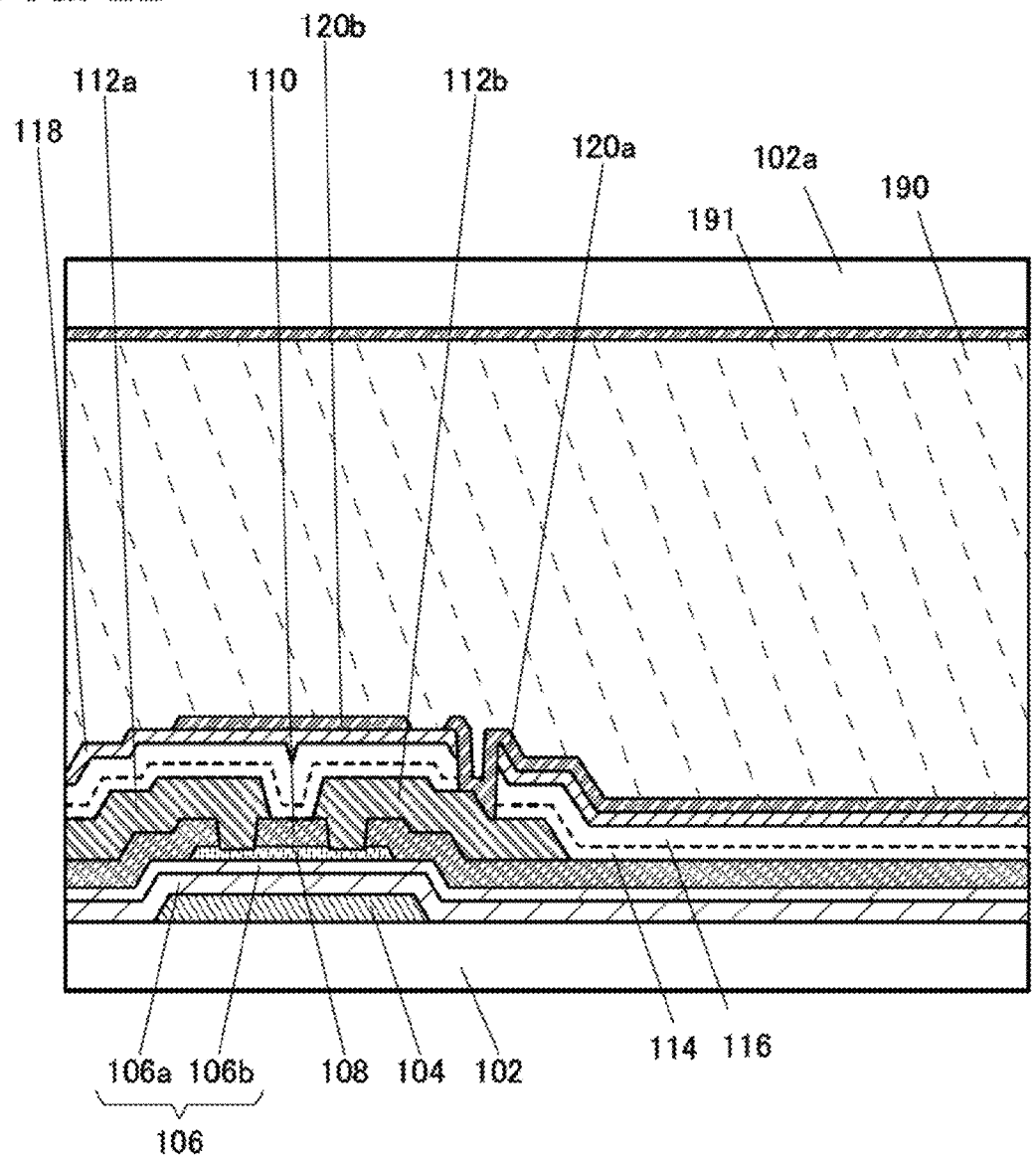
FIG. 22 is a cross-sectional view of a display device.
Figure 23:
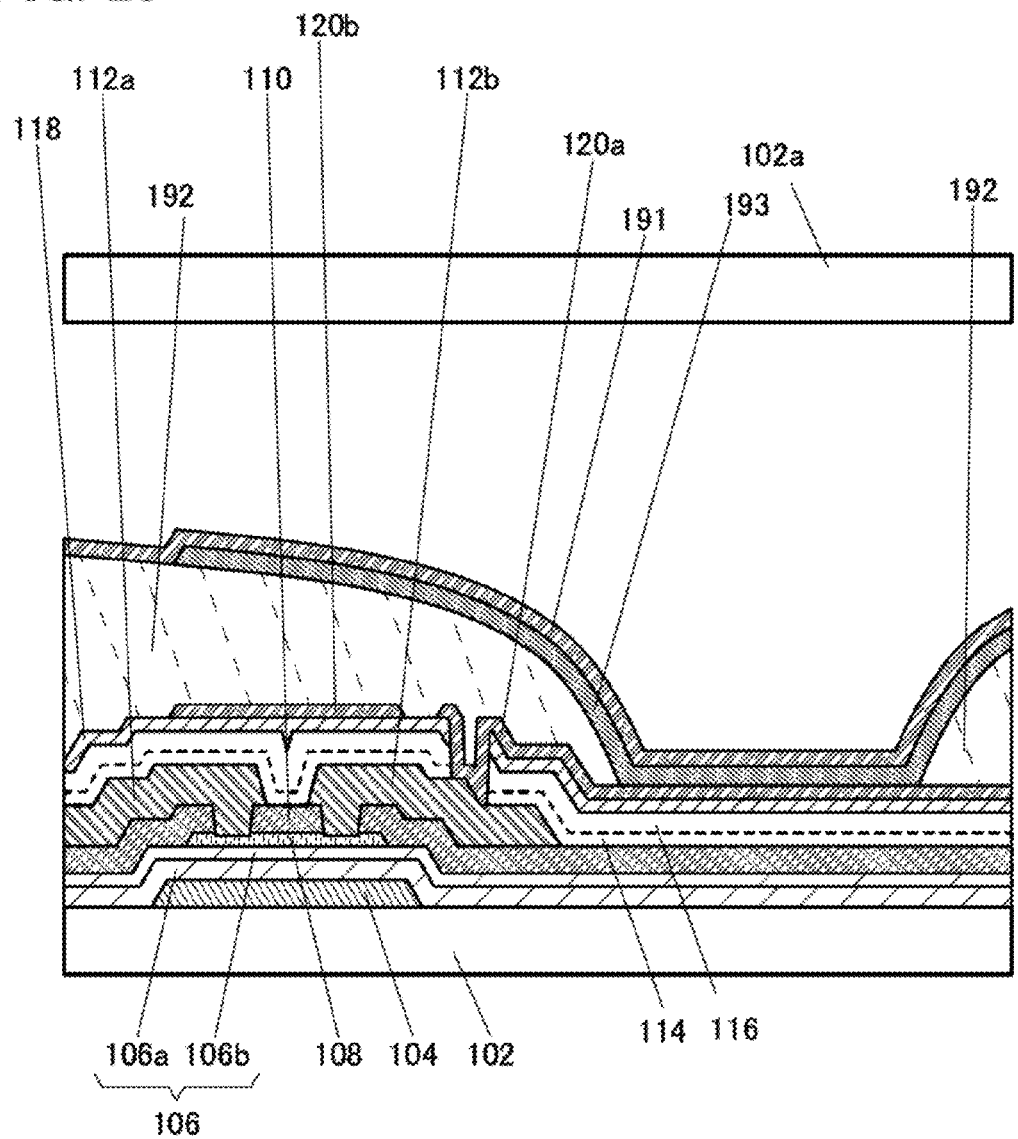
FIG. 23 is a cross-sectional view of a display device.

Next, an example in which a liquid crystal layer 190 is provided over the conductive film 120a is shown in FIG. 22. A conductive layer 191 is provided on a substrate 102a. The conductive layer 191 includes, for example, a material similar to those given in the description of the conductive films 120a and 120b. The conductive layer 191 functions as a common electrode. That is, the conductive film 120a, the liquid crystal layer 190, and the conductive layer 191 form a liquid crystal element. Another example in which a light-emitting element is provided is shown in FIG. 23. In FIG. 23, the conductive layer 191 is provided on the substrate 102 side. An insulating film 192 is provided over the conductive film 120a, and a light-emitting layer 193 is provided over the conductive film 120a and the insulating film 192. The conductive film 120a, the light-emitting layer 193, and the conductive layer 191 form a light-emitting element.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a digital micro shutter (DMS), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

<Structure Example 3 of Semiconductor Device>

Figure 3A:
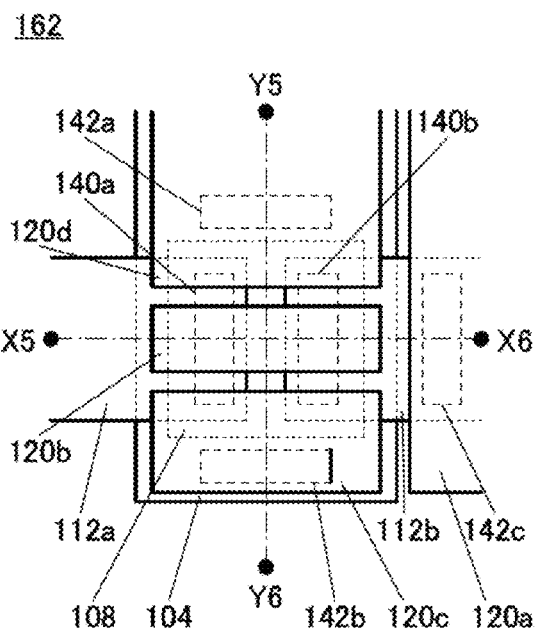
FIGS. 3A to 3C are a top view and cross-sectional views of a semiconductor device.
Figure 3B:
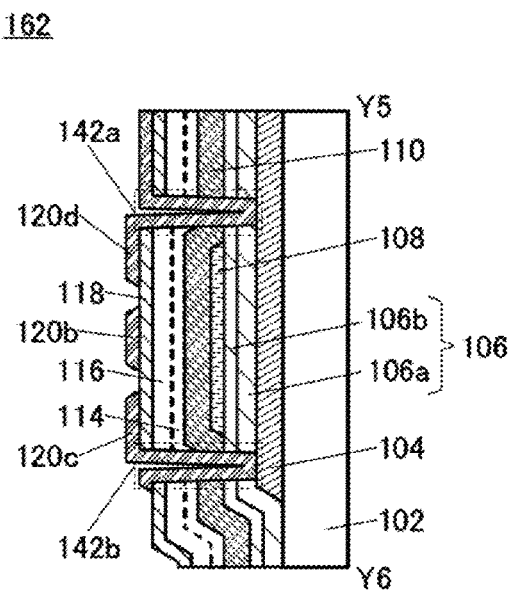
Figure 3C:
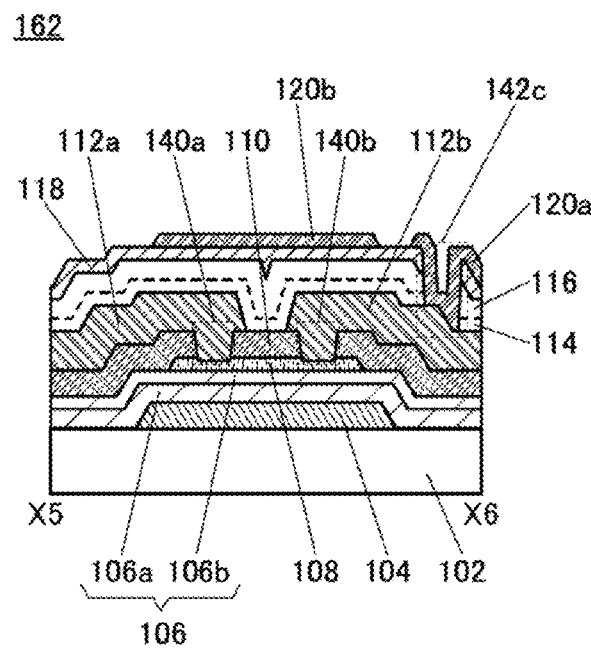

Next, a transistor 162, which is a semiconductor device of one embodiment of the present invention, is described with reference to FIGS. 3A to 3C. FIG. 3A is a top view of the transistor 162 which is a semiconductor device of one embodiment of the present invention. FIG. 3B is a cross-sectional view taken along a dashed-dotted line Y5-Y6 shown in FIG. 3A, and FIG. 3C is a cross-sectional view taken along a dashed-dotted line X5-X6 shown in FIG. 3A. Note that in FIG. 3A, some components of the transistor 162 (e.g., a gate insulating film) are not illustrated to avoid complexity.

The transistor 162 includes the conductive film 104 functioning as a gate electrode layer over the substrate 102; the insulating film 106 functioning as a gate insulating film over the substrate 102 and the conductive film 104; the oxide semiconductor film 108 that is over the insulating film 106 and overlaps with the conductive film 104; the metal oxide film 110 over the insulating film 106 and the oxide semiconductor film 108; the conductive films 112a and 112b that are electrically connected to the oxide semiconductor film 108 and function as a source electrode layer and a drain electrode layer of the transistor 162; the insulating films 114, 116, and 118 over the conductive films 112a and 112b and the metal oxide film 110; and conductive films 120a, 120b, 120c, and 120d over the insulating film 118. The conductive films 112a and 112b are connected to the oxide semiconductor film 108 through the openings 140a and 140b provided in the metal oxide film 110. The conductive film 120a is connected to the conductive film 112b through the opening 142c provided in the insulating films 114, 116, and 118. The conductive film 120b is formed over the insulating film 118 to overlap with the oxide semiconductor film 108. The conductive film 120c is connected to the conductive film 104 through the opening 142b provided in the insulating films 106a, 106b, 114, 116, and 118 and the metal oxide film 110. The conductive film 120d is connected to the conductive film 104 through the opening 142a provided in the insulating films 106a, 106b, 114, 116, and 118 and the metal oxide film 110.

In FIGS. 3B and 3C, the insulating film 106 functioning as a gate insulating film has a two-layer structure including the insulating films 106a and 106b. Note that the structure of the insulating film 106 is not limited thereto, and the insulating film 106 may have a single-layer structure or a stacked-layer structure including three or more layers.

As shown in FIGS. 3B and 3C, the metal oxide film 110 covers at least a channel region and side surfaces of the oxide semiconductor film 108.

In the transistor 162, the conductive film 120a functions as, for example, a pixel electrode layer used for a display device.

The transistor 162 differs from the transistor 160 in that the conductive film 120b, which functions as a back gate electrode layer in the transistor 160, is separated. The other components of the transistor 162 can be similar to those of the transistor 160. The description of the transistor 160 can be referred to for details of the structure of the transistor 162.

The conductive films 120c and 120d included in the transistor 162 have regions which overlap with the oxide semiconductor film 108 when seen from the above, and face the side surfaces of the oxide semiconductor film 108 in the openings 142a and 142b. Thus, like the transistor 160, the transistor 162 also has an s-channel structure in which the oxide semiconductor film 108 is electrically surrounded by the conductive films 104, 120b, 120c, and 120d; therefore, an electric field for inducing a channel can be effectively applied to the oxide semiconductor film 108 by the conductive film 104 functioning as a gate electrode layer. Accordingly, the current drive capability of the transistor 162 is improved, so that high on-state current can be obtained.

Furthermore, since the conductive film 120*b* functioning as a back gate electrode layer is not electrically connected to the conductive film 104 functioning as a gate electrode layer in the transistor 162, different potentials or signals can be input to the conductive film 104 and the conductive film 120*b*. Therefore, by a signal or potential input to the conductive film 120*b* functioning as a back gate electrode layer, the threshold voltage of the transistor 162 can be shifted in the positive or negative direction. By controlling the threshold voltage of the transistor 162 as appropriate, the transistor 162 can be switched between an enhancement mode and a depletion mode as appropriate. Note that the conductive film 120*b* functioning as a back gate electrode layer may be in a floating state.

<Structure Example 4 of Semiconductor Device>

Figure 4A:
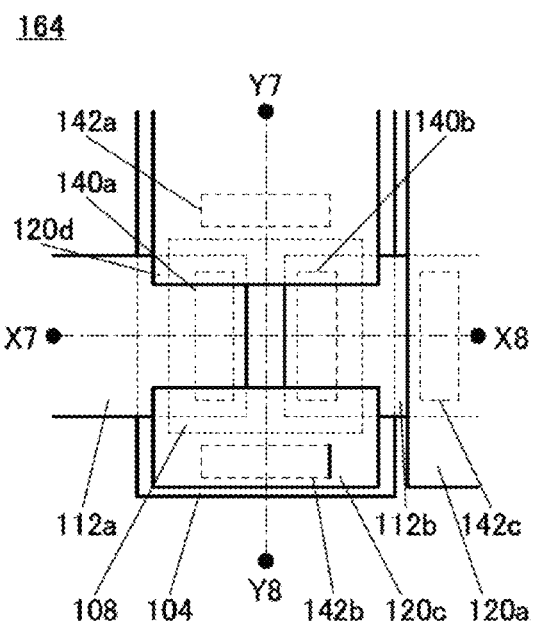
FIGS. 4A to 4C are a top view and cross-sectional views of a semiconductor device.
Figure 4B:
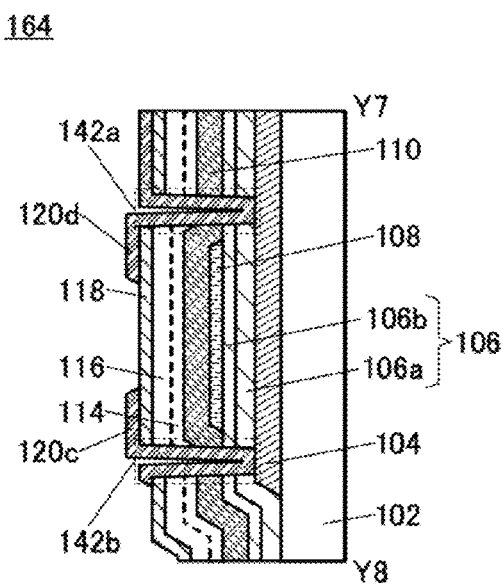
Figure 4C:
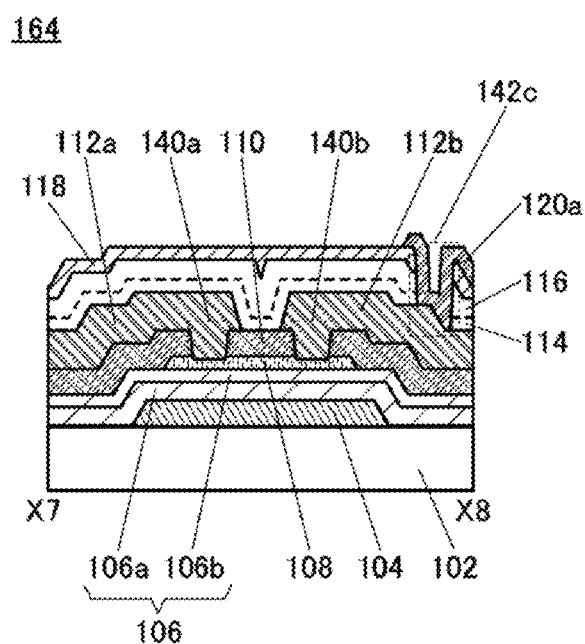

Next, a transistor 164, which is a semiconductor device of one embodiment of the present invention, is described with reference to FIGS. 4A to 4C. FIG. 4A is a top view of the transistor 164 which is a semiconductor device of one embodiment of the present invention. FIG. 4B is a cross-sectional view taken along a dashed-dotted line Y7-Y8 shown in FIG. 4A, and FIG. 4C is a cross-sectional view taken along a dashed-dotted line X7-X8 shown in FIG. 4A. Note that in FIG. 4A, some components of the transistor 164 (e.g., a gate insulating film) are not illustrated to avoid complexity.

The transistor 164 includes the conductive film 104 functioning as a gate electrode layer over the substrate 102; the insulating film 106 functioning as a gate insulating film over the substrate 102 and the conductive film 104; the oxide semiconductor film 108 that is over the insulating film 106 and overlaps with the conductive film 104; the metal oxide film 110 over the insulating film 106 and the oxide semiconductor film 108; the conductive films 112*a* and 112*b* that are electrically connected to the oxide semiconductor film 108 and function as a source electrode layer and a drain electrode layer of the transistor 164; the insulating films 114, 116, and 118 over the conductive films 112*a* and 112*b* and the metal oxide film 110; and the conductive films 120*a*, 120*c*, and 120*d* over the insulating film 118. The conductive films 112*a* and 112*b* are connected to the oxide semiconductor film 108 through the openings 140*a* and 140*b* provided in the metal oxide film 110. The conductive film 120*a* is connected to the conductive film 112*b* through the opening 142*c* provided in the insulating films 114, 116, and 118. The conductive film 120*c* is connected to the conductive film 104 through the opening 142*b* provided in the insulating films 106*a*, 106*b*, 114, 116, and 118 and the metal oxide film 110. The conductive film 120*d* is connected to the conductive film 104 through the opening 142*a* provided in the insulating films 106*a*, 106*b*, 114, 116, and 118 and the metal oxide film 110.

In FIGS. 4B and 4C, the insulating film 106 functioning as a gate insulating film has a two-layer structure including the insulating films 106*a* and 106*b*. Note that the structure of the insulating film 106 is not limited thereto, and the insulating film 106 may have a single-layer structure or a stacked-layer structure including three or more layers.

As shown in FIGS. 4B and 4C, the metal oxide film 110 covers at least a channel region and side surfaces of the oxide semiconductor film 108.

In the transistor 164, the conductive film 120*a* functions as, for example, a pixel electrode layer used for a display device.

Figure 24:
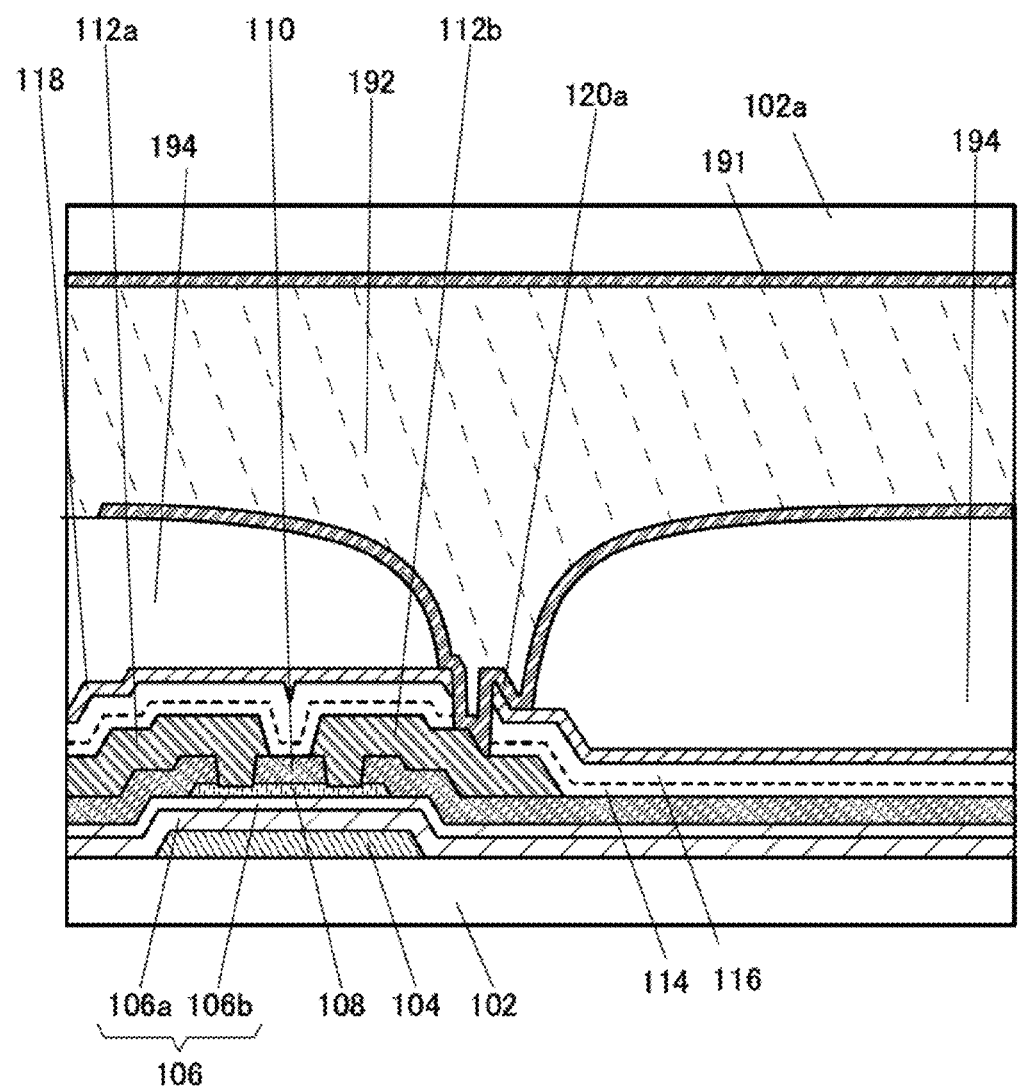
FIG. 24 is a cross-sectional view of a display device.
Figure 25:
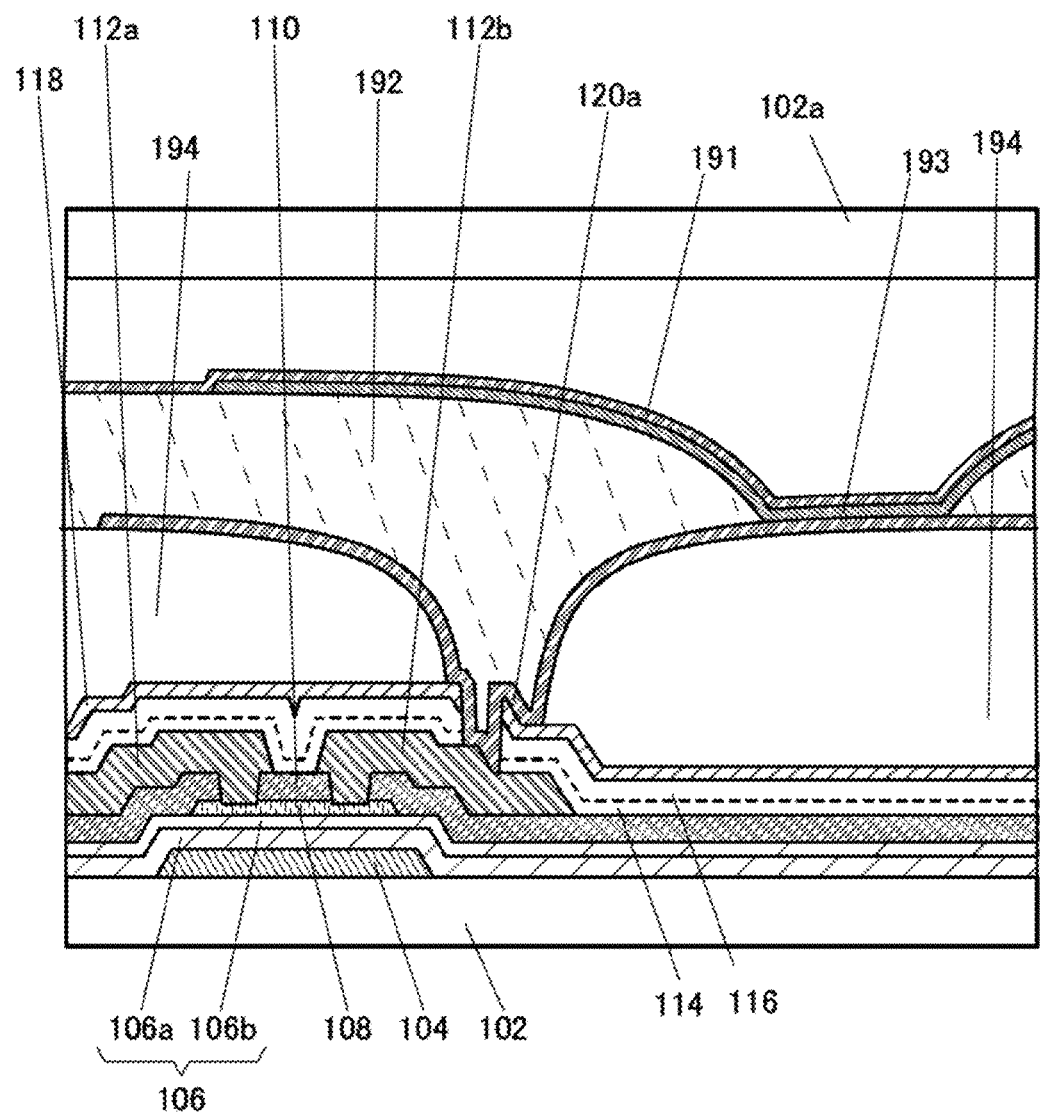
FIG. 25 is a cross-sectional view of a display device.

Note that an insulating film 194 may be provided between the insulating film 118 and the conductive film 120*a*. FIG. 24 and FIG. 25 each illustrate an example of this case. The insulating film 194 may include, for example, an organic resin material such as polyimide, acrylic, polyamide, or epoxy. In this case, unevenness of the top surface can be reduced, so that the top surface can be flat.

In the case where transistors are arranged in a matrix, there are regions where wirings intersect each other. FIGS. 20A to 20F illustrate examples of a top view and a cross-sectional view of such a region. In FIGS. 20A to 20D, an oxide semiconductor film 108*a* is provided. The oxide semiconductor film 108*a* and the oxide semiconductor film 108 are formed in the same film formation step, the same etching step, and the same patterning step. In FIGS. 20A to 20F, a conductive film 104*a* is provided. The conductive film 104*a* and the conductive film 104 are formed in the same film formation step, the same etching step, and the same patterning step. The conductive film 104*a* functions as a wiring, for example. For example, the conductive film 104*a* functions as a gate signal line, a scan line, a capacitor wiring, a common wiring, or the like. Furthermore, in FIGS. 20A to 20F, a conductive film 112*c* is provided. The conductive film 112*c* and the conductive film 112*a* are formed in the same film formation step, the same etching step, and the same patterning step. The conductive film 112*c* functions as a wiring, for example. For example, the conductive film 112*c* functions as a source signal line, a data line, a current supply line, a power supply line, or the like. As shown in FIGS. 20A to 20D, the oxide semiconductor film 108*a* can increase the distance in the thickness direction between the wirings. Consequently, parasitic capacitance between the wirings can be reduced.

The transistor 164 differs from the transistor 160 in that the conductive film 120*b*, which functions as a back gate electrode layer in the transistor 160, is separated. The other components of the transistor 164 can be similar to those of the transistor 160. The description of the transistor 160 can be referred to for details of the structure of the transistor 164.

The transistor 164 includes the conductive films 120*c* and 120*d* overlapping with the oxide semiconductor film 108 with the metal oxide film 110 and the insulating films 114, 116, and 118 positioned therebetween. The conductive film 120*c* is connected to the conductive film 104 functioning as a gate electrode layer through the opening 142*b* provided in the insulating films 106*a*, 106*b*, 114, 116, and 118 and the metal oxide film 110. The conductive film 120*d* is connected to the conductive film 104 functioning as a gate electrode layer through the opening 142*a* provided in the insulating films 106*a*, 106*b*, 114, 116, and 118 and the metal oxide film 110. That is, the transistor 164 has the structure of the transistor 162 in which the conductive film 120*b* functioning as a back gate electrode layer is not provided.

Figure 21A:
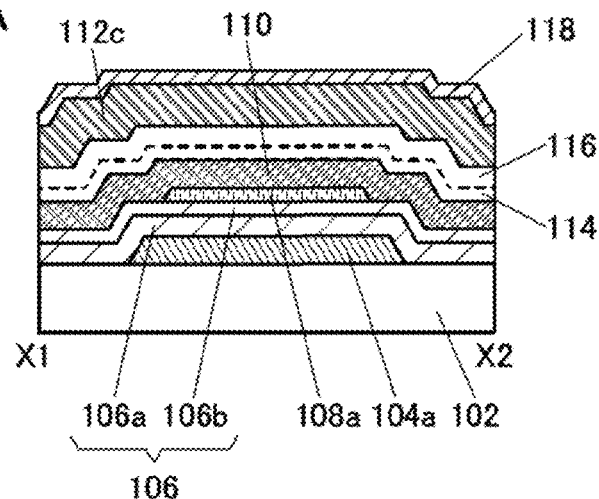
FIGS. 21A to 21C are cross-sectional views of semiconductor devices.
Figure 21B:
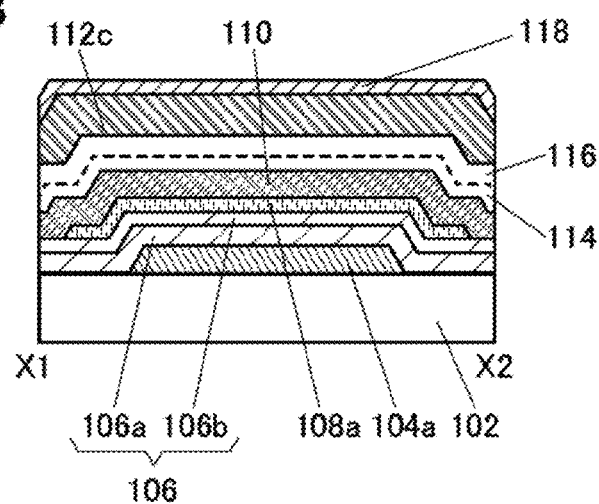
Figure 21C:
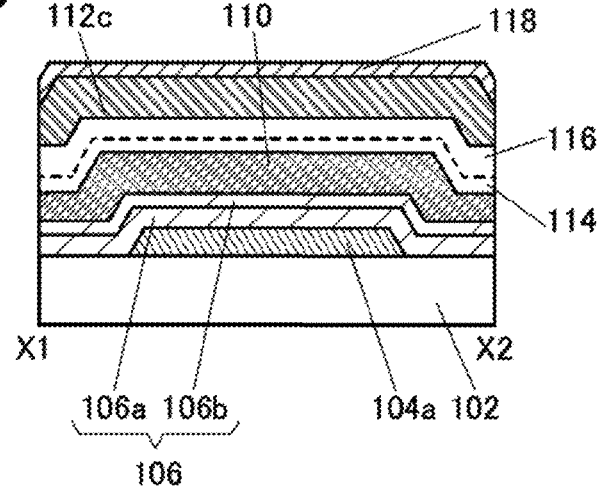

The transistor 164 includes the conductive films 104, 120*c*, and 120*d* that face the top and bottom surfaces and two side surfaces of the oxide semiconductor film 108; therefore, like the transistors 160 and 162, the transistor 164 also has an s-channel structure in which the oxide semiconductor film 108 is electrically surrounded. Therefore, the current drive capability of the transistor 164 is improved, so that the transistor 164 can have high on-state current. As in FIGS. 20A to 20F, examples of an intersection of wirings are shown in FIGS. 21A to 21C.

<Structure Example 5 of Semiconductor Device>

Figure 5A:
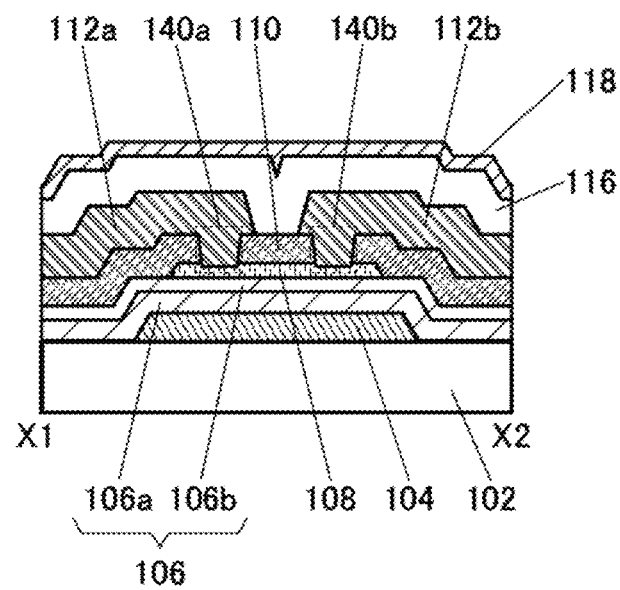
FIGS. 5A and 5B are cross-sectional views of semiconductor devices.
Figure 5B:
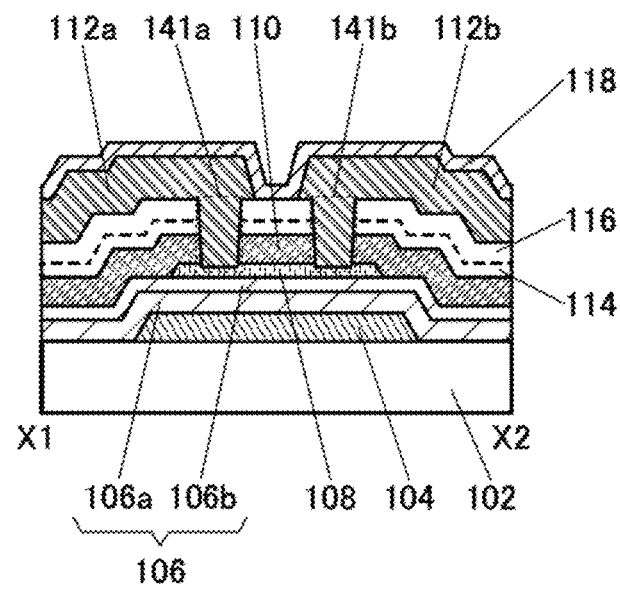
Figure 6:
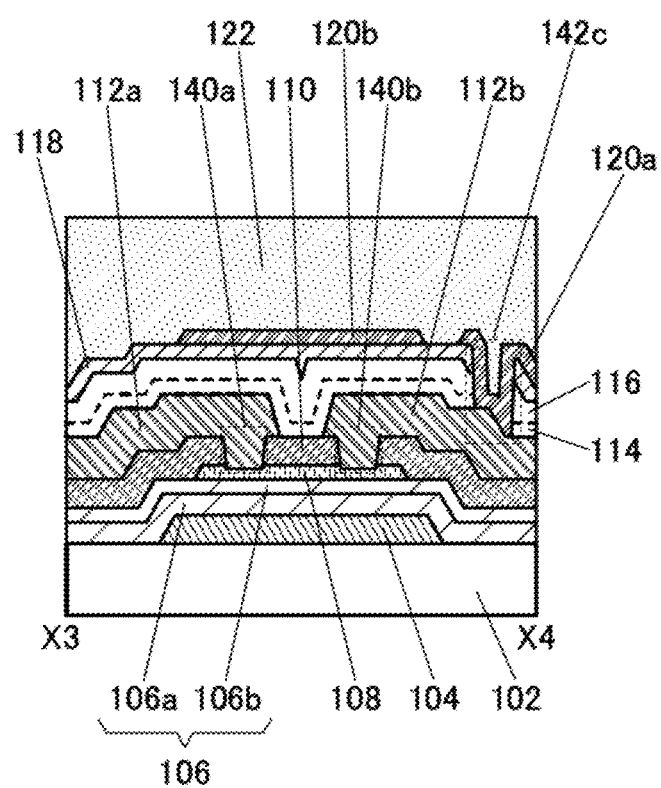
FIG. 6 is a cross-sectional view of a semiconductor device.

Next, transistors which are semiconductor devices of embodiments of the present invention are described with reference to FIGS. 5A and 5B and FIG. 6. FIGS. 5A and 5B show variations of the cross-sectional view of the transistor 150 in FIG. 1C, and FIG. 6 shows a variation of the cross-sectional view of the transistor 160 in FIG. 2C. The top views of the transistor 150 and the transistor 160 can be referred to for the top surface shapes of the transistors in FIGS. 5A and 5B and FIG. 6.

The cross-sectional view of the transistor in FIG. 5A differs from the cross-sectional view of the transistor 150 in FIG. 1C in that the insulating film 114 is not provided over the metal oxide film 110 and the conductive films 112*a* and 112*b* functioning as a source electrode layer and a drain electrode layer. In other words, in the transistor shown in FIG. 5A, the insulating film 116 is provided on the metal oxide film 110 and the conductive films 112*a* and 112*b* functioning as a source electrode layer and a drain electrode layer.

The cross-sectional view of the transistor in FIG. 5B differs from the cross-sectional view of the transistor 150 in FIG. 1C in the positions of the insulating films 114 and 116 and in that openings 141*a* and 141*b* are provided instead of the openings 140*a* and 140*b*. The openings 141*a* and 141*b* are formed in one step after the metal oxide film 110 and the insulating films 114 and 116 are formed.

The cross-sectional view of the transistor in FIG. 6 differs from the cross-sectional view of the transistor 160 in FIG. 2C in that an insulating film 122 is provided over the insulating film 118 and the conductive films 120*a* and 120*b*. The insulating film 122 functions as a planarization film, for example. As the insulating film 122, for example, an organic resin film of polyimide, acrylic, polyamide, or epoxy or an inorganic insulating film can be used.

The other structures of the transistors shown in FIGS. 5A and 5B and FIG. 6 are the same as those of the transistor 150 or the transistor 160, and an effect similar to that of the transistor 150 or the transistor 160 can be obtained.

The structures of the transistors of this embodiment can be freely combined with each other.

<Method 1 for Manufacturing Semiconductor Device>

Next, a method for manufacturing the transistor 150, which is a semiconductor device of one embodiment of the present invention, is described in detail with reference to FIGS. 7A to 7D and FIGS. 8A and 8B.

First, a conductive film is formed over the substrate 102 and processed through a photolithography step and an etching step, whereby the conductive film 104 functioning as a gate electrode layer is formed. Then, the insulating film 106 functioning as a gate insulating film is formed over the conductive film 104 functioning as a gate electrode layer. The insulating film 106 includes the insulating films 106*a* and 106*b* (see FIG. 7A).

The conductive film 104 functioning as a gate electrode layer can be formed by a sputtering method, a chemical vapor deposition (CVD) method, a vacuum evaporation method, or a pulsed laser deposition (PLD) method. Alternatively, a coating method or a printing method can be used. Although typical deposition methods are a sputtering method and a plasma chemical vapor deposition (PECVD) method, a thermal CVD method, such as an MOCVD method, or an ALD method described above may be used.

In this embodiment, a glass substrate is used as the substrate 102, and a 100-nm-thick tungsten film is formed as the conductive film 104 functioning as a gate electrode layer by a sputtering method.

The insulating film 106 functioning as a gate insulating film can be formed by a sputtering method, a PECVD method, a thermal CVD method, a vacuum evaporation method, a PLD method, or the like. In this embodiment, a 400-nm-thick silicon nitride film as the insulating film 106*a* and a 50-nm-thick silicon oxynitride film as the insulating film 106*b* are formed by a PECVD method.

Figure 7A:
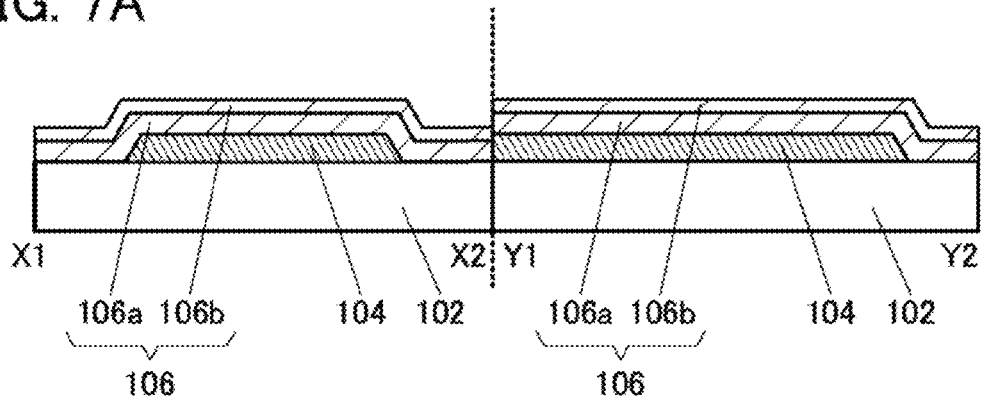
FIGS. 7A to 7D are cross-sectional views illustrating a method for manufacturing a semiconductor device.
Figure 7B:
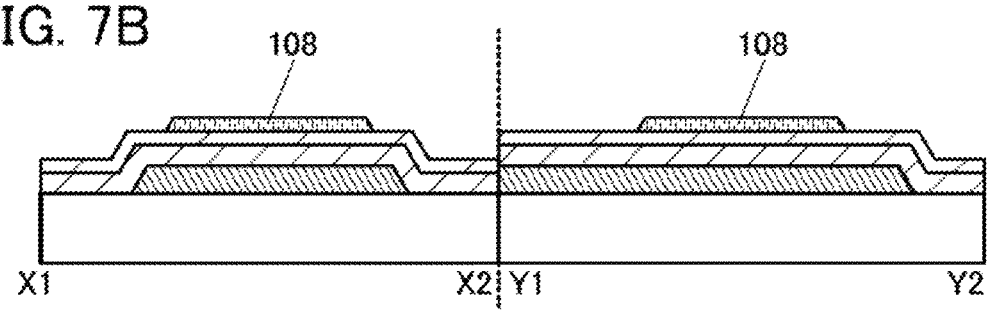
Figure 7C:
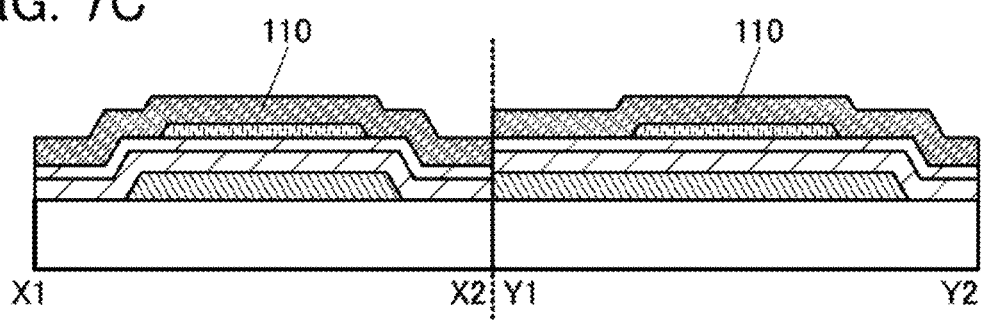

Next, the oxide semiconductor film 108 is formed over the insulating film 106 functioning as a gate insulating film (see FIG. 7B).

In this embodiment, an oxide semiconductor film is formed by a sputtering method using an In—Ga—Zn metal oxide target (In:Ga:Zn=1:1:1). Then, the oxide semiconductor film is processed into an island shape, whereby the oxide semiconductor film 108 is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor film and can reduce hydrogen, water, and the like contained in the oxide semiconductor film 108. Note that the heat treatment for the purpose of reducing hydrogen, water, and the like may be performed before the oxide semiconductor film 108 is processed into an island shape. Alternatively, the heat treatment for the purpose of reducing hydrogen, water, and the like may be performed after the metal oxide film 110 is formed in a later step.

An electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

Next, the metal oxide film 110 is formed over the insulating film 106 and the oxide semiconductor film 108. The metal oxide film 110 is formed to cover at least the channel region and the side surfaces of the oxide semiconductor film 108 (see FIG. 7C).

In this embodiment, the metal oxide film 110 is formed by a sputtering method using an In—Ga metal oxide target (In:Ga=7:93).

In the case where the oxide semiconductor film 108 and the metal oxide film 110 are formed by a sputtering method, an RF power supply device, an AC power supply device, a DC power supply device, or the like can be used as appropriate as a power supply device for generating plasma. Note that it is preferable to use DC discharge applicable to a large-sized substrate in deposition because the productivity of the semiconductor device can be increased. To deposit the metal oxide film 110 by a sputtering method using DC discharge, when an atomic ratio of In:M is x:y, it is preferable that y/(x+y) be less than or equal to 0.96, further preferably less than or equal to 0.95, for example, 0.93.

In the case where the oxide semiconductor film 108 and the metal oxide film 110 are formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 108 and the metal oxide film 110 can be minimized.

In the case where the oxide semiconductor film 108 and the metal oxide film 110 are formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film 108 and the metal oxide film 110, as much as possible. Alternatively, a turbo molecular pump and a cold trap are preferably combined so as to prevent a backflow of a gas, especially a gas containing carbon or hydrogen from an exhaust system to the inside of the chamber.

Figure 7D:
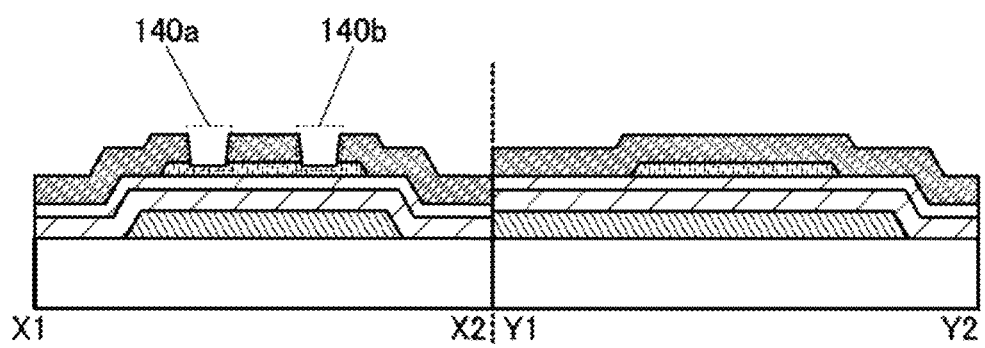

Next, a resist mask is formed over the metal oxide film 110 through a photolithography step using a photoresist mask, and then the openings 140a and 140b are formed in the metal oxide film 110 using the resist mask (see FIG. 7D).

The openings 140a and 140b reach the oxide semiconductor film 108. At the time of forming the openings 140a and 140b, the oxide semiconductor film 108 might be partly etched owing to over-etching, in which case the oxide semiconductor film 108 has depressed portions. Note that the openings 140a and 140b are formed by a wet etching method, a dry etching method, or a combination of wet etching and dry etching.

Figure 8A:
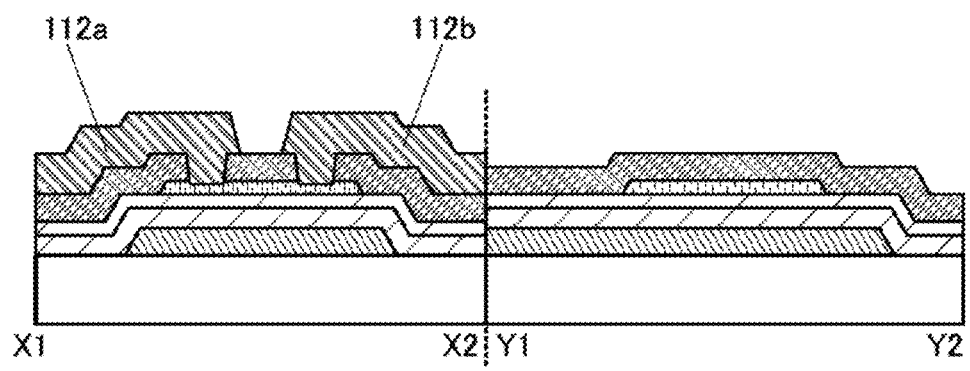
FIGS. 8A and 8B are cross-sectional views illustrating a method for manufacturing a semiconductor device.

Then, the conductive films 112a and 112b functioning as a source electrode layer and a drain electrode layer of the transistor 150 are formed over the metal oxide film 110 to cover the openings 140a and 140b (see FIG. 8A).

In this embodiment, the conductive films 112a and 112b are formed as follows. A 50-nm-thick tungsten film and a 300-nm-thick copper film are formed. Then, a resist mask is formed over the copper film through a photolithography step using a photoresist mask, and the tungsten film and the copper film are processed using the resist mask to be the conductive films 112a and 112b.

When a wet etching method is used for etching the copper film and a dry etching method using $SF_6$ is used for etching the tungsten film, for example, a fluoride is formed on the surface of the copper film and the fluoride can prevent diffusion of copper elements from the copper film. The metal oxide film 110 functions as an etching protective film for the oxide semiconductor film 108. Note that the above tungsten film may be replaced with a molybdenum film and the molybdenum film and the copper film may be etched in one step by a wet etching method.

Figure 8B:
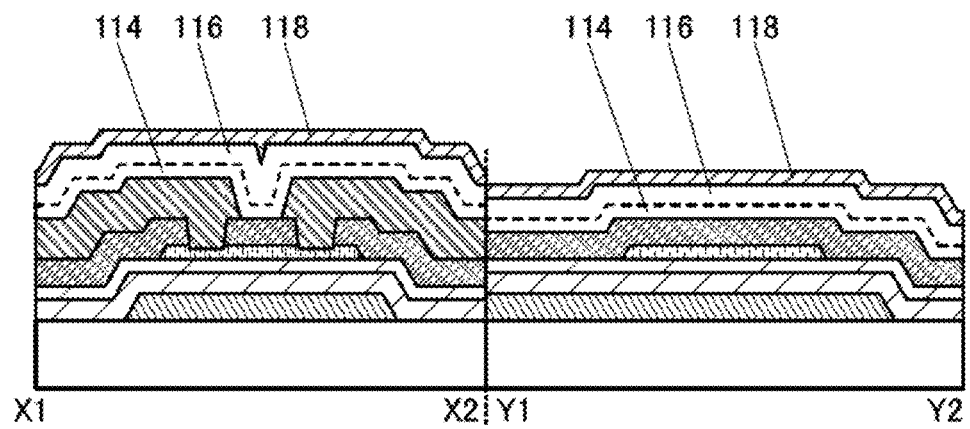

Next, the insulating films 114, 116, and 118 functioning as a protective insulating film of the transistor 150 are formed over the metal oxide film 110 and the conductive films 112a and 112b (see FIG. 8B).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced and oxygen in the insulating film 116 can be moved to the oxide semiconductor film 108; accordingly, the amount of oxygen vacancy in the oxide semiconductor film 108 can be reduced.

For example, as the insulating film 114, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the decomposition efficiency of the source gas in plasma is increased, oxygen radicals are increased, and oxidation of the source gas is promoted; therefore, the oxygen content of the insulating film 116 becomes higher than that in the stoichiometric composition. On the other hand, in the film formed at a substrate temperature within the above temperature range, a bond between silicon and oxygen is weak, and accordingly, part of oxygen in the film is released by heat treatment in a later step. Thus, it is possible to form an oxide insulating film which contains oxygen at a higher proportion than oxygen in the stoichiometric composition and from which part of oxygen is released by heating.

Note that the insulating film 114 functions as a protective film of the metal oxide film 110 in the step of forming the insulating film 116. Furthermore, the metal oxide film 110 functions as a protective film of the oxide semiconductor film 108. Consequently, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density corresponding to a signal which appears at g=2.001 due to a dangling bond of silicon is lower than $6\times10^{17}$ spins/cm$^3$, preferably lower than or equal to $3\times10^{17}$ spins/cm$^3$, further preferably lower than or equal to $1.5\times10^{17}$ spins/cm$^3$ by ESR measurement. As a result, the reliability of the transistor can be improved.

After the insulating films 114 and 116 are formed, heat treatment is performed. By the heat treatment, part of oxygen contained in the insulating films 114 and 116 can be moved to the oxide semiconductor film 108, so that the amount of oxygen vacancy contained in the oxide semiconductor film 108 can be further reduced. After the heat treatment, the insulating film 118 is formed.

The temperature of the heat treatment performed on the insulating films 114 and 116 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

In this embodiment, the heat treatment is performed at 350° C. in a mixed atmosphere of nitrogen and oxygen for one hour.

In the case where water, hydrogen, or the like is contained in the insulating films 114 and 116, when the insulating film 118 having a function of blocking water, hydrogen, and the like is formed and then heat treatment is performed, water, hydrogen, or the like contained in the insulating films 114 and 116 might be moved to the oxide semiconductor film 108, so that defects might be generated in the oxide semiconductor film 108. Thus, when heat treatment is performed before formation of the insulating film 118, water or hydrogen contained in the insulating films 114 and 116 can be effectively reduced.

Note that when the insulating film 116 is formed over the insulating film 114 while being heated, oxygen can be moved to the oxide semiconductor film 108 and oxygen vacancies in the oxide semiconductor film 108 can be reduced. For this reason, the heat treatment is not necessarily performed.

In the case where the insulating film 118 is formed by a PECVD method, the substrate temperature is preferably set to higher than or equal to 300° C. and lower than or equal to 400° C., more preferably higher than or equal to 320° C. and lower than or equal to 370° C., so that a dense film can be formed.

For example, in the case where a silicon nitride film is formed by a PECVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7\times10^{-1}$ W/cm$^2$.

Heat treatment may be performed after the formation of the insulating film 118. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C. When the heat treatment is performed, the amount of hydrogen and water in the insulating films 114 and 116 is reduced and accordingly the generation of defects in the oxide semiconductor film 108 described above is inhibited.

Through the above-described steps, the transistor 150 illustrated in FIGS. 1A to 1C can be formed.

<Method 2 for Manufacturing Semiconductor Device>

Figure 9A:
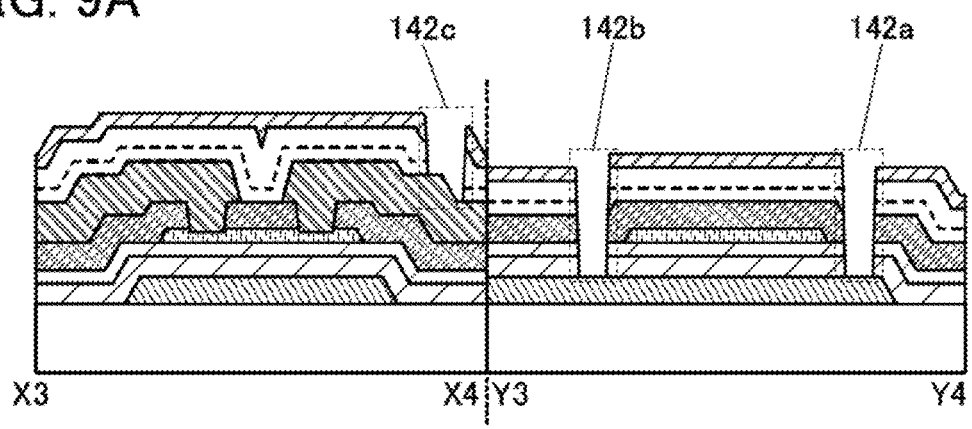
FIGS. 9A to 9C are cross-sectional views illustrating a method for manufacturing a semiconductor device.

Next, a method for manufacturing the transistor 160, which is a semiconductor device of one embodiment of the present invention, is described in detail with reference to FIGS. 9A to 9C.

First, the steps up to that in FIG. 8B are performed. Then, the openings 142a and 142b are formed in the insulating films 106a, 106b, 114, 116, and 118 and the metal oxide film 110. In addition, the opening 142c is formed in the insulating films 114, 116, and 118 (see FIG. 9A).

The openings 142a and 142b reach the conductive film 104. The opening 142c reaches the conductive film 112b. The openings 142a, 142b, and 142c can be formed in the same step. For example, a pattern is formed with the use of a half-tone mask (or a gray-tone mask, a phase-shift mask, or the like) in a desired region and a dry etching apparatus is used, whereby the openings 142a, 142b and 142c can be formed. A half-tone mask or a gray-tone mask may be used as needed. In other words, a half-tone mask or a gray-tone mask does not need to be used. A step of forming the openings 142a and 142b may be different from a step of forming the opening 142c. In that case, shapes of the openings 142a and 142b may have two stages.

Figure 9B:
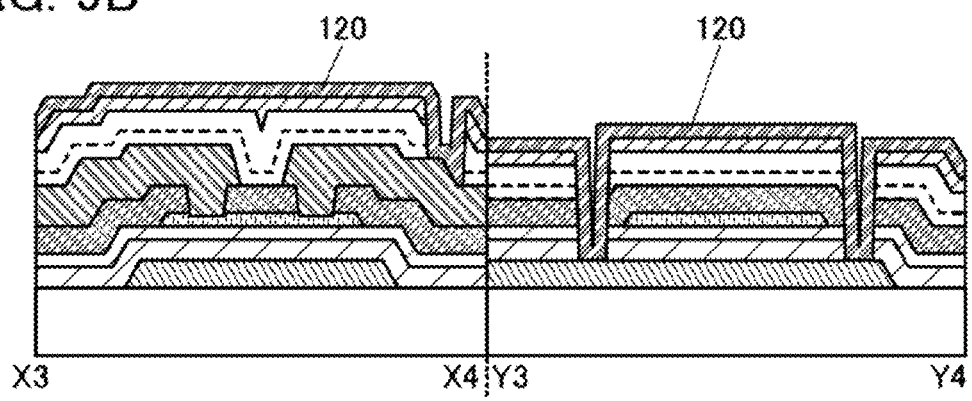

Next, a conductive film 120 is formed over the insulating film 118 so as to cover the openings 142a, 142b, and 142c (see FIG. 9B).

For the conductive film 120, for example, a material including one of indium (In), zinc (Zn), and tin (Sn) can be used. In particular, for the conductive film 120, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. The conductive film 120 can be formed by a sputtering method, for example.

Figure 9C:
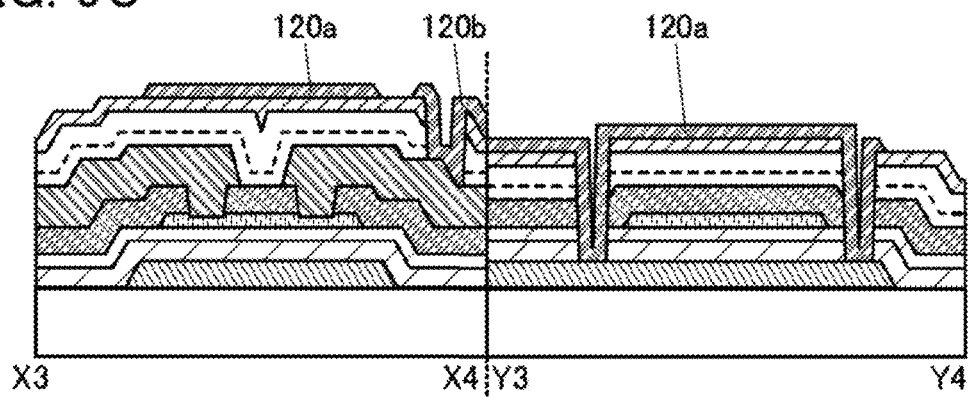

Then, the conductive film 120 is processed into a desired shape, whereby the conductive films 120a and 120b are formed (see FIG. 9C).

To form the conductive films 120a and 120b, for example, a dry etching method, a wet etching method, or a combination of dry etching and wet etching is used.

Through the above-described steps, the transistor 160 illustrated in FIGS. 2A to 2C can be formed.

Note that the transistor 162 in FIGS. 3A to 3C and the transistor 164 in FIGS. 4A to 4C each can be formed by removing a region of the conductive film 120 that is different from the region removed in FIG. 9C.

<Method 3 for Manufacturing Semiconductor Device>

Figure 10A:
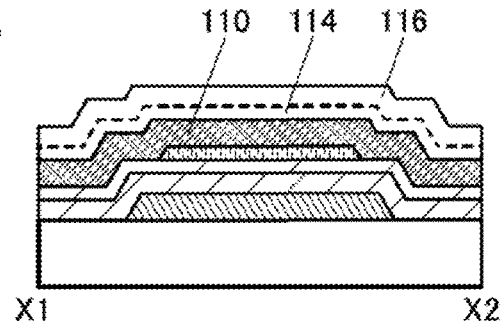
FIGS. 10A to 10D are cross-sectional views illustrating a method for manufacturing a semiconductor device.

Next, a method for manufacturing the transistor illustrated in FIG. 5B is described in detail with reference to FIGS. 10A to 100D.

First, the steps up to that in FIG. 7B are performed. Then, the metal oxide film 110 and the insulating films 114 and 116 are formed over the oxide semiconductor film 108 (see FIG. 10A).

Figure 10B:
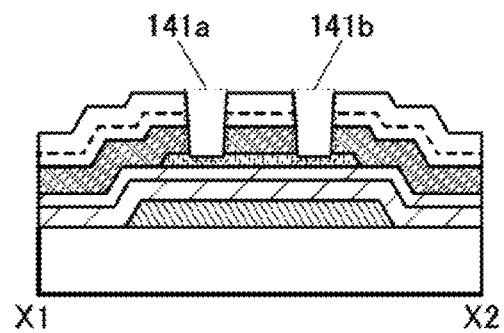

Next, the openings 141a and 141b are formed in the metal oxide film 110 and the insulating films 114 and 116 (see FIG. 10B).

The openings 141a and 141b reach the oxide semiconductor film 108. At the time of forming the openings 141a and 141b, the oxide semiconductor film 108 might be partly etched owing to over-etching, in which case the oxide semiconductor film 108 has depressed portions. Note that the openings 141a and 141b are formed by a wet etching method, a dry etching method, or a combination of wet etching and dry etching.

Figure 10C:
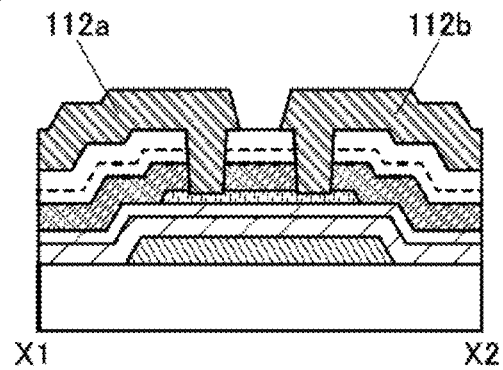

Then, the conductive films 112a and 112b functioning as a source electrode layer and a drain electrode layer are formed over the insulating film 116 to cover the openings 141a and 141b (see FIG. 10C).

A material and a formation method used for the conductive films 112a and 112b are similar to those of the conductive films 112a and 112b described above.

Figure 10D:
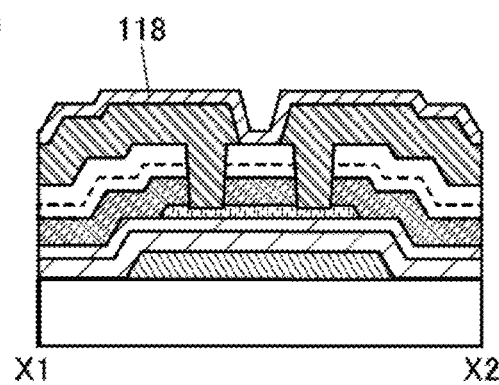

Next, the insulating film 118 is formed over the insulating film 116 and the conductive films 112a and 112b (see FIG. 10D).

Materials and formation methods used for the insulating films 114, 116, and 118 are similar to those of the insulating films 114, 116, and 118 described above.

Through the above-described steps, the transistor illustrated in FIG. 5B can be formed.

As described above, since a low-resistance material such as copper, aluminum, gold, or silver is used for the conductive films functioning as a source electrode layer and a drain electrode layer in the transistor, which is the semiconductor device of this embodiment, a semiconductor device in which wiring delay is suppressed can be manufactured. Furthermore, the metal oxide film functioning as a barrier film is provided in contact with the conductive films functioning as a source electrode layer and a drain electrode layer, whereby a reduction in electrical characteristics can be prevented, and thus it is possible to provide a semiconductor device having favorable electrical characteristics.

According to the manufacturing process of this embodiment, since the channel region and the side surfaces of the oxide semiconductor film are protected by the metal oxide film, it is possible to manufacture a highly reliable transistor in which the amount of oxygen vacancies and/or the impurity concentration in the oxide semiconductor film are/is reduced.

The structure and method described in this embodiment can be implemented by being combined as appropriate with any of the other structures and methods described in the other embodiments.

(Embodiment 2)

In this embodiment, as semiconductor devices of embodiments of the present invention, variations of the structure that is described in Embodiment 1 are described with reference to FIGS. 11A to 11C. Note that portions having functions similar to those in Embodiment 1 are given the same reference numerals and detailed description thereof is omitted.

<Structure Example 6 of Semiconductor Device>

Figure 11A:
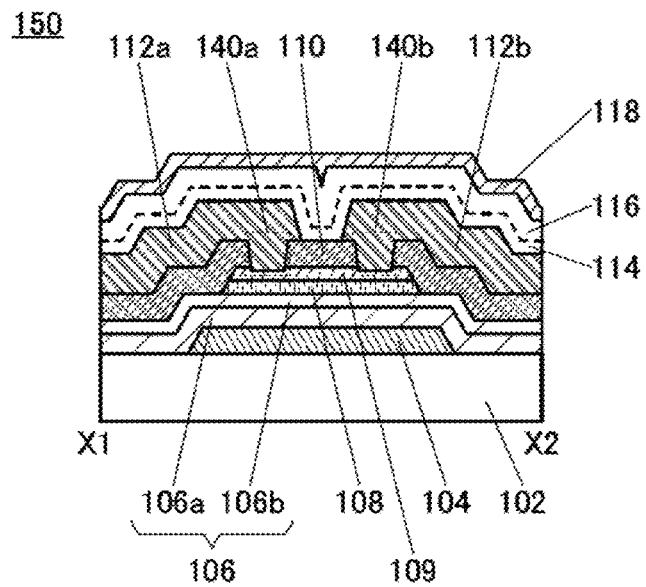
FIGS. 11A to 11C are a cross-sectional view of a semiconductor device and energy band diagrams of stacked films.

FIG. 11A shows a variation of the cross-sectional view shown in FIG. 1C in Embodiment 1.

A semiconductor device illustrated in FIG. 11A has a structure in which a stack including the oxide semiconductor film 108 and a metal oxide film 109 is used as the oxide semiconductor film 108 of the transistor 150 illustrated in FIG. 1C. Note that the metal oxide film 109 is formed over and in contact with the oxide semiconductor film 108. The metal oxide film 109 functions as a barrier film for preventing diffusion of constituent elements of the conductive films 112a and 112b into the oxide semiconductor film 108.

In the semiconductor device in FIG. 11A, the metal oxide film 110 covers a channel region and side surfaces of the oxide semiconductor film 108 and the top surface and side surfaces of the metal oxide film 109. This structure can prevent constituent elements of the conductive films 112a and 112b functioning as a source electrode layer and a drain electrode layer or constituent elements of the insulating film 114 from being mixed into the oxide semiconductor film 108. Thus, it is possible to inhibit a reduction in the electrical characteristics of the transistor 150.

For the oxide semiconductor film 108, for example, a material described in Embodiment 1, which contains an In-M-Zn oxide (M is Ti, Ga, Y, Zr, La, Ce, Nd, Sn, or Hf), is used. For the metal oxide film 109, a material containing an In-M-Zn oxide or an In-M oxide (M is Ti, Ga, Y, Zr, La, Ce, Nd, Sn, or Hf) is used. For the metal oxide film 110, a material containing an In-M-Zn oxide or an In-M oxide (M is Ti, Ga, Y, Zr, La, Ce, Nd, Sn, or Hf) is used.

Note that in the case where the metal oxide film 109 and the metal oxide film 110 are formed using the same kinds of materials, the interface between the metal oxide film 109 and the metal oxide film 110 is not observed in some cases.

Figure 11B:
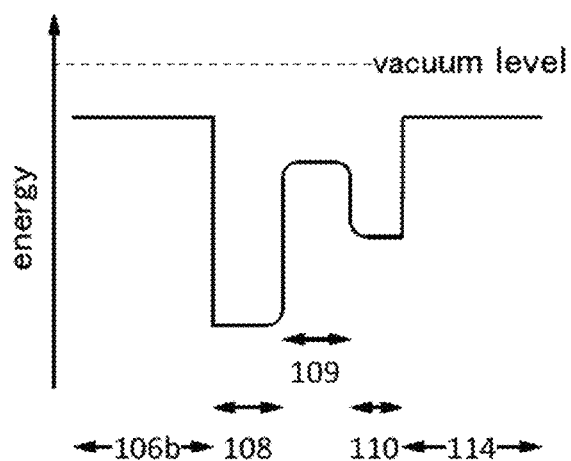
Figure 11C:
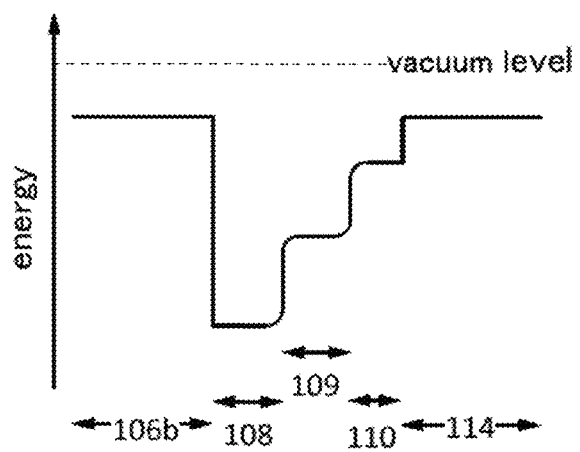

Here, FIGS. 11B and 11C each show an example of a band structure in the thickness direction of a stacked-layer structure including the insulating film 106b, the oxide semiconductor film 108, the metal oxide film 109, the metal oxide film 110, and the insulating film 114 illustrated in FIG. 11A. For easy understanding, the band structure shows the conduction band minimum (Ec) of each of the insulating film 106b, the oxide semiconductor film 108, the metal oxide films 109 and 110, and the insulating film 114.

FIG. 11B is a band diagram of a structure in which a silicon oxide film is used as each of the insulating films 106b and 114, an oxide semiconductor film that is formed using a metal oxide target with an atomic ratio of metal elements of In:Ga:Zn=1:1:1 is used as the oxide semiconductor film 108, a metal oxide film that is formed using a metal oxide target with an atomic ratio of metal elements of In:Ga=7:93 is used as the metal oxide film 109, and a metal oxide film that is formed using a metal oxide target with an atomic ratio of metal elements of In:Ga:Zn=1:3:2 is used as the metal oxide film 110.

FIG. 11C is a band diagram of a structure in which a silicon oxide film is used as each of the insulating films 106b and 114, an oxide semiconductor film that is formed using a metal oxide target with an atomic ratio of metal elements of In:Ga:Zn=1:1:1 is used as the oxide semiconductor film 108, a metal oxide film that is formed using a metal oxide target with an atomic ratio of metal elements of In:Ga:Zn=1:3:2 is used as the metal oxide film 109, and a metal oxide film that is formed using a metal oxide target with an atomic ratio of metal elements of In:Ga=7:93 is used as the metal oxide film 110.

As illustrated in FIGS. 11B and 11C, the conduction band minimum smoothly varies between the oxide semiconductor film 108 and the metal oxide film 109 and between the metal oxide film 109 and the metal oxide film 110. In other words, the conduction band minimum is continuously varied, or a continuous junction is formed. To obtain such a band structure, there exists no impurity, which forms a defect state such as a trap center or a recombination center for the oxide semiconductor, at the interface between the oxide semiconductor film 108 and the metal oxide film 109. In addition, there exists no impurity, which forms a defect state such as a trap center or a recombination center for the oxide semiconductor, at the interface between the metal oxide film 109 and the metal oxide film 110.

To form a continuous junction between the oxide semiconductor film 108 and the metal oxide film 109 and between the metal oxide film 109 and the metal oxide film 110, it is necessary to form the films successively without exposure to the air by using a multi-chamber deposition apparatus (sputtering apparatus) provided with a load lock chamber.

With the band structure of FIG. 11B or FIG. 11C, the oxide semiconductor film 108 serves as a well, and a channel region is formed in the oxide semiconductor film 108 in the transistor with the stacked-layer structure.

By providing the metal oxide films 109 and 110, the oxide semiconductor film 108 can be distanced away from trap states.

Application of voltage to the transistor 150 illustrated in FIG. 11A changes the conduction band minimum (Ec) in each component. By the change, the trap states might be more distant from the vacuum level than the conduction band minimum (Ec) of the oxide semiconductor film 108 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the conduction band minimum (Ec) of the oxide semiconductor film 108 even in the state where voltage is applied to the transistor 150 illustrated in FIG. 11A. Such a structure inhibits accumulation of electrons in the trap states.

As a result, the on-state current and the field-effect mobility of the transistor can be increased.

In FIGS. 11B and 11C, the conduction band minimum of each of the metal oxide films 109 and 110 is closer to the vacuum level than that of the oxide semiconductor film 108. Typically, an energy difference between the conduction band minimum of the oxide semiconductor film 108 and the conduction band minimum of each of the metal oxide films 109 and 110 is greater than or equal to 0.15 eV or greater than or equal to 0.5 eV, and less than or equal to 2 eV or less than or equal to 1 eV. That is, the difference between the electron affinity of each of the metal oxide films 109 and 110 and the electron affinity of the oxide semiconductor film 108 is greater than or equal to 0.15 eV or greater than or equal to 0.5 eV, and less than or equal to 2 eV or less than or equal to 1 eV.

In such a structure, the oxide semiconductor film 108 serves as a main path of current and functions as a channel region when a voltage is applied to the transistor 150 in FIG. 11A. In addition, since each of the metal oxide films 109 and 110 contains one or more metal elements contained in the oxide semiconductor film 108 in which a channel region is formed, interface scattering is less likely to occur at the interface between the oxide semiconductor film 108 and the metal oxide film 109. Thus, the transistor 150 can have high field-effect mobility because the movement of carriers is not hindered at the interface.

In FIGS. 11A to 11C, to prevent each of the metal oxide films 109 and 110 from functioning as part of a channel region, a material having sufficiently low conductivity is used for each of the metal oxide films 109 and 110. Alternatively, a material which has a smaller electron affinity (an energy difference between the vacuum level and the conduction band minimum) than the oxide semiconductor film 108 and has a difference in conduction band minimum from the oxide semiconductor film 108 (band offset) is used for each of the metal oxide films 109 and 110. Furthermore, to inhibit generation of a difference between threshold voltages due to the value of the drain voltage, it is preferable to form each of the metal oxide films 109 and 110 using a material whose conduction band minimum is closer to the vacuum level than the conduction band minimum of the oxide semiconductor film 108 is by more than 0.2 eV, preferably 0.5 eV or more.

It is preferable that each of the metal oxide films 109 and 110 not have a spinel crystal structure. If the metal oxide film 109 or the metal oxide film 110 has a spinel crystal structure, constituent elements of the conductive films 112a and 112b might be diffused into the oxide semiconductor film 108 owing to the spinel crystal structure. Note that each of the metal oxide films 109 and 110 is preferably a CAAC-OS, which is described later, in which case a higher blocking property against constituent elements of the conductive films 112a and 112b, e.g., copper elements, is obtained.

The total thickness of the metal oxide films 109 and 110 is greater than or equal to a thickness that is capable of inhibiting diffusion of the constituent element of the conductive films 112a and 112b into the oxide semiconductor film 108, and less than a thickness that inhibits supply of oxygen from the insulating films 114 and 116 to the oxide semiconductor film 108. For example, when the total thickness of the metal oxide films 109 and 110 is greater than or equal to 10 nm, the constituent elements of the conductive films 112a and 112b can be prevented from diffusing into the oxide semiconductor film 108. When the total thickness of the metal oxide films 109 and 110 is less than or equal to 100 nm, oxygen can be effectively supplied from the insulating films 114 and 116 to the oxide semiconductor film 108.

When each of the metal oxide films 109 and 110 is an In-M-Zn oxide in which the atomic ratio of the element M (M is Ti, Ga, Y, Zr, La, Ce, Nd, Sn, or Hf) is higher than that of In, the energy gap of each of the metal oxide films 109 and 110 can be large and the electron affinity thereof can be small. Therefore, a difference in electron affinity between the oxide semiconductor film 108 and each of the metal oxide films 109 and 110 may be controlled by the proportion of the element M. Furthermore, oxygen vacancy is less likely to be generated in the metal oxide film in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

When each of the metal oxide films 109 and 110 contains an In-M-Zn oxide, the proportion of In and the proportion of M, not taking Zn and O into consideration, are preferably less than 50 atomic % and greater than or equal to 50 atomic %, respectively, further preferably less than 25 atomic % and greater than or equal to 75 atomic %, respectively.

Furthermore, in the case where the oxide semiconductor film 108 and the metal oxide films 109 and 110 are each formed of an In-M-Zn oxide (M is Ti, Ga, Y, Zr, La, Ce, Nd, Sn, or Hf), the proportion of M (M is Ti, Ga, Y, Zr, La, Ce, Nd, Sn, or Hf) in each of the metal oxide films 109 and 110 is larger than that in the oxide semiconductor film 108. Typically, the proportion of M in each of the metal oxide films 109 and 110 is 1.5 or more times, preferably two or more times, further preferably three or more times as large as that in the oxide semiconductor film 108.

Furthermore, in the case where the oxide semiconductor film 108 and the metal oxide films 109 and 110 are each formed of an In-M-Zn oxide (M is Ti, Ga, Y, Zr, La, Ce, Nd, Sn, or Hf), when In:M:Zn=$x_1$:$y_1$:$z_1$ [atomic ratio] is satisfied in the oxide semiconductor film 108 and In:M:Zn=$x_2$:$y_2$:$z_2$ [atomic ratio] is satisfied in one or both of the metal oxide films 109 and 110, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, still further preferably $y_2/x_2$ is three or more times or four or more times as large as $y_1/x_1$. In that case, it is preferable that, in the oxide semiconductor film 108, $y_1$ be larger than or equal to $x_1$ because the transistor including the oxide semiconductor film 108 can have stable electric characteristics. However, when $y_1$ is three or more times as large as $x_1$, the field-effect mobility of the transistor including the oxide semiconductor film 108 is reduced. Accordingly, $y_1$ is preferably smaller than three times $x_1$.

In the case where the oxide semiconductor film 108 is formed of an In-M-Zn oxide (M is Ti, Ga, Y, Zr, La, Ce, Nd, Sn, or Hf) and a target having the atomic ratio of metal elements of In:M:Zn=$x_1$:$y_1$:$z_1$ is used for depositing the oxide semiconductor film 108, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later is easily formed as the oxide semiconductor film 108. Typical examples of the atomic ratio of the metal elements of the target include In:M:Zn=1:1:1, In:M:Zn=1:1:1.2, In:M:Zn=3:1:2, and In:M:Zn=4:2:4.1.

In the case where each of the metal oxide films 109 and 110 is formed of an In-M-Zn oxide (M is Ti, Ga, Y, Zr, La, Ce, Nd, Sn, or Hf) and a target having the atomic ratio of metal elements of In:M:Zn=$x_2$:$y_2$:$z_2$ is used for depositing one or both of the metal oxide films 109 and 110, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of each of the metal oxide films 109 and 110 can be large and the electron affinity thereof can be small; therefore, $y_2/x_2$ is preferably greater than or equal to 3 or greater than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, and In:M:Zn=1:4:5.

Further, in the case where each of the metal oxide films 109 and 110 is formed of an In-M oxide (M is Ti, Ga, Y, Zr, La, Ce, Nd, Sn, or Hf), when a divalent metal element (e.g., zinc) is not contained as M, the metal oxide films 109 and 110 which do not include a spinel crystal structure can be formed. For each of the metal oxide films 109 and 110, for example, an In—Ga oxide can be used. The In—Ga oxide can be formed by a sputtering method using an In—Ga metal oxide target (In:Ga=7:93), for example. To deposit one or both of the metal oxide films 109 and 110 by a sputtering method using DC discharge, when an atomic ratio of In:M is x:y, it is preferable that y/(x+y) be less than or equal to 0.96, further preferably less than or equal to 0.95, for example, 0.93.

Note that the atomic ratio of each of the oxide semiconductor film 108 and the metal oxide films 109 and 110 varies within a range of ±40% of the above atomic ratio as an error.

Note that the structures, methods, and the like described in this embodiment can be used as appropriate in combination with any of the structures, methods, and the like described in the other embodiments.

(Embodiment 3)

The structure of an oxide semiconductor film included in a semiconductor device of one embodiment of the present invention is described in this embodiment.

A structure which can be included in an oxide semiconductor film is described below.

In this specification, trigonal and rhombohedral crystal systems are included in a hexagonal crystal system.

Oxide semiconductors are classified into a single crystal oxide semiconductor and a non-single-crystal oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 12A:
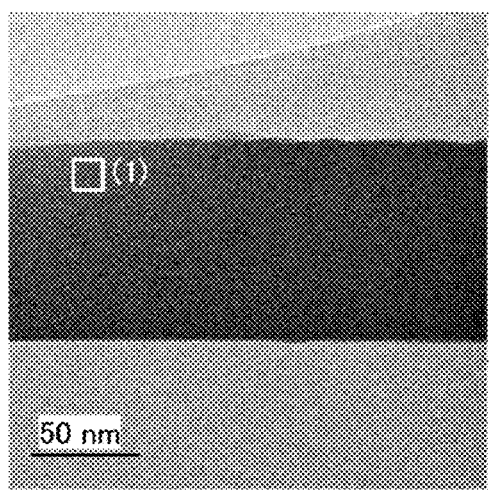
FIGS. 12A to 12D are Cs-corrected high-resolution TEM images of a cross section of a CAAC-OS and a cross-sectional schematic view of a CAAC-OS.

A CAAC-OS observed with TEM is described below. FIG. 12A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 12B:
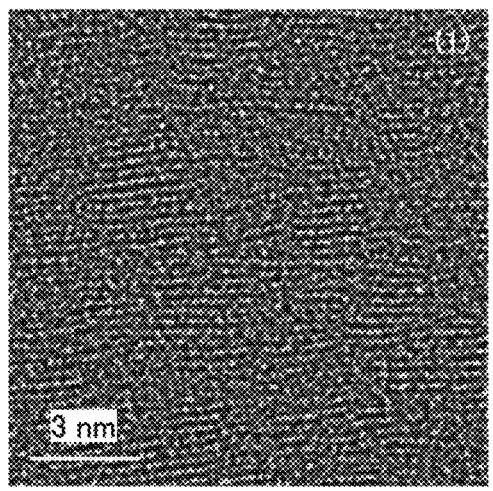

FIG. 12B is an enlarged Cs-corrected high-resolution TEM image of a region (1) in FIG. 12A. FIG. 12B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 12C:
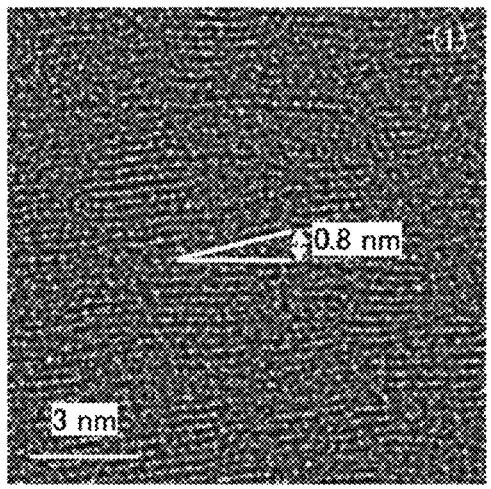

As shown in FIG. 12B, the CAAC-OS has a characteristic atomic arrangement. The characteristic atomic arrangement is denoted by an auxiliary line in FIG. 12C. FIGS. 12B and 12C prove that the size of a pellet is approximately 1 nm to 3 nm, and the size of a space caused by tilt of the pellets is approximately 0.8 nm. Therefore, the pellet can also be referred to as a nanocrystal (nc).

Figure 12D:
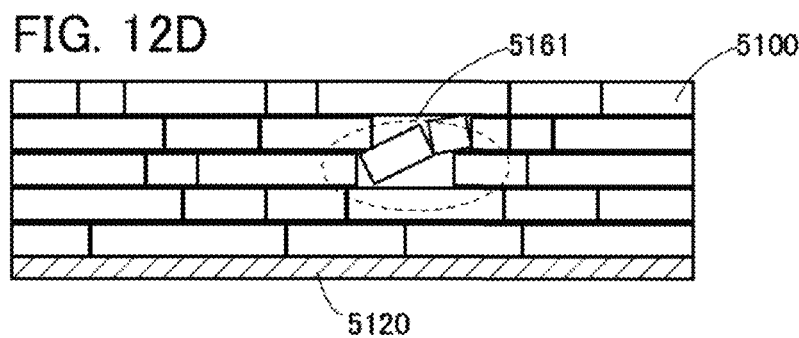

Here, according to the Cs-corrected high-resolution TEM images, the schematic arrangement of pellets 5100 of a CAAC-OS over a substrate 5120 is illustrated by such a structure in which bricks or blocks are stacked (see FIG. 12D). The part in which the pellets are tilted as observed in FIG. 12C corresponds to a region 5161 shown in FIG. 12D.

FIG. 13A shows a Cs-corrected high-resolution TEM image of a plane of the CAAC-OS observed from a direction substantially perpendicular to the sample surface. FIGS. 13B, 13C, and 13D are enlarged Cs-corrected high-resolution TEM images of regions (1), (2), and (3) in FIG. 13A, respectively. FIGS. 13B, 13C, and 13D indicate that metal atoms are arranged in a triangular, quadrangular, or hexagonal configuration in a pellet. However, there is no regularity of arrangement of metal atoms between different pellets.

Figure 14A:
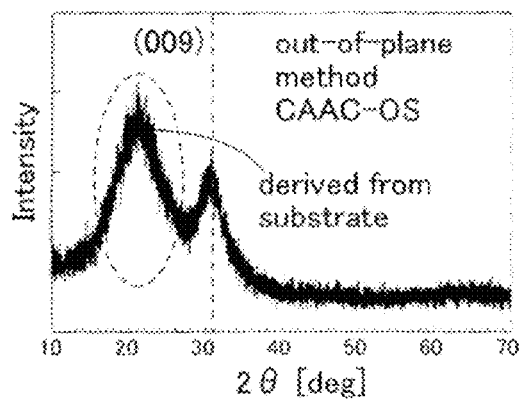
FIGS. 14A to 14C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 14A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 14B:
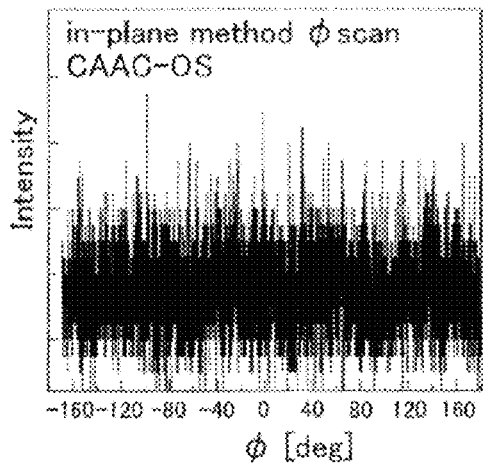
Figure 14C:
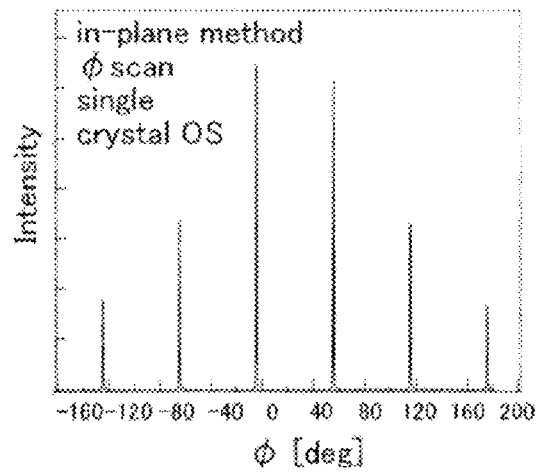

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 14B, a peak is not clearly observed. In contrast, in the case of a single crystal oxide semiconductor of $InGaZnO_4$, when φ scan is performed with 2θ fixed at around 56°, as shown in FIG. 14C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 26A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 26B shows a diffraction pattern obtained in such a manner that an electron beam with a probe diameter of 300 nm is incident on the same sample in a direction perpendicular to the sample surface. As shown in FIG. 26B, a ring-like diffraction pattern is observed. Thus, the electron diffraction also indicates that the a-axes and b-axes of the pellets included in the CAAC-OS do not have regular alignment. The first ring in FIG. 26B is considered to be derived from the (010) plane, the (100) plane, and the like of the $InGaZnO_4$ crystal. The second ring in FIG. 26B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 27:
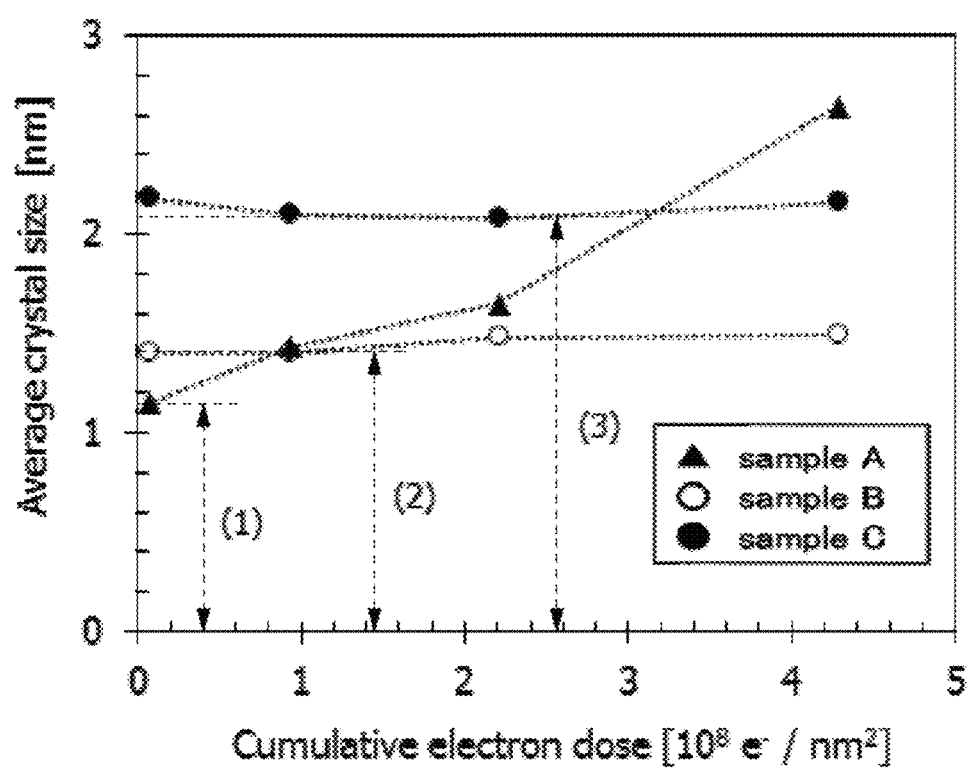
FIG. 27 shows a change in crystal part of an In—Ga—Zn oxide induced by electron irradiation.

FIG. 27 shows change in the average size of crystal parts (at 22 points to 45 points) in each sample. Note that the crystal part size corresponds to the length of a lattice fringe. FIG. 27 indicates that the crystal part size in the a-like OS increases with an increase in the cumulative electron dose. Specifically, as shown by (1) in FIG. 27, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 27, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 28A:
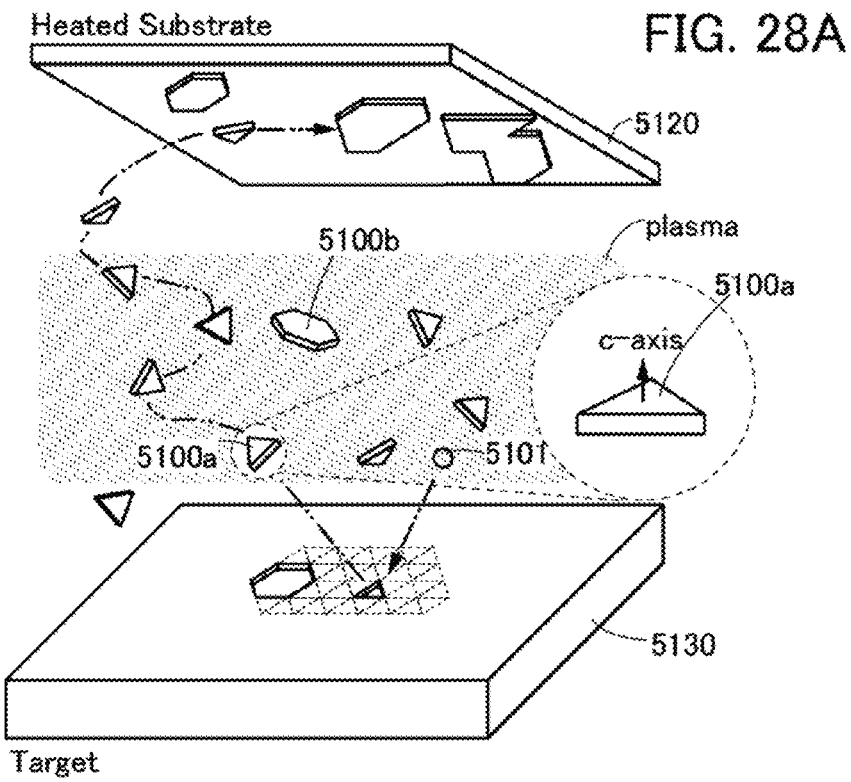
FIGS. 28A and 28B are schematic views showing deposition models of a CAAC-OS and an nc-OS.

FIG. 28A is a schematic view of the inside of a deposition chamber where a CAAC-OS is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 29A:
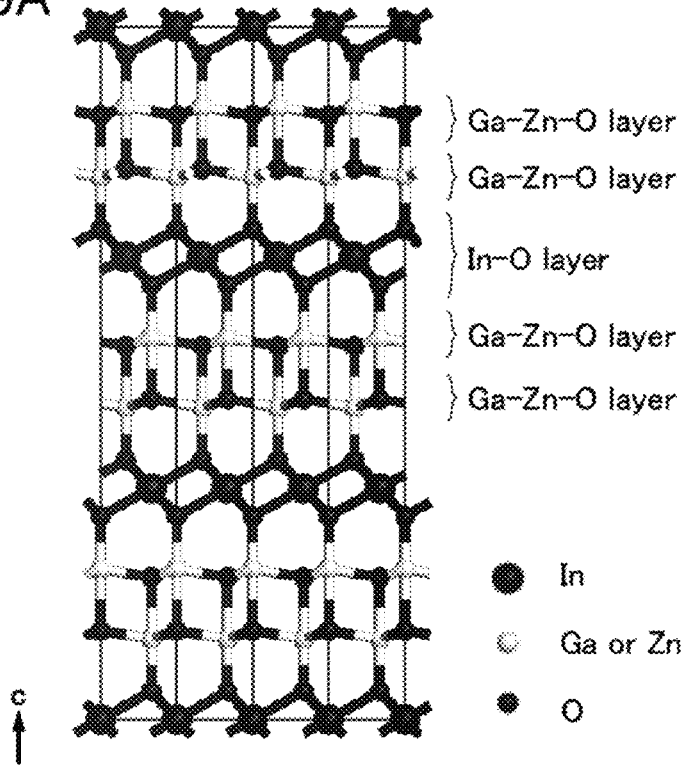
FIGS. 29A to 29C show an $InGaZnO_4$ crystal and a pellet.

Here, the target 5130 has a polycrystalline structure which includes a plurality of crystal grains and in which a cleavage plane exists in at least one crystal grain. FIG. 29A shows a structure of an $InGaZnO_4$ crystal included in the target 5130 as an example. Note that FIG. 29A shows a structure of the case where the $InGaZnO_4$ crystal is observed from a direction parallel to the b-axis when the c-axis is in an upward direction.

FIG. 29A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane.

The pellet 5100*b* is a flat-plate-like (pellet-like) sputtered particle having a hexagon plane, e.g., regular hexagon plane. Note that flat-plate-like (pellet-like) sputtered particles such as the pellet 5100*a* and the pellet 5100*b* are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 29B:
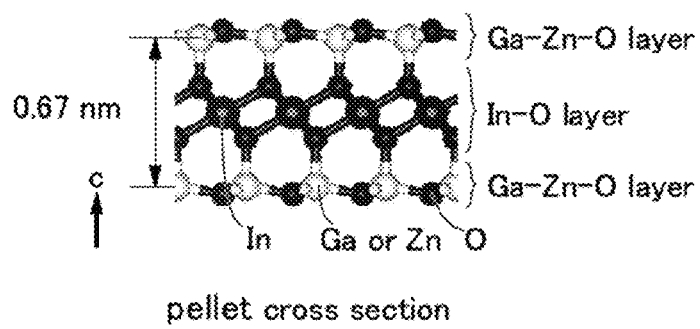
Figure 29C:
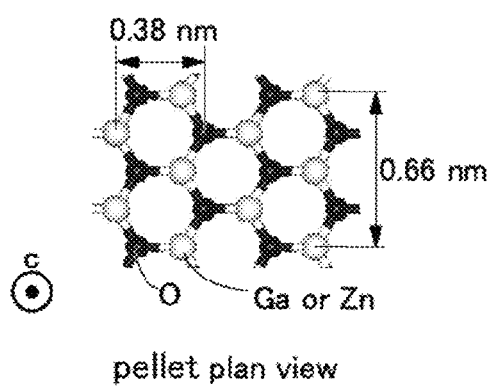

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 27. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 29B is separated. Note that FIG. 29C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 27 corresponds to the amount of growth in plasma. Here, in the case where the temperature of the substrate 5120 is at around room temperature, the pellet 5100 on the substrate 5120 hardly grows; thus, an nc-OS is formed (see FIG. 28B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 28B:
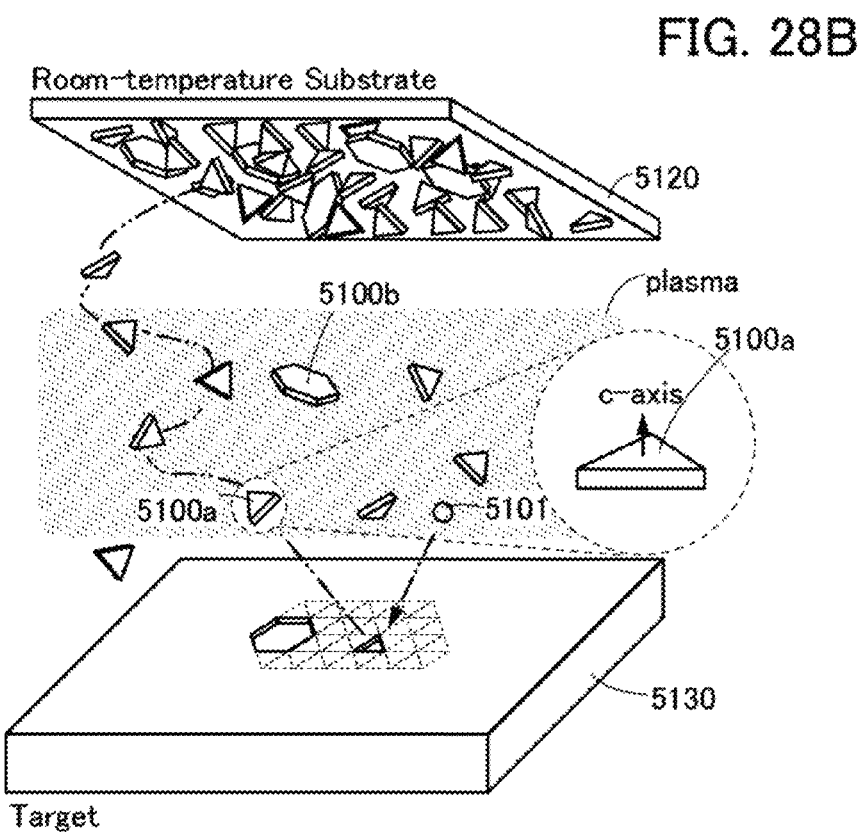

As shown in FIGS. 28A and 28B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 28A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion.

Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 30A to 30D are cross-sectional schematic views.

Figure 30A:
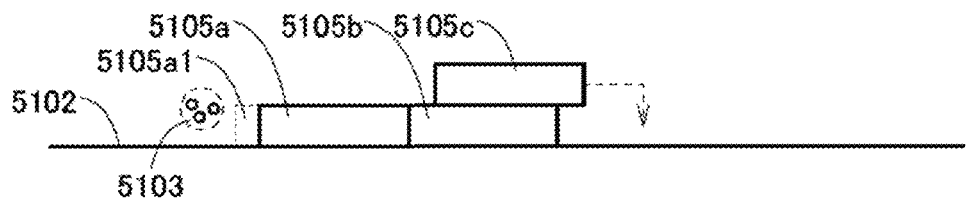
FIGS. 30A to 30D are schematic views showing a deposition model of a CAAC-OS.

As illustrated in FIG. 30A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 30B:
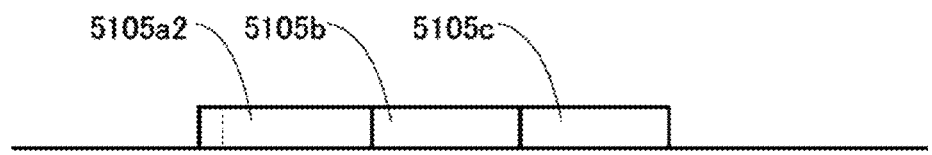

Then, as illustrated in FIG. 30B, the region 5105a1 grows to part of the pellet 5105a to form a pellet 5105a2. In addition, a side surface of the pellet 5105c is in contact with another side surface of the pellet 5105b.

Figure 30C:
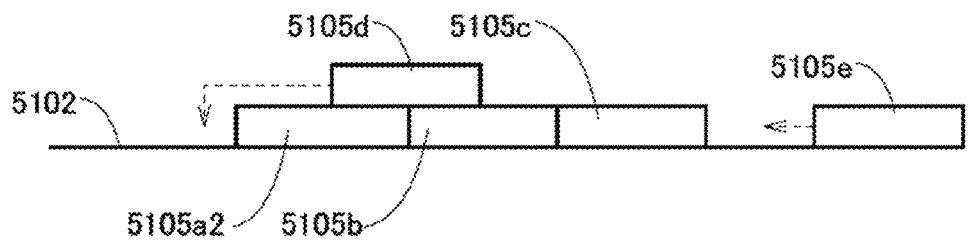

Next, as illustrated in FIG. 30C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 30D:
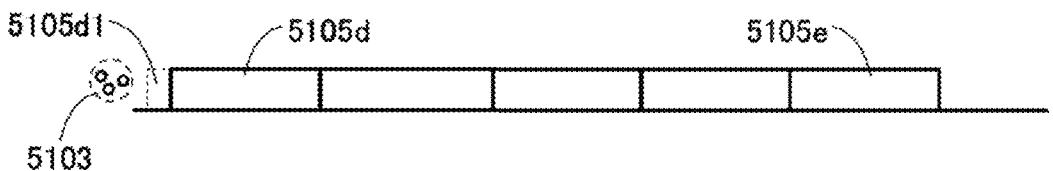

Then, as illustrated in FIG. 30D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 27 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thickness of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

The semiconductor device of one embodiment of the present invention can be formed using an oxide semiconductor film having any of the above structures.

The structure and method described in this embodiment can be implemented by being combined as appropriate with any of the other structures and methods described in the other embodiments.

(Embodiment 4)

In this embodiment, a display device that can be formed using a semiconductor device of one embodiment of the present invention is described with reference to FIGS. 15A to 15C.

The display device illustrated in FIG. 15A includes a region including pixels of display elements (hereinafter the region is referred to as a pixel portion 302), a circuit portion being provided outside the pixel portion 302 and including a circuit for driving the pixels (hereinafter the portion is referred to as a driver circuit portion 304), circuits each having a function of protecting an element (hereinafter the circuits are referred to as protection circuits 306), and a terminal portion 307. Note that the protection circuits 306 are not necessarily provided.

A part or the whole of the driver circuit portion 304 is preferably formed over a substrate over which the pixel portion 302 is formed, in which case the number of components and the number of terminals can be reduced. When a part or the whole of the driver circuit portion 304 is not formed over the substrate over which the pixel portion 302 is formed, the part or the whole of the driver circuit portion 304 can be mounted by chip-on-glass (COG) or tape automated bonding (TAB).

The pixel portion 302 includes a plurality of circuits for driving display elements arranged in X rows (X is a natural number of 2 or more) and Y columns (Y is a natural number of 2 or more) (hereinafter, such circuits are referred to as pixel circuits 301). The driver circuit portion 304 includes driver circuits such as a circuit for supplying a signal (scan signal) to select a pixel (hereinafter, the circuit is referred to as a gate driver 304a) and a circuit for supplying a signal (data signal) to drive a display element in a pixel (hereinafter, the circuit is referred to as a source driver 304b).

The gate driver 304a includes a shift register or the like. The gate driver 304a receives a signal for driving the shift register through the terminal portion 307 and outputs a signal. For example, the gate driver 304a receives a start pulse signal, a clock signal, or the like and outputs a pulse signal. The gate driver 304a has a function of controlling the potentials of wirings supplied with scan signals (hereinafter, such wirings are referred to as scan lines GL_1 to GL_X). Note that a plurality of gate drivers 304a may be provided to control the scan lines GL_1 to GL_X separately. Alternatively, the gate driver 304a has a function of supplying an initialization signal. Without being limited thereto, the gate driver 304a can supply another signal.

The source driver 304b includes a shift register or the like. The source driver 304b receives a signal (video signal) from which a data signal is derived, as well as a signal for driving the shift register, through the terminal portion 307. The source driver 304b has a function of generating a data signal to be written to the pixel circuit 301 which is based on the video signal. In addition, the source driver 304b has a function of controlling output of a data signal in response to a pulse signal produced by input of a start pulse signal, a clock signal, or the like. Further, the source driver 304b has a function of controlling the potentials of wirings supplied with data signals (hereinafter such wirings are referred to as data lines DL_1 to DL_Y). Alternatively, the source driver 304b has a function of supplying an initialization signal. Without being limited thereto, the source driver 304b can supply another signal.

The source driver 304b includes a plurality of analog switches or the like, for example. The source driver 304b can output, as the data signals, signals obtained by time-dividing the video signal by sequentially turning on the plurality of analog switches. The source driver 304b may include a shift register or the like.

A pulse signal and a data signal are input to each of the plurality of pixel circuits 301 through one of the plurality of scan lines GL supplied with scan signals and one of the plurality of data lines DL supplied with data signals, respectively. Writing and holding of the data signal to and in each of the plurality of pixel circuits 301 are controlled by the gate driver 304a. For example, to the pixel circuit 301 in the m-th row and the n-th column (m is a natural number of less than or equal to X, and n is a natural number of less than or equal to Y), a pulse signal is input from the gate driver 304a through the scan line GL_m, and a data signal is input from the source driver 304b through the data line DL_n in accordance with the potential of the scan line GL_m.

Figure 15A:
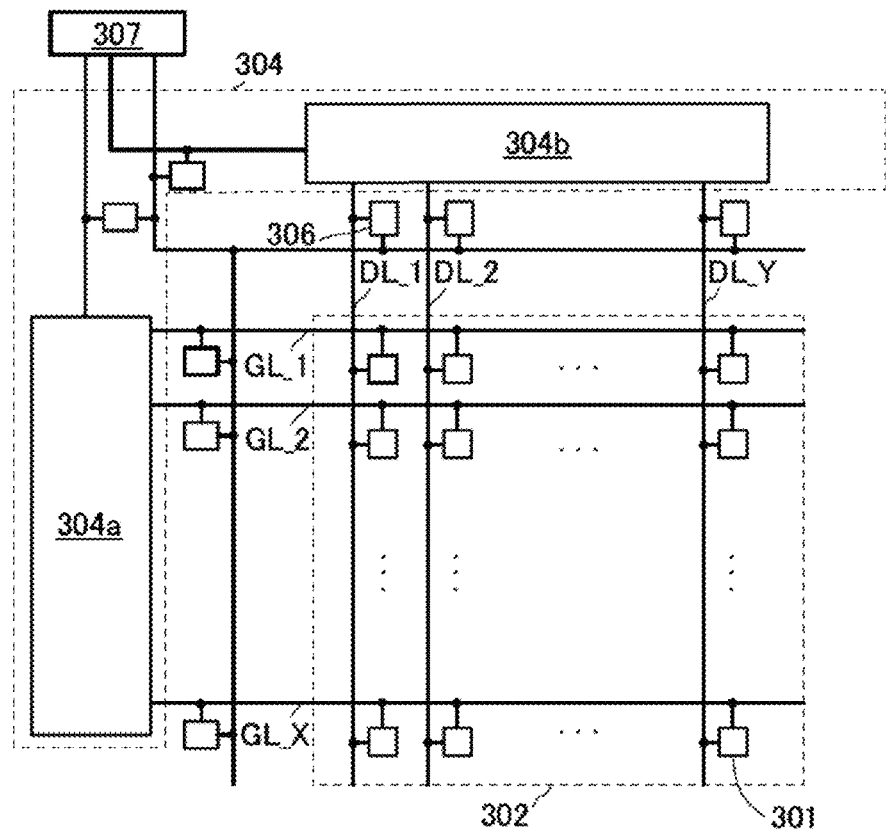
FIGS. 15A to 15C are a block diagram and circuit diagrams illustrating a display device.

The protection circuit 306 shown in FIG. 15A is connected to, for example, the scan line GL between the gate driver 304a and the pixel circuit 301. Alternatively, the protection circuit 306 is connected to the data line DL between the source driver 304b and the pixel circuit 301. Alternatively, the protection circuit 306 can be connected to a wiring between the gate driver 304a and the terminal portion 307. Alternatively, the protection circuit 306 can be connected to a wiring between the source driver 304b and the terminal portion 307. Note that the terminal portion 307 means a portion having terminals for inputting power, control signals, and video signals to the display device from external circuits.

The protection circuit 306 is a circuit that electrically connects a wiring connected to the protection circuit to another wiring when a potential out of a certain range is applied to the wiring connected to the protection circuit.

As illustrated in FIG. 15A, the protection circuits 306 are provided for the pixel portion 302 and the driver circuit portion 304, so that the resistance of the display device to overcurrent generated by electrostatic discharge (ESD) or the like can be improved. Note that the configuration of the protection circuits 306 is not limited to that, and for example, the protection circuit 306 may be configured to be connected to the gate driver 304a or the protection circuit 306 may be configured to be connected to the source driver 304b. Alternatively, the protection circuit 306 may be configured to be connected to the terminal portion 307.

In FIG. 15A, an example in which the driver circuit portion 304 includes the gate driver 304a and the source driver 304b is shown; however, the structure is not limited thereto. For example, only the gate driver 304a may be formed and a separately prepared substrate where a source driver circuit is formed (e.g., a driver circuit substrate formed with a single crystal semiconductor film or a polycrystalline semiconductor film) may be mounted.

Figure 15B:
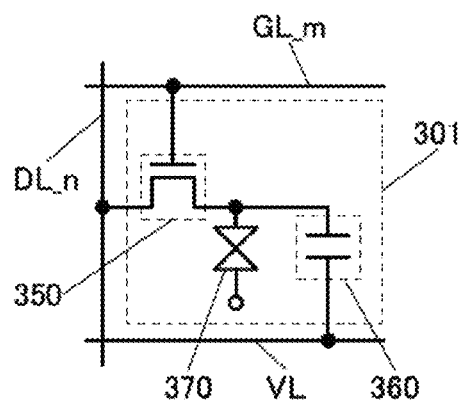

Each of the plurality of pixel circuits 301 in FIG. 15A can have the structure illustrated in FIG. 15B, for example.

The pixel circuit 301 illustrated in FIG. 15B includes a liquid crystal element 370, a transistor 350, and a capacitor 360.

The semiconductor device of one embodiment of the present invention can be used as, for example, the transistor 350. As the transistor 350, any of the transistors 150, 160, 162, and 164 described in the above embodiment, for example, can be used.

The potential of one of a pair of electrodes of the liquid crystal element 370 is set in accordance with the specifications of the pixel circuit 301 as appropriate. The alignment state of the liquid crystal element 370 depends on written data. A common potential may be supplied to one of the pair of electrodes of the liquid crystal element 370 included in each of the plurality of pixel circuits 301. Further, the potential supplied to one of the pair of electrodes of the liquid crystal element 370 in the pixel circuit 301 in one row may be different from the potential supplied to one of the pair of electrodes of the liquid crystal element 370 in the pixel circuit 301 in another row.

As examples of a driving method of the display device including the liquid crystal element 370, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic. In addition, the liquid crystal exhibiting a blue phase does not need alignment treatment and has small viewing angle dependence.

In the pixel circuit 301 in the m-th row and the n-th column, one of a source electrode and a drain electrode of the transistor 350 is electrically connected to the data line DL_n, and the other is electrically connected to the other of the pair of electrodes of the liquid crystal element 370. A gate electrode of the transistor 350 is electrically connected to the scan line GL_m. The transistor 350 has a function of controlling whether to write a data signal by being turned on or off.

One of a pair of electrodes of the capacitor 360 is electrically connected to a wiring to which a potential is supplied (hereinafter referred to as a potential supply line VL), and the other is electrically connected to the other of the pair of electrodes of the liquid crystal element 370. The potential of the potential supply line VL is set in accordance with the specifications of the pixel circuit 301 as appropriate. The capacitor 360 functions as a storage capacitor for storing written data.

For example, in the display device including the pixel circuit 301 in FIG. 15B, the pixel circuits 301 are sequentially selected row by row by the gate driver 304a illustrated in FIG. 15A, whereby the transistors 350 are turned on and a data signal is written.

When the transistors 350 are turned off, the pixel circuits 301 in which the data has been written are brought into a holding state. This operation is sequentially performed row by row; thus, an image can be displayed.

Figure 15C:
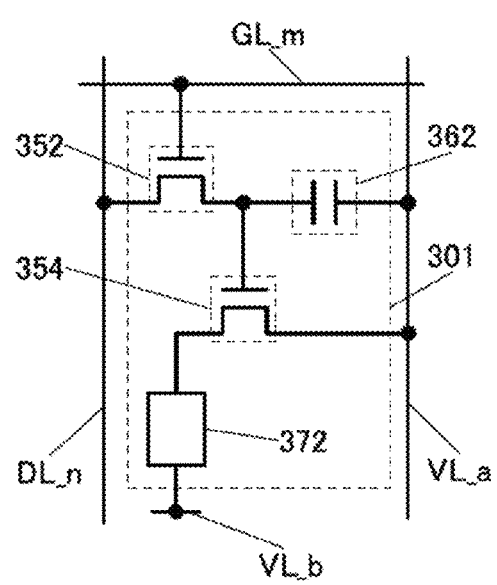

Alternatively, each of the plurality of pixel circuits 301 in FIG. 15A can have the structure illustrated in FIG. 15C, for example.

The pixel circuit 301 illustrated in FIG. 15C includes transistors 352 and 354, a capacitor 362, and a light-emitting element 372. Here, any of the transistors 150, 160, 162, and 164 described in the above embodiment, for example, can be used as one or both of the transistors 352 and 354.

One of a source electrode and a drain electrode of the transistor 352 is electrically connected to a wiring to which a data signal is supplied (hereinafter referred to as a signal line DL_n). A gate electrode of the transistor 352 is electrically connected to a wiring to which a gate signal is supplied (hereinafter referred to as a scan line GL_m).

The transistor 352 has a function of controlling whether to write a data signal by being turned on or off.

One of a pair of electrodes of the capacitor 362 is electrically connected to a wiring to which a potential is supplied (hereinafter referred to as a potential supply line VL_a), and the other is electrically connected to the other of the source electrode and the drain electrode of the transistor 352.

The capacitor 362 functions as a storage capacitor for storing written data.

One of a source electrode and a drain electrode of the transistor 354 is electrically connected to the potential supply line VL_a. Further, a gate electrode of the transistor 354 is electrically connected to the other of the source electrode and the drain electrode of the transistor 352.

One of an anode and a cathode of the light-emitting element 372 is electrically connected to a potential supply line VL_b, and the other is electrically connected to the other of the source electrode and the drain electrode of the transistor 354.

As the light-emitting element 372, an organic electroluminescent element (also referred to as an organic EL element) or the like can be used, for example. Note that the light-emitting element 372 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 301 in FIG. 15C, the pixel circuits 301 are sequentially selected row by row by the gate driver 304a illustrated in FIG. 15A, whereby the transistors 352 are turned on and a data signal is written.

When the transistors 352 are turned off, the pixel circuits 301 in which the data has been written are brought into a holding state. Further, the amount of current flowing between the source electrode and the drain electrode of the transistor 354 is controlled in accordance with the potential of the written data signal. The light-emitting element 372 emits light with a luminance corresponding to the amount of flowing current. This operation is sequentially performed row by row; thus, an image can be displayed.

The structure described in this embodiment can be used in appropriate combination with any of the structures described in the other embodiments.

(Embodiment 5)

In this embodiment, a display module and electronic devices that can be formed using a semiconductor device of one embodiment of the present invention are described with reference to FIG. 16 and FIGS. 17A to 17H.

Figure 16:
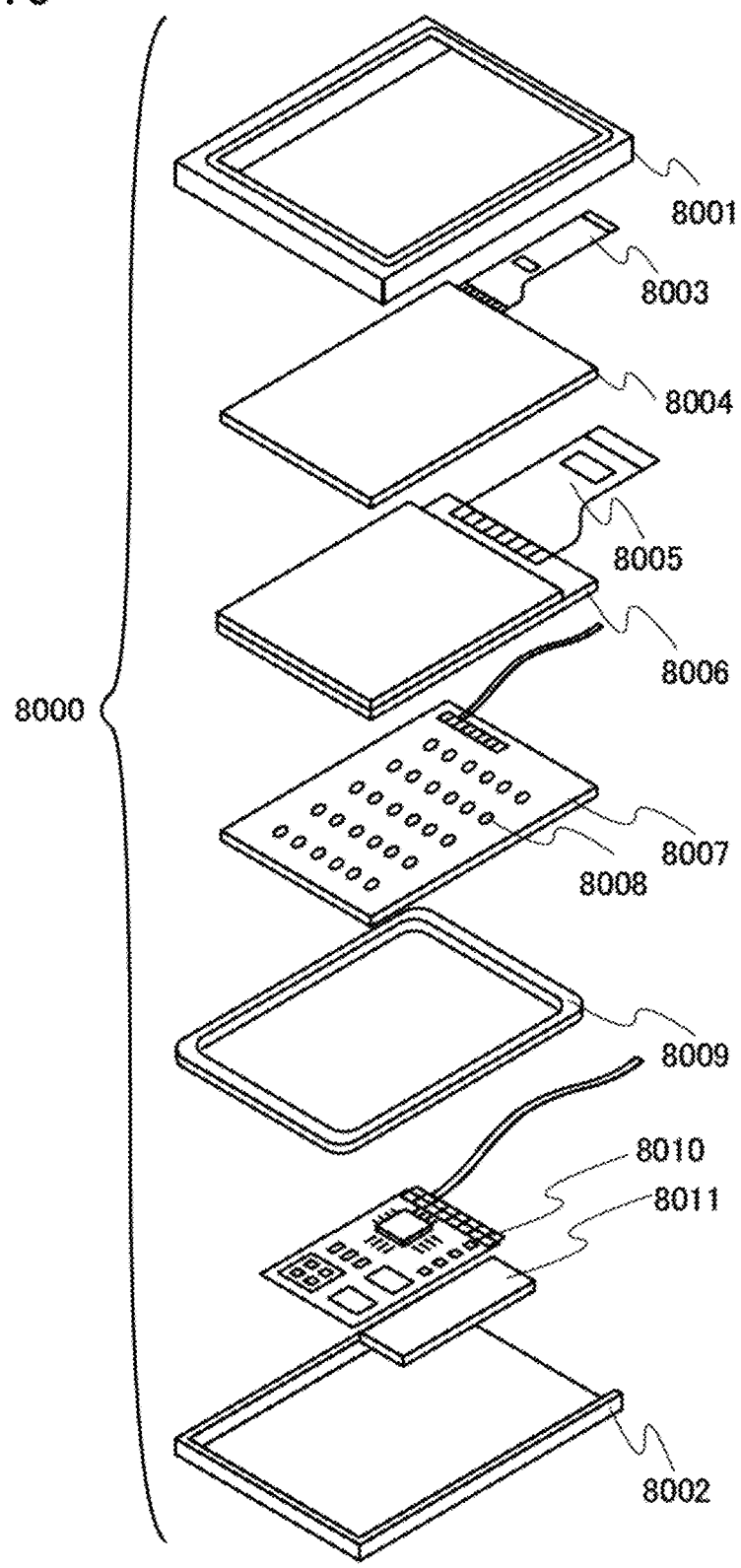
FIG. 16 illustrates a display module.

In a display module 8000 illustrated in FIG. 16, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 17A to 17H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 17A:
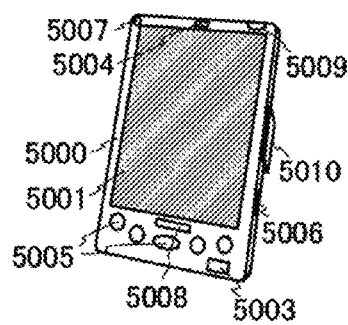
FIGS. 17A to 17H each illustrate an electronic device.
Figure 17B:
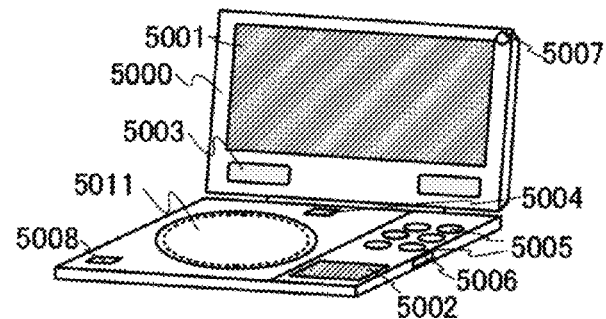
Figure 17C:
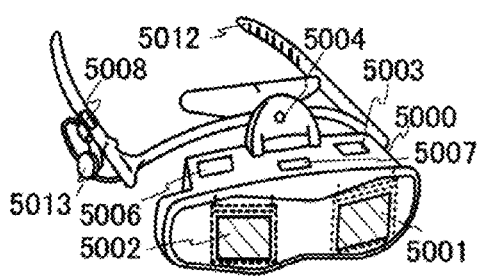
Figure 17D:
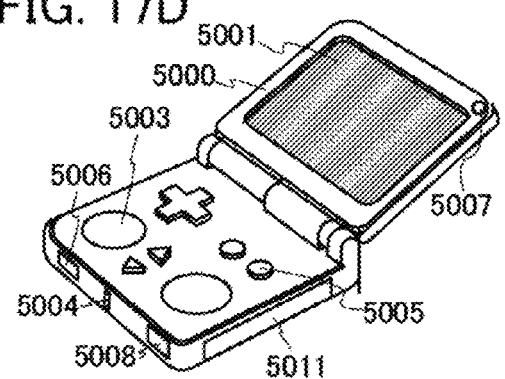
Figure 17E:
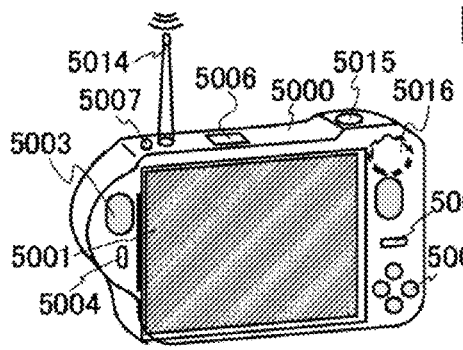
Figure 17F:
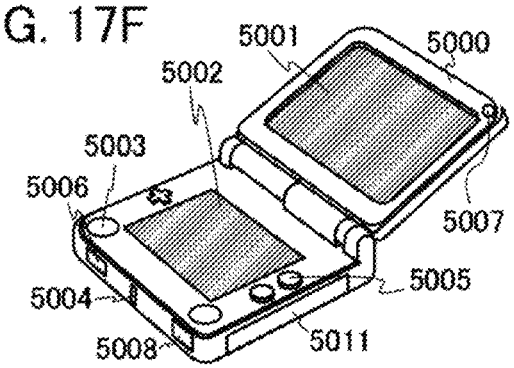
Figure 17G:
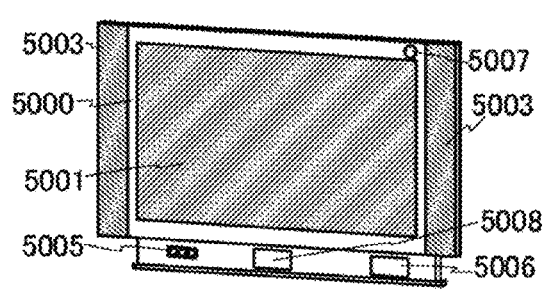
Figure 17H:
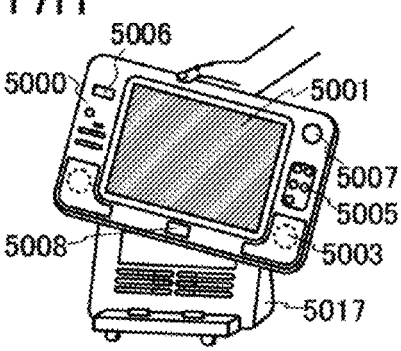

FIG. 17A illustrates a mobile computer that can include a switch 5009, an infrared port 5010, and the like in addition to the above components. FIG. 17B illustrates a portable image reproducing device (e.g., a DVD player) that is provided with a memory medium and can include a second display portion 5002, a memory medium reading portion 5011, and the like in addition to the above components. FIG. 17C illustrates a goggle-type display that can include the second display portion 5002, a support 5012, an earphone 5013, and the like in addition to the above components. FIG. 17D illustrates a portable game machine that can include the memory medium reading portion 5011 and the like in addition to the above components. FIG. 17E illustrates a digital camera that has a television reception function and can include an antenna 5014, a shutter button 5015, an image receiving portion 5016, and the like in addition to the above components. FIG. 17F illustrates a portable game machine that can include the second display portion 5002, the memory medium reading portion 5011, and the like in addition to the above components. FIG. 17G illustrates a television receiver that can include a tuner, an image processing portion, and the like in addition to the above components. FIG. 17H illustrates a portable television receiver that can include a charger 5017 capable of transmitting and receiving signals, and the like in addition to the above components.

The electronic devices illustrated in FIGS. 17A to 17H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 17A to 17H are not limited to those described above, and the electronic devices can have a variety of functions.

The electronic devices described in this embodiment each include the display portion for displaying some sort of data. Note that the semiconductor device of one embodiment of the present invention can also be used for an electronic device which does not have a display portion.

The structure described in this embodiment can be used in appropriate combination with any of the structures described in the other embodiments.

(Embodiment 6)

In this embodiment, a light-emitting device including the semiconductor device of one embodiment of the present invention is described with reference to FIGS. 18A and 18B.

<Specific Example of Light-Emitting Device Including the Semiconductor Device of One Embodiment of the Present Invention>

Figure 18A:
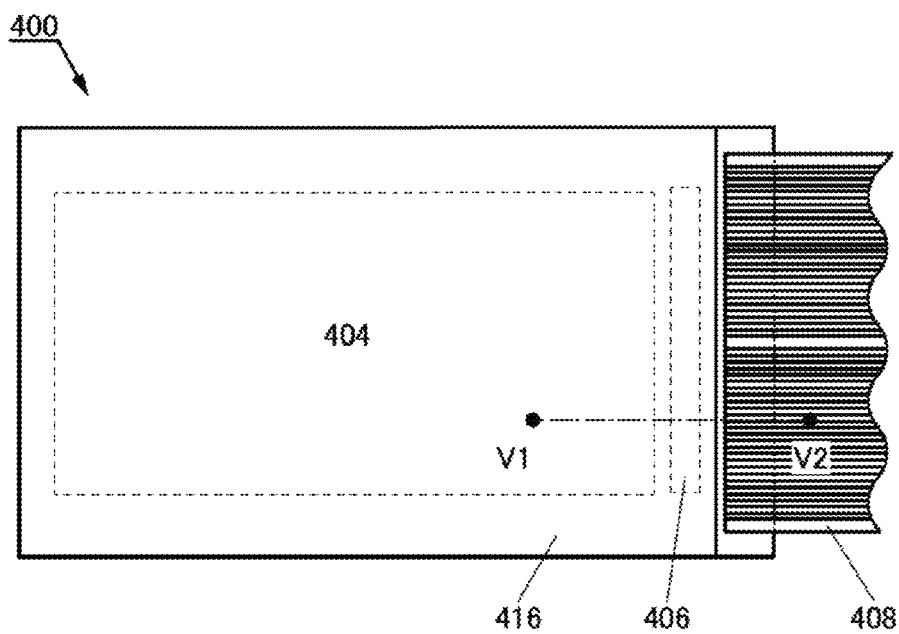
FIGS. 18A and 18B illustrate an example of a light-emitting device including a semiconductor device of one embodiment of the present invention.
Figure 18B:
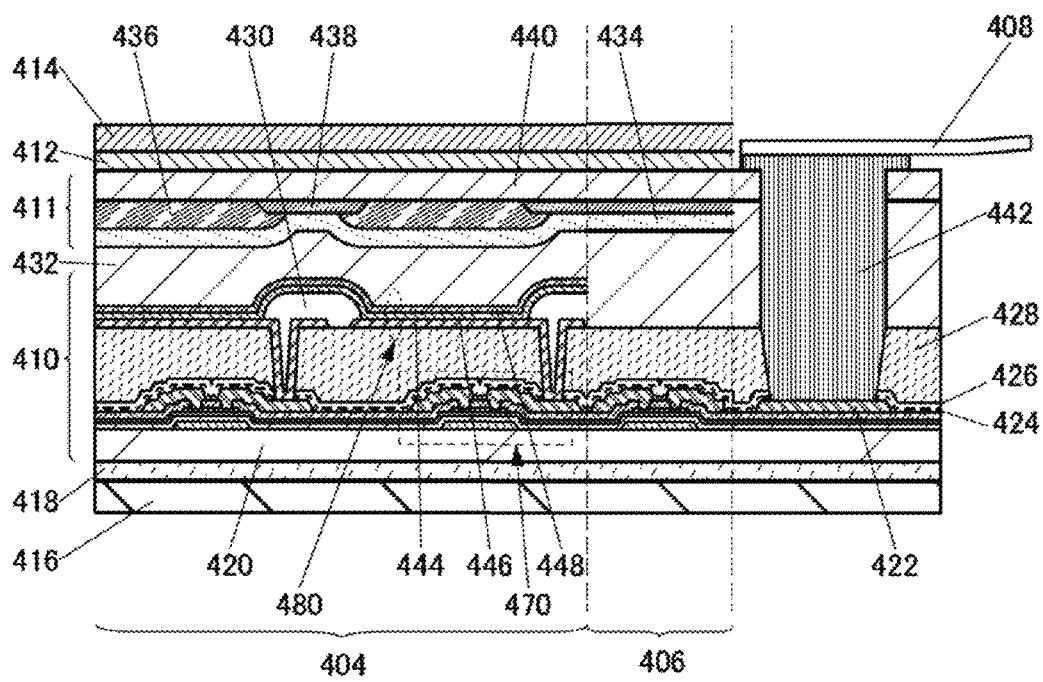

FIG. 18A is a top view of a light-emitting device 400, and FIG. 18B is an example of a cross-sectional view taken along dashed-dotted line V1-V2 in FIG. 18A. Note that in the top view in FIG. 18A, some components are not illustrated in order to avoid complexity of the drawing.

In FIG. 18A, the light-emitting device including the semiconductor device of one embodiment of the present invention includes a flexible substrate 416, a display portion 404 over the flexible substrate 416, a driver circuit portion 406 placed outside the display portion 404, and an FPC 408 electrically connected to the driver circuit portion 406.

In FIG. 18B, the light-emitting device including the semiconductor device of one embodiment of the present invention includes the flexible substrate 416, an adhesive layer 418, an element layer 410, a sealing layer 432, an element layer 411, an adhesive layer 412, and a flexible substrate 414. The element layer 410 includes an insulating film 420, a plurality of transistors including a transistor 470, a conductive layer 422, insulating films 424, 426, and 428, a plurality of light-emitting elements including a light-emitting element 480, and an insulating film 430. The element layer 411 includes an insulating film 434, a coloring layer 436, a light-blocking layer 438, and an insulating film 440. Note that the element layer 410 and the element layer 411 face each other with the sealing layer 432 positioned therebetween.

Any of the transistors 150, 160, 162, and 164 described in the above embodiment can be used as each of the plurality of transistors including the transistor 470. In the structure in FIG. 18B, for example, the transistor 150 shown in FIG. 1B is used as the transistor 470.

The conductive layer 422 is electrically connected to the FPC 408 via a connector 442. The conductive layer 422 is formed in the same step as conductive films functioning as a source electrode layer and a drain electrode layer of the transistor 470, for example.

The light-emitting element 480 includes a lower electrode 444, an EL layer 446, and an upper electrode 448. The lower electrode 444 is electrically connected to the source electrode layer or the drain electrode layer of the transistor 470. An end portion of the lower electrode 444 is covered with the insulating film 430. The light-emitting element 480 has a top emission structure. The upper electrode 448 has a light-transmitting property and transmits light emitted from the EL layer 446. Although the top emission structure is described as an example in this embodiment, the structure is not limited thereto. For example, one embodiment of the present invention can also be applied to a bottom emission structure in which light is emitted from the lower electrode 444 side or a dual emission structure in which light is emitted from both the lower electrode 444 side and the upper electrode 448 side.

The coloring layer 436 is provided to overlap with the light-emitting element 480, and the light-blocking layer 438 is provided to overlap with the insulating film 430. The coloring layer 436 and the light-blocking layer 438 are covered with the insulating film 434. A space between the light-emitting element 480 and the insulating film 434 is filled with the sealing layer 432.

The light-emitting device including the semiconductor device of one embodiment of the present invention, shown in FIGS. 18A and 18B, includes a plurality of transistors in the display portion 404 and the driver circuit portion 406. The transistor 470 is provided over the insulating film 420. The insulating film 420 and the flexible substrate 416 are attached to each other with the adhesive layer 418. The insulating film 440 and the flexible substrate 414 are attached to each other with the adhesive layer 412. It is preferable to use films with low water permeability for the insulating film 420 and the insulating film 440, in which case an impurity such as water can be prevented from entering the light-emitting element 480 or the transistor 470, leading to improved reliability of the light-emitting device.

For a material and a formation method of the transistor 470 shown in FIG. 18B, the material and the formation method used for the transistor 150 described in the above embodiment can be referred to.

For each of the adhesive layers 412 and 418, for example, a resin that is curable at room temperature (e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

Furthermore, the resin may include a drying agent. As the drying agent, for example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

Each of the adhesive layers 412 and 418 may also include a scattering member for scattering light. For example, each of the adhesive layers 412 and 418 can be a mixture of the above resin and particles having a refractive index different from that of the resin. The particles function as the scattering member for scattering light. The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles. Particles of titanium oxide or barium oxide are preferable because they scatter light excellently. When zeolite is used, it can adsorb water contained in the resin and the like, thereby improving the reliability of the light-emitting element.

The light-emitting device of the specific example in this embodiment can be manufactured in the following manner: the element layer 410 is formed over a substrate with high heat resistance; the element layer 410 is separated from the substrate with high heat resistance; and the element layer 410 is transferred and attached with the adhesive layer 418 to the flexible substrate 416. The light-emitting device of the specific example in this embodiment can be manufactured in the following manner: the element layer 411 is formed over a substrate with high heat resistance; the element layer 411 is separated from the substrate with high heat resistance; and the element layer 411 is transferred and attached with the adhesive layer 412 to the flexible substrate 414.

In the case where a material with high water permeability and low heat resistance (e.g., resin) is used, for example, for one or both of the flexible substrates 414 and 416, it is difficult to set the temperature high (e.g., to 300° C.) in the manufacturing process. Thus, there is a limitation on conditions for forming a transistor and an insulating film over the flexible substrate 414 or the flexible substrate 416. In the manufacturing method of this embodiment, a transistor and the like can be formed over a substrate with high heat resistance; thus, a highly reliable transistor and an insulating film with sufficiently low water permeability can be formed. Then, the transistor and the insulating film are transferred to the flexible substrate 414 or the flexible substrate 416, whereby a highly reliable light-emitting device can be manufactured. Thus, with one embodiment of the present invention, a thin and/or lightweight light-emitting device with high reliability can be provided.

The flexible substrate 414 and the flexible substrate 416 are each preferably formed using a material with high toughness. In that case, a light-emitting device with high impact resistance that is less likely to be broken can be provided. For example, when the flexible substrates 414 and 416 are organic resin substrates, the light-emitting device 400 can be lightweight and unlikely to be broken as compared with the case where glass substrates are used. That is, the light-emitting device 400 including the semiconductor device of one embodiment of the present invention has flexibility.

Further, when a material with high thermal emissivity is used for the flexible substrate 416, the surface temperature of the light-emitting device can be prevented from rising, leading to prevention of breakage or a decrease in reliability of the light-emitting device. For example, the flexible substrate 416 may have a stacked structure of a metal substrate and a layer with high thermal emissivity (the layer can be formed using a metal oxide or a ceramic material, for example).

Here, a method for manufacturing the light-emitting device including the semiconductor device of one embodiment of the present invention, shown in FIGS. 18A and 18B, is described in detail with reference to FIGS. 19A to 19E. Note that the element layers 410 and 411 and the like illustrated in FIGS. 18A and 18B are not illustrated in FIGS. 19A to 19E in order to avoid complexity of the drawings.

<Method for Manufacturing Light-Emitting Device Including the Semiconductor Device of One Embodiment of the Present Invention>

Figure 19A:
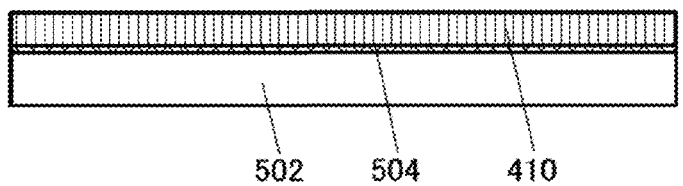
FIGS. 19A to 19E illustrate a method for manufacturing a light-emitting device including a semiconductor device of one embodiment of the present invention.
Figure 19B:
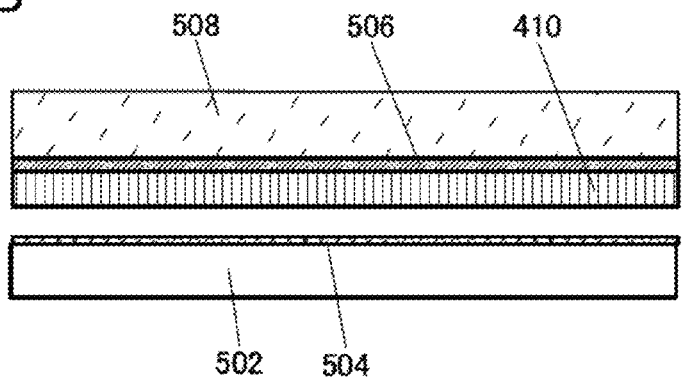

First, a separation layer 504 is formed over a substrate 502, and the element layer 410 is formed over the separation layer 504 (FIG. 19A).

It is necessary that the substrate 502 have heat resistance enough to withstand at least heat treatment performed later. For example, a glass substrate, a ceramic substrate, a quartz substrate, or a sapphire substrate may be used as the substrate 502.

In the case where a glass substrate is used as the substrate 502, an insulating film such as a silicon oxide film, a silicon oxynitride film, a silicon nitride film, or a silicon nitride oxide film is preferably formed between the substrate 502 and the separation layer 504, in which case contamination from the glass substrate can be prevented.

As the separation layer 504, for example, an organic resin film of an acrylic resin, a polyimide resin, a polyamide resin, a polyamide-imide resin, or the like can be used. It is particularly preferable to use a polyimide resin, which has high heat resistance. In the case where a polyimide resin is used for the separation layer 504, for example, the thickness of the polyimide resin is greater than or equal to 3 nm and less than or equal to 20 µm, preferably greater than or equal to 5 nm and less than or equal to 1 µm, further preferably greater than or equal to 5 nm and less than or equal to 20 nm. In the case where a polyimide resin is used, the separation layer 504 can be formed by a spin coating method, a dip coating method, a doctor blade method, or the like. For example, the separation layer 504 can be formed using a polyimide resin in such a manner that an unnecessary part of the polyimide resin is removed by a doctor blade method so that the resin has a desired thickness.

In the element layer 410, the transistor 470 can be formed in accordance with the method for manufacturing the transistor 150 described in the above embodiment. In this embodiment, formation methods of components other than the transistor 470 are described below in detail. Note that formation temperatures of all the components, including the transistor 470, of the element layer 410 are preferably higher than or equal to room temperature and lower than or equal to 300° C. For example, an insulating film or a conductive film formed using an inorganic material in the element layer 410 is formed at a formation temperature higher than or equal to 150° C. and lower than or equal to 300° C., preferably higher than or equal to 200° C. and lower than or equal to 270° C. Furthermore, an insulating film or the like formed using an organic material in the element layer 410 is formed at a formation temperature higher than or equal to room temperature and lower than or equal to 100° C.

The insulating film 420 included in the element layer 410 is preferably formed using, for example, an inorganic insulating material with low moisture permeability. Examples of such an inorganic insulating material include silicon oxide, silicon nitride, silicon oxynitride, silicon nitride oxide, and aluminum oxide.

For a material and a formation method of the insulating film 424 included in the element layer 410, the material and the formation method used for the insulating film 114 described in the above embodiment can be referred to. For a material and a formation method of the insulating film 426, the material and the formation method used for the insulating film 116 described in the above embodiment can be referred to. For a material and a formation method of the insulating film 428, the material and the formation method used for the insulating film 122 described in the above embodiment can be referred to.

The lower electrode 444, the EL layer 446, the upper electrode 448, and the insulating film 430 included in the element layer 410 can be formed in the following manner.

As the lower electrode 444, for example, a metal film having a high light-reflecting property with respect to visible light is preferably used. As the metal film, for example, aluminum, silver, or an alloy of any of these can be used. The lower electrode 444 can be formed by a sputtering method, for example.

The EL layer 446 can be formed using a light-emitting material in which holes and electrons injected from the lower electrode 444 and the upper electrode 448 can be recombined to cause light emission. In addition to the light-emitting material, a functional layer such as a hole-injection layer, a hole-transport layer, an electron-transport layer, or an electron-injection layer may be formed as needed. The EL layer 446 can be formed by an evaporation method or a coating method, for example.

As the upper electrode 448, for example, a conductive film that transmits visible light is preferably used. For example, a material including one of indium (In), zinc (Zn), and tin (Sn) is preferably used for the conductive film. For the upper electrode 448, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. It is particularly preferable to use indium tin oxide to which silicon oxide is added for the upper electrode 448, in which case a crack or the like is unlikely to be caused in the upper electrode 448 when the light-emitting device 400 is bent. The upper electrode 448 can be formed by a sputtering method, for example.

An organic resin or an inorganic insulating material can be used, for example, for the insulating film 430. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the insulating film 430. There is no particular limitation on the method for forming the insulating film 430. A photolithography method, a sputtering method, an evaporation method, a droplet discharging method (e.g., an inkjet method), a printing method (e.g., a screen printing method or an offset printing method), or the like can be used.

Next, the element layer 410 and a temporary support substrate 508 are attached to each other with an adhesive 506 for separation, and the element layer 410 is separated from the separation layer 504. Thus, the element layer 410 is placed on the temporary support substrate 508 side (see FIG. 19B).

As the temporary support substrate 508, a glass substrate, a quartz substrate, a sapphire substrate, a ceramic substrate, a metal substrate, or the like can be used. Alternatively, a plastic substrate that can withstand a processing temperature of this embodiment may be used, or a flexible film-like substrate may be used.

An adhesive with which the temporary support substrate 508 and the element layer 410 can be chemically or physically separated when necessary, such as an adhesive that is soluble in water or a solvent or an adhesive which is capable of being plasticized upon irradiation of UV light or the like, is used as the adhesive 506 for separation.

Any of various methods can be used as appropriate in the process for transferring the element layer 410 to the temporary support substrate 508. For example, the separation layer 504 is irradiated with laser light from one side (the lower side in FIG. 19B) of the substrate 502, which is opposite to the separation layer 504 side, whereby the separation layer 504 is embrittled; thus, the separation layer 504 and the element layer 410 can be separated from each other. Furthermore, it is possible to adjust the irradiation energy density of the laser light to create a region with a high adhesion between the separation layer 504 and the element layer 410 and a region with a low adhesion between the separation layer 504 and the element layer 410 and then perform the separation.

In this embodiment, a method in which separation is caused at the interface between the separation layer 504 and the element layer 410 is described; however, the method is not limited thereto. For example, separation may be caused at the interface between the substrate 502 and the separation layer 504. In that case, the separation layer 504 is placed between an adhesive layer provided later and the element layer 410.

Alternatively, the interface between the separation layer 504 and the element layer 410 may be soaked with a liquid, whereby the element layer 410 may be separated from the separation layer 504. Alternatively, the interface between the separation layer 504 and the substrate 502 may be soaked with a liquid, whereby the element layer 410 and the separation layer 504 may be separated from the substrate 502. As the liquid, for example, water, a polar solvent, or the like can be used. When the interface along which the separation layer 504 is separated, specifically, the interface between the separation layer 504 and the element layer 410 or the interface between the separation layer 504 and the substrate 502, is soaked with the liquid, an influence of static electricity and the like generated with the separation on the element layer 410 can be reduced.

Figure 19C:
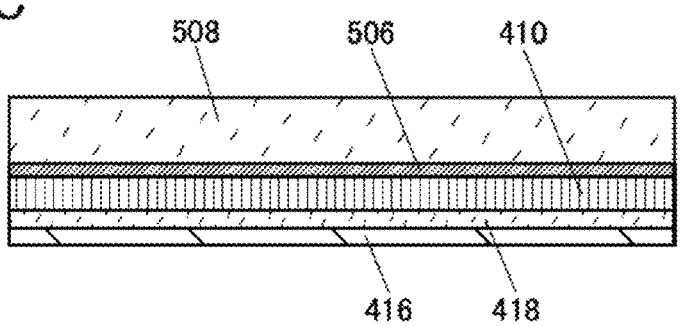

Next, the flexible substrate 416 is attached to the element layer 410 or the separation layer 504 with the adhesive layer 418 (see FIG. 19C).

Figure 19D:
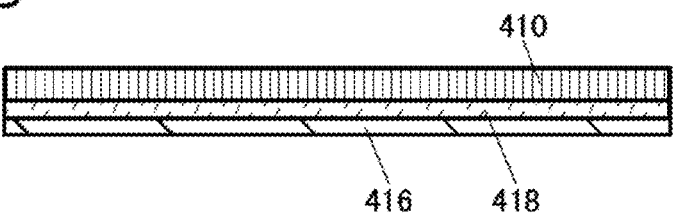

After that, the temporary support substrate 508 is removed by dissolving or plasticizing the adhesive 506 for separation. After the temporary support substrate 508 is removed, the adhesive 506 for separation is removed using water, a solvent, or the like to expose the surface of the element layer 410 (FIG. 19D).

In the above manner, the element layer 410 can be formed over the flexible substrate 416.

Next, the flexible substrate 414, the adhesive layer 412 in contact with the flexible substrate 414, and the element layer 411 in contact with the adhesive layer 412 are formed by a formation method similar to that shown in FIGS. 19A to 19D.

The insulating film 440 included in the element layer 411 can be formed using a material similar to that of the insulating film 420.

The coloring layer 436 included in the element layer 411 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with any of various materials by a printing method, an inkjet method, an etching method using a photolithography technique, or the like.

The light-blocking layer 438 included in the element layer 411 has a function of blocking light in a specific wavelength range, and can be a metal film or an organic insulating film including a black pigment or the like.

As the insulating film 434 included in the element layer 411, an organic insulating film of an acrylic resin or the like can be used, for example. Note that the insulating film 434 is not necessarily formed.

Figure 19E:
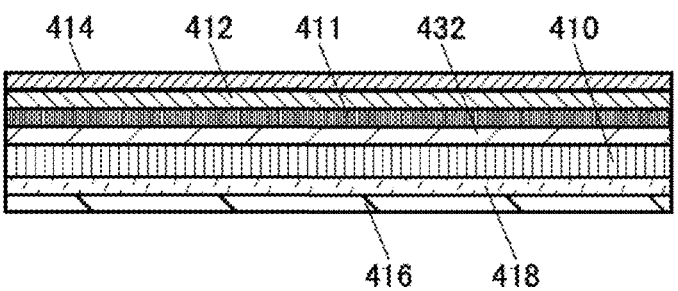
Figure 20A:
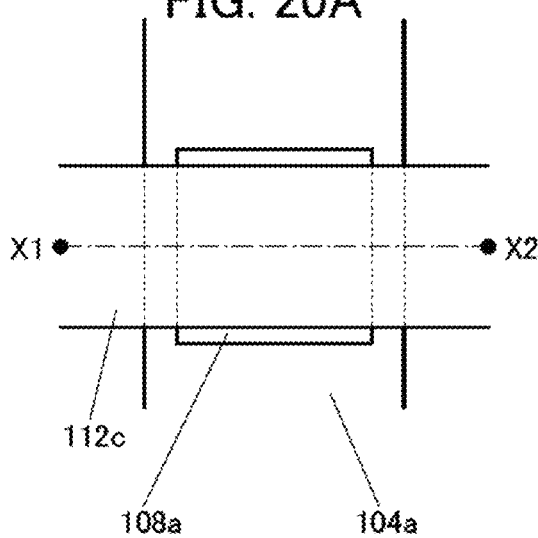
FIGS. 20A, 20C, and 20E are top views of semiconductor devices.
Figure 20B:
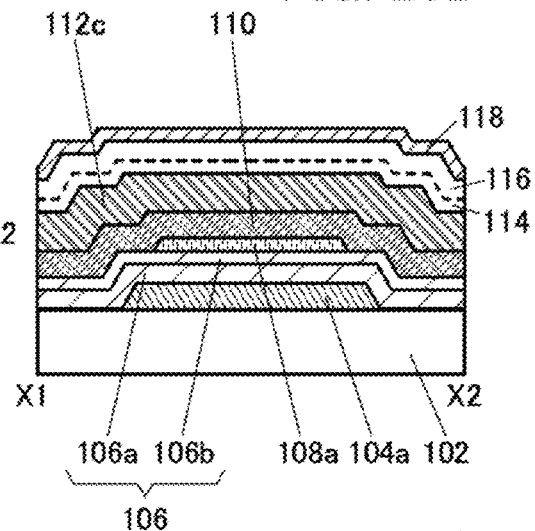
FIGS. 20B, 20D, and 20F are cross-sectional views thereof.
Figure 20C:
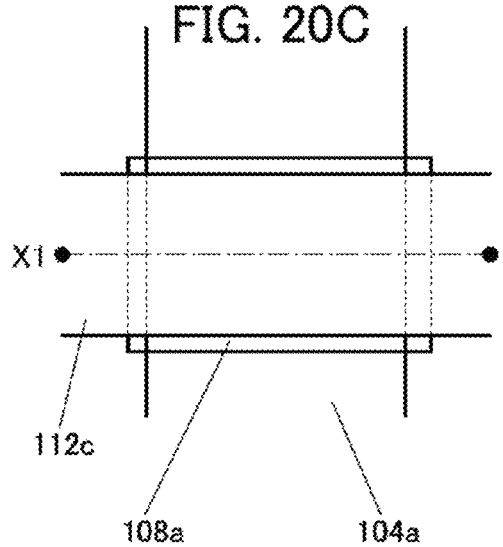
Figure 20D:
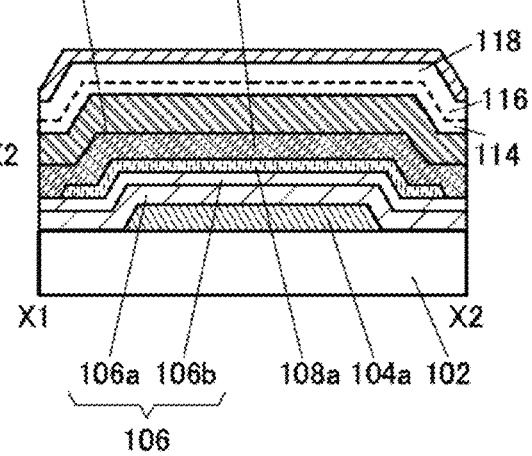
Figure 20E:
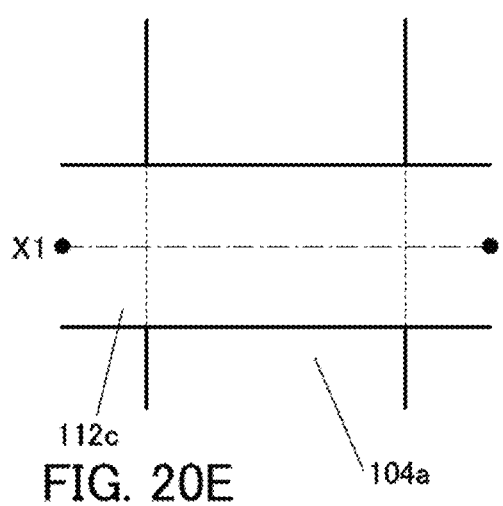
Figure 20F:
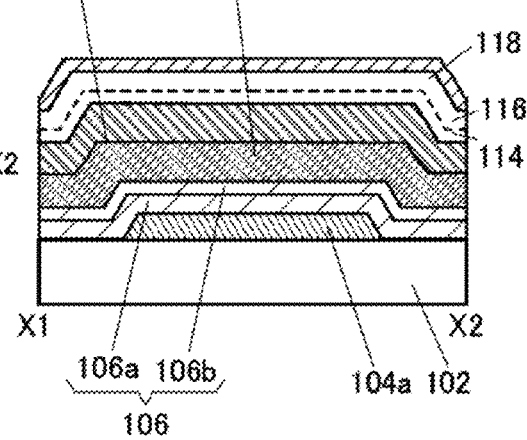

Then, a space between the element layer 410 and the element layer 411 is filled with the sealing layer 432, so that the element layer 410 and the element layer 411 are attached to each other (see FIG. 19E).

A solid sealing structure, for example, can be formed with the sealing layer 432. Note that the sealing layer 432 is preferably flexible. For example, for the sealing layer 432, a glass material such as a glass frit, or a resin material such as a resin that is curable at room temperature (e.g., a two-component-mixture-type resin), a light curable resin, or a thermosetting resin can be used.

Lastly, the connector 442 and the FPC 408 are attached. An IC chip or the like may be mounted if necessary. As the connector 442, for example, an anisotropic conductive material can be used.

In the above manner, the light-emitting device illustrated in FIGS. 18A and 18B can be manufactured.

The structure described in this embodiment can be used in appropriate combination with any of the structures described in the other embodiments.

This application is based on Japanese Patent Application serial no. 2013-230578 filed with Japan Patent Office on Nov. 6, 2013, the entire contents of which are hereby incorporated by reference.

What is claimed is:

1. A semiconductor device comprising:
   an oxide semiconductor film;
   a gate electrode layer, the oxide semiconductor film overlapping the gate electrode layer;
   a gate insulating film between the oxide semiconductor film and the gate electrode layer;
   a metal oxide film overlapping the oxide semiconductor film, the oxide semiconductor film positioned between the metal oxide film and the gate insulating film; and
   a source electrode layer and a drain electrode layer over the metal oxide film,
   wherein the metal oxide film comprises an In—Metal—Zn oxide in which an atomic ratio of Metal is higher than that of In,
   wherein Metal is any one if Ti, Ga, Y, Zr, La, Ce, Nd, Sn, and Hf,
   wherein the metal oxide film covers a channel region and a side surface of the oxide semiconductor film,
   wherein the metal oxide film has a first opening and a second opening reaching the oxide semiconductor film, and
   wherein the source electrode layer is electrically connected to the oxide semiconductor film through the first opening, and the drain electrode layer is electrically connected to the oxide semiconductor film through the second opening.

2. The semiconductor device according to claim 1,
   wherein the oxide semiconductor film contains an In-M-Zn oxide, and
   wherein M is Ti, Ga, Y, Zr, La, Ce, Nd, Sn, or Hf.

3. The semiconductor device according to claim 1,
   wherein the metal oxide film contains an In-M-Zn oxide or an In-M oxide, and
   wherein M is Ti, Ga, Y, Zr, La, Ce, Nd, Sn, or Hf.

4. The semiconductor device according to claim 1,
   wherein the metal oxide film is in contact with the oxide semiconductor film.

5. A display device comprising the semiconductor device according to claim 1.

6. An electronic device comprising the display device according to claim 5.

7. A semiconductor device comprising:
an oxide semiconductor film;
a gate electrode layer, the oxide semiconductor film overlapping the gate electrode layer;
a gate insulating film between the oxide semiconductor film and the gate electrode layer;
a metal oxide film overlapping the oxide semiconductor film, the oxide semiconductor film positioned between the metal oxide film and the gate insulating film; and
a source electrode layer and a drain electrode layer over the metal oxide film,
wherein the metal oxide film comprises an In—Metal—Zn oxide in which an atomic ration of Metal is higher than that of In,
wherein Metal is any one of Ti, Ga, Y, Zr, La, Ce, Nd, Sn, and Hf,
wherein a conduction band minimum of the metal oxide film is closer to a vacuum level than a conduction band minimum of the oxide semiconductor film is,
wherein the metal oxide film covers a channel region and a side surface of the oxide semiconductor film,
wherein the metal oxide film has a first opening and a second opening reaching the oxide semiconductor film, and
wherein the source electrode layer is electrically connected to the oxide semiconductor film through the first opening, and the drain electrode layer is electrically connected to the oxide semiconductor film through the second opening.

8. The semiconductor device according to claim 7,
wherein the oxide semiconductor film contains an In-M-Zn oxide, and
wherein M is Ti, Ga, Y, Zr, La, Ce, Nd, Sn, or Hf.

9. The semiconductor device according to claim 7,
wherein the metal oxide film contains an In-M-Zn oxide or an In-M oxide, and
wherein M is Ti, Ga, Y, Zr, La, Ce, Nd, Sn, or Hf.

10. The semiconductor device according to claim 7,
wherein the metal oxide film is in contact with the oxide semiconductor film.

11. A display device comprising the semiconductor device according to claim 7.

12. An electronic device comprising the display device according to claim 11.

13. A semiconductor device comprising:
a gate electrode layer;
a gate insulating film over the gate electrode layer;
an oxide semiconductor film that is over the gate insulating film and overlaps the gate electrode layer;
a metal oxide film covering a channel region and a side surface of the oxide semiconductor film; and
a source electrode layer and a drain electrode layer over the metal oxide film,
wherein the metal oxide film comprises an In—Metal—Zn oxide in which an atomic ratio of Metal is higher than that of In,
wherein Metal is any one of Ti, Ga, Y, Zr, La, Ce, Nd, Sn, and Hf,
wherein the metal oxide film is positioned between the source electrode layer and the oxide semiconductor film and between the drain electrode layer and the oxide semiconductor film,
wherein the metal oxide film has a first opening and a second opening reaching the oxide semiconductor film, and
wherein the source electrode layer is electrically connected to the oxide semiconductor film through the first opening, and the drain electrode layer is electrically connected to the oxide semiconductor film through the second opening.

14. The semiconductor device according to claim 13,
wherein a conduction band minimum of the metal oxide film is closer to a vacuum level than a conduction band minimum of the oxide semiconductor film is.

15. The semiconductor device according to claim 13,
wherein the oxide semiconductor film contains an In-M-Zn oxide, and
wherein M is Ti, Ga, Y, Zr, La, Ce, Nd, Sn, or Hf.

16. The semiconductor device according to claim 13,
wherein the metal oxide film contains an In-M-Zn oxide or an In-M oxide, and wherein M is Ti, Ga, Y, Zr, La, Ce, Nd, Sn, or Hf.

17. A display device comprising the semiconductor device according to claim 13.

18. An electronic device comprising the display device according to claim 17.

19. The semiconductor device according to claim 13,
wherein an energy difference between the vacuum level and a conduction band minimum of the metal oxide film is smaller than an energy difference between a vacuum level and a conduction band minimum of the oxide semiconductor film, and
wherein a conduction band minimum of the oxide semiconductor film is different from a conduction band minimum of the metal oxide film.

* * * * *

UNITED STATES PATENT AND TRADEMARK OFFICE
CERTIFICATE OF CORRECTION

PATENT NO. : 9,590,111 B2  
APPLICATION NO. : 14/532220  
DATED : March 7, 2017  
INVENTOR(S) : Shunpei Yamazaki Page 1 of 1

It is certified that error appears in the above-identified patent and that said Letters Patent is hereby corrected as shown below:

In the Specification

Column 4, Line 47, replace "100D." with --10D.--;

Column 29, Line 31, replace "100D." with --10D.--;

Column 43, Line 22, replace "5105*al*" with --5105*a*1--;

Column 43, Line 25, replace "5105*al*" with --5105*a*1--;

In the Claims

Column 56, Line 45, in Claim 1, replace "if" with --of--;

Column 57, Line 17, in Claim 7, replace "ration" with --ratio--; and

Column 58, Lines 44-45, in Claim 19, after "between" replace "a" with --the--.

Signed and Sealed this  
Sixth Day of November, 2018

Andrei Iancu  
*Director of the United States Patent and Trademark Office*